United States Patent [19]
Spence et al.

[11] Patent Number: 5,182,056
[45] Date of Patent: Jan. 26, 1993

[54] STEREOLITHOGRAPHY METHOD AND APPARATUS EMPLOYING VARIOUS PENETRATION DEPTHS

[75] Inventors: Stuart T. Spence, S. Pasadena; Dennis R. Smalley, Baldwin Park, both of Calif.

[73] Assignee: 3D Systems, Inc., Valencia, Calif.

[21] Appl. No.: 429,911

[22] Filed: Oct. 27, 1989

Related U.S. Application Data

[63] Continuation-in-part of Ser. No. 268,816, Nov. 8, 1988, Pat. No. 5,058,988, Ser. No. 268,837, Nov. 8, 1988, Ser. No. 268,907, Nov. 8, 1988, Pat. No. 5,059,021, and Ser. No. 331,644, Mar. 31, 1989, which is a continuation-in-part of Ser. No. 269,801, Nov. 8, 1988, abandoned, which is a continuation-in-part of Ser. No. 182,830, Apr. 18, 1988, Pat. No. 5,059,359, said Ser. No. 268,816, Ser. No. 268,837, and Ser. No. 268,907, each is a continuation-in-part of Ser. No. 182,830.

[51] Int. Cl.$^5$ ............... B29C 35/08; B29C 41/02
[52] U.S. Cl. ............... 264/22; 118/423; 118/429; 118/620; 118/712; 156/64; 156/273.3; 156/273.5; 156/275.5; 156/307.1; 156/378; 156/379.6; 250/432 R; 250/492.1; 264/40.1; 264/308; 364/476; 365/106; 365/107; 425/135; 425/174.4; 427/8; 427/510; 427/581; 427/586; 395/119
[58] Field of Search ............... 264/22, 40.1, 236, 255, 264/308, 347; 425/135, 174, 174.4; 156/64, 272.8, 273.3, 273.5, 275.5, 307.1, 378, 379.6; 427/8, 53.1, 54.1, 393.5, 412.1; 118/423, 429, 620, 712; 250/432 R, 492.1; 364/468, 476, 474.05, 474.08, 474.24, 522, 523; 365/106, 107; 430/269, 327, 394, 945

[56] References Cited
U.S. PATENT DOCUMENTS

| | | | |
|---|---|---|---|
| 4,575,330 | 3/1986 | Hull | 425/174.4 |
| 4,752,498 | 6/1988 | Fudim | 427/54.1 |
| 4,801,477 | 1/1989 | Fudim | 427/54.1 |
| 4,945,032 | 1/1990 | Murphy et al. | 430/394 |

FOREIGN PATENT DOCUMENTS

| | | | |
|---|---|---|---|
| 61-225012 | 10/1986 | Japan | 264/22 |
| 63-145015 | 6/1988 | Japan | 425/174.4 |

OTHER PUBLICATIONS

Kodama, H. "Automatic Method for Fabricating a Three-Dimensional Plastic Model with Photohardening Polymer", *Review of Scientific Instruments*, vol. 52, No. 11 (Nov. 1981), pp. 1770-1773.

(List continued on next page.)

*Primary Examiner*—Leo B. Tentoni
*Attorney, Agent, or Firm*—Lyon & Lyon

[57] ABSTRACT

An improved stereolithographic apparatus (SLA) and an improved method for generating a part from curable material. The invention utilizes control and/or knowledge of depths of penetration of actinic radiation into a vat of photopolymer to determine and/or control and/or produce desirable characteristics associated with the creation of parts. From a predictive point of view, these desirable characteristics may include determination of cure depth from a given exposure, determination cure width, determination of required minimum surface angle (MSA), determination of optimum skin fill spacing, the strength of cross sections of partially polymerized material, amount of curl type distortion, and necessary overcure to attain adhesion between layers, etc. These determinations can lead to the use of particular building techniques to insure adequate part formation. From the controlling and producing point of view, the penetration depths can be controlled to obtain optimized characteristics for a given layer thickness, maximized speed of drawing, minimized print through, maximized strength, minimum curl and other distortions, and maximum resolution, etc. An important aspect of the present invention is the integration of resin characteristics, with the depth of penetration associated with the particular resin being used and the wavelength(s) of actinic radiation being used to solidify it, and with the intensity profile of the beam of actinic radiation as it strikes the resin surface.

44 Claims, 15 Drawing Sheets

OTHER PUBLICATIONS

Herbert, A. J. "Solid Object Generation". *Journal of Applied Photographic Engineering*, vol. 8, No. 4, (Aug. 1982), pp. 185–188.

Fudim, E. V. "Sculpting Parts With Light". *Machine Design* (Mar. 6, 1986), pp. 102–106.

Fudim, E. V. "A Method of Three-Dimensional Micromachining". *Mechanical Engineering* (Sep. 1985), pp. 54–59.

English-Language Translation of Japan 61-225,012 (Published Oct. 1986).

English-Language Translation of Japan 63-145,015 (Published Jun. 1988).

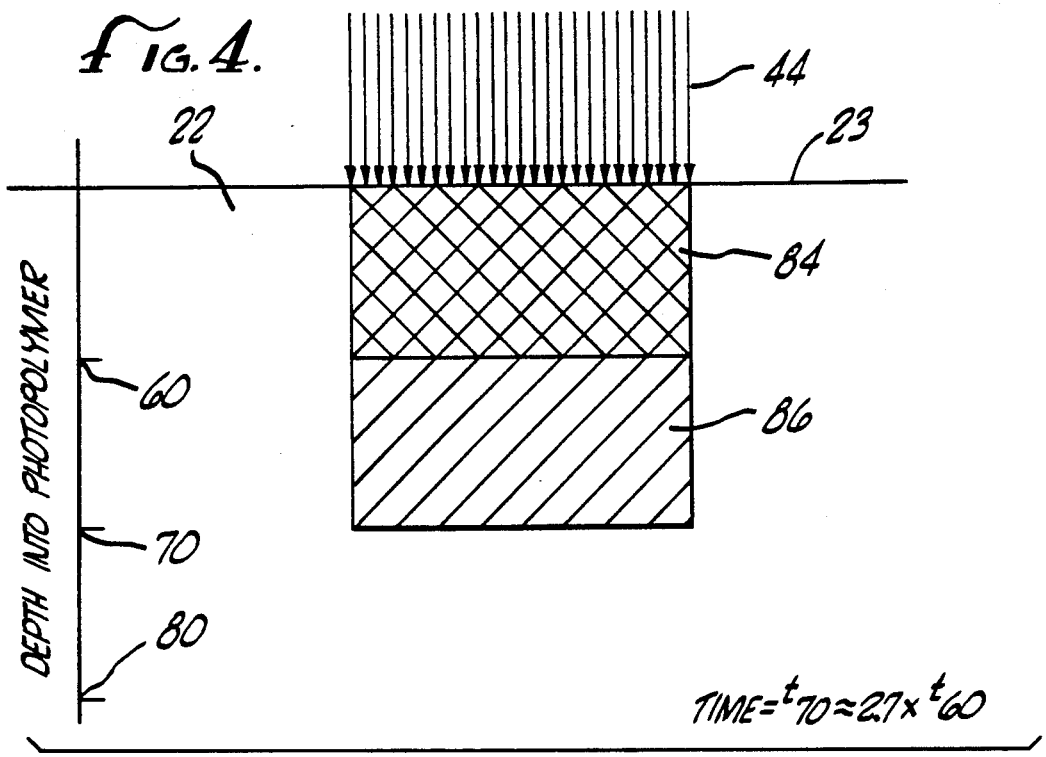
FIG. 4. TIME = $t_{70} \approx 2.7 \times t_{60}$
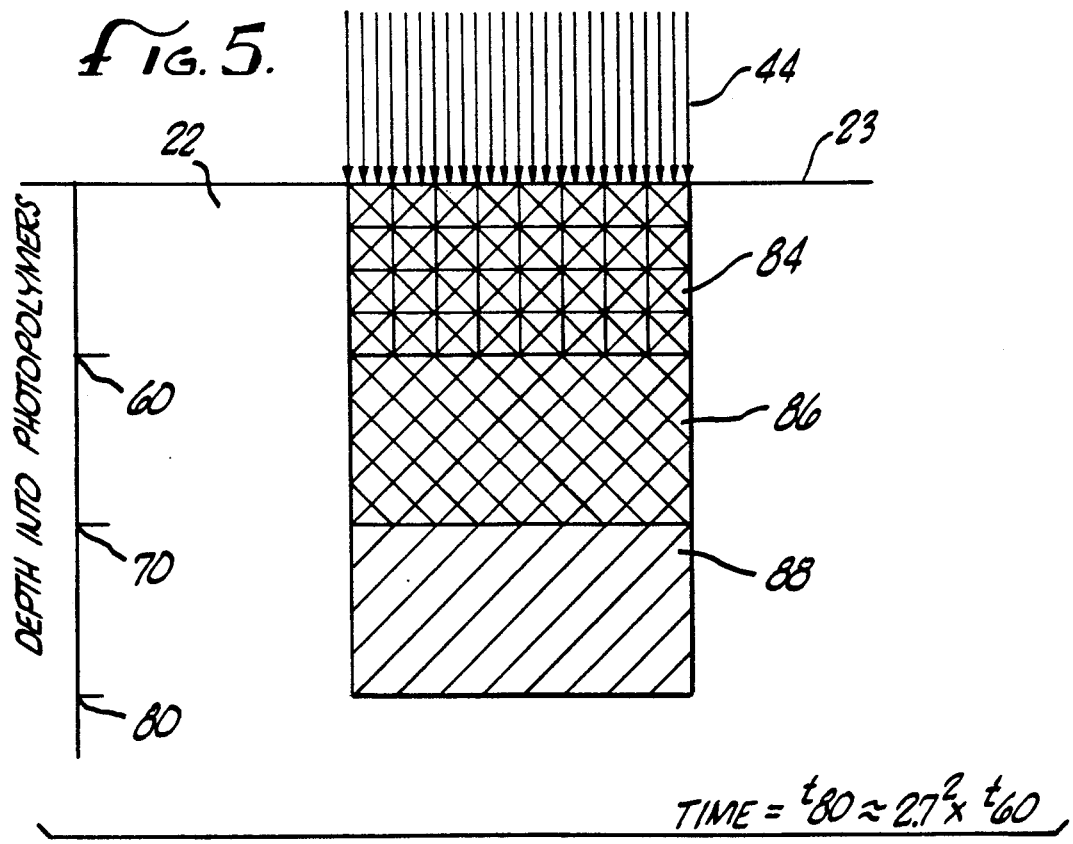
FIG. 5. TIME = $t_{80} \approx 2.7^2 \times t_{60}$

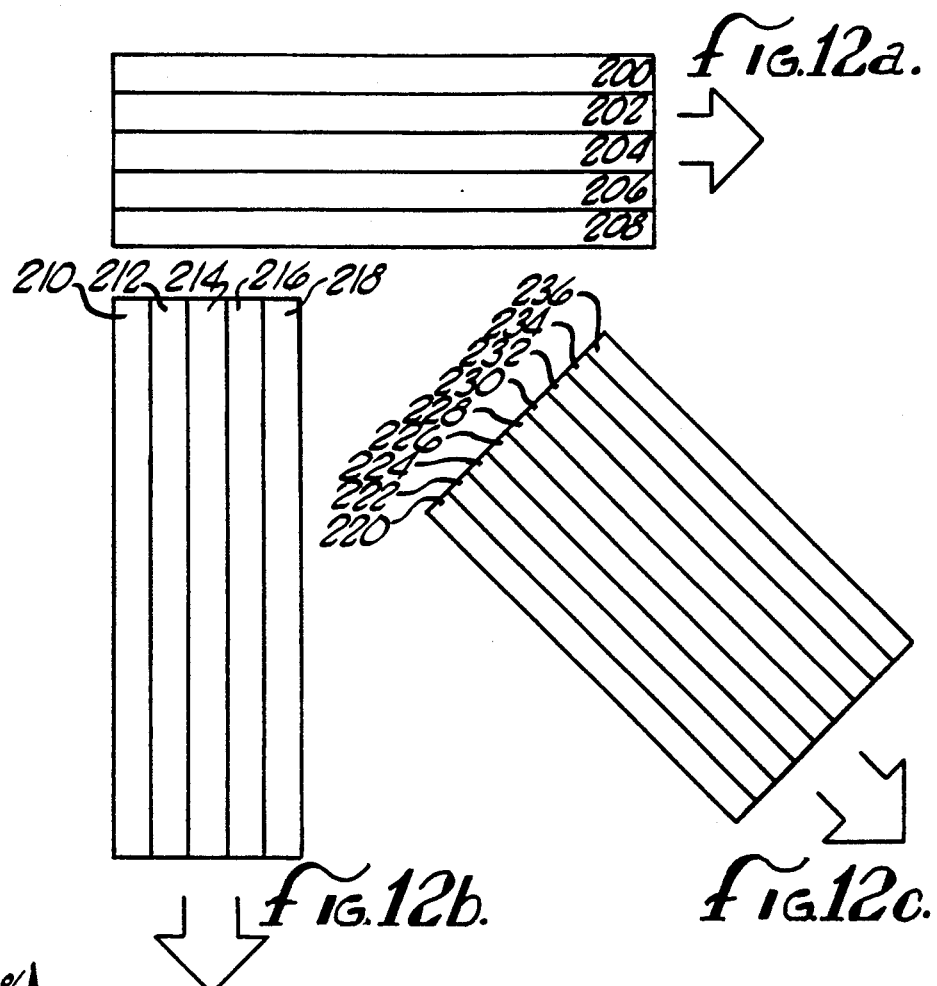
fig.12a.
fig.12b.　　fig.12c.
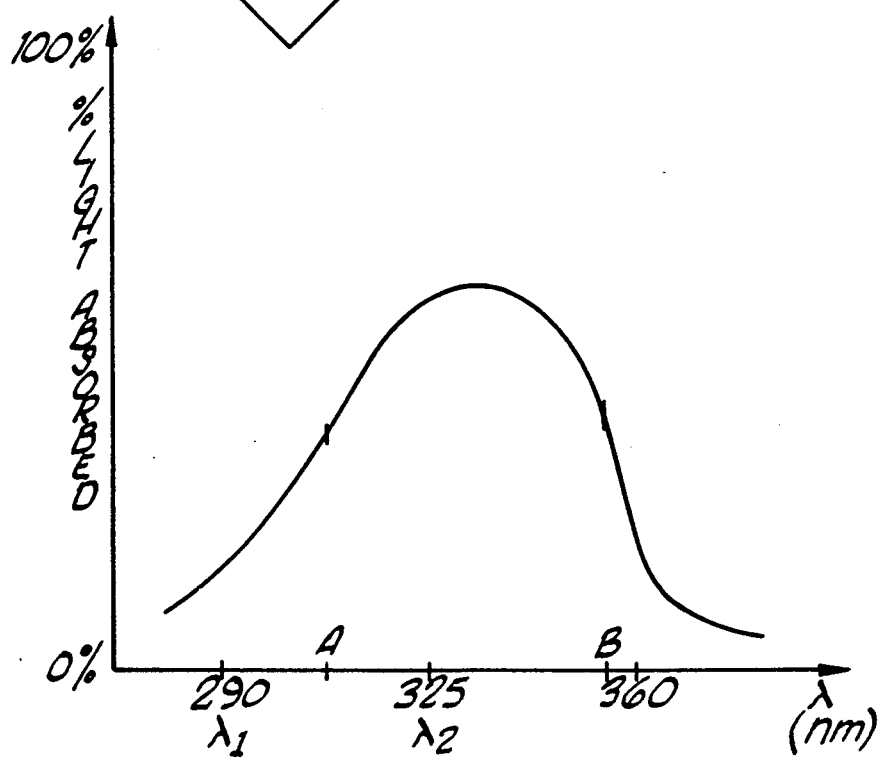
fig.13.

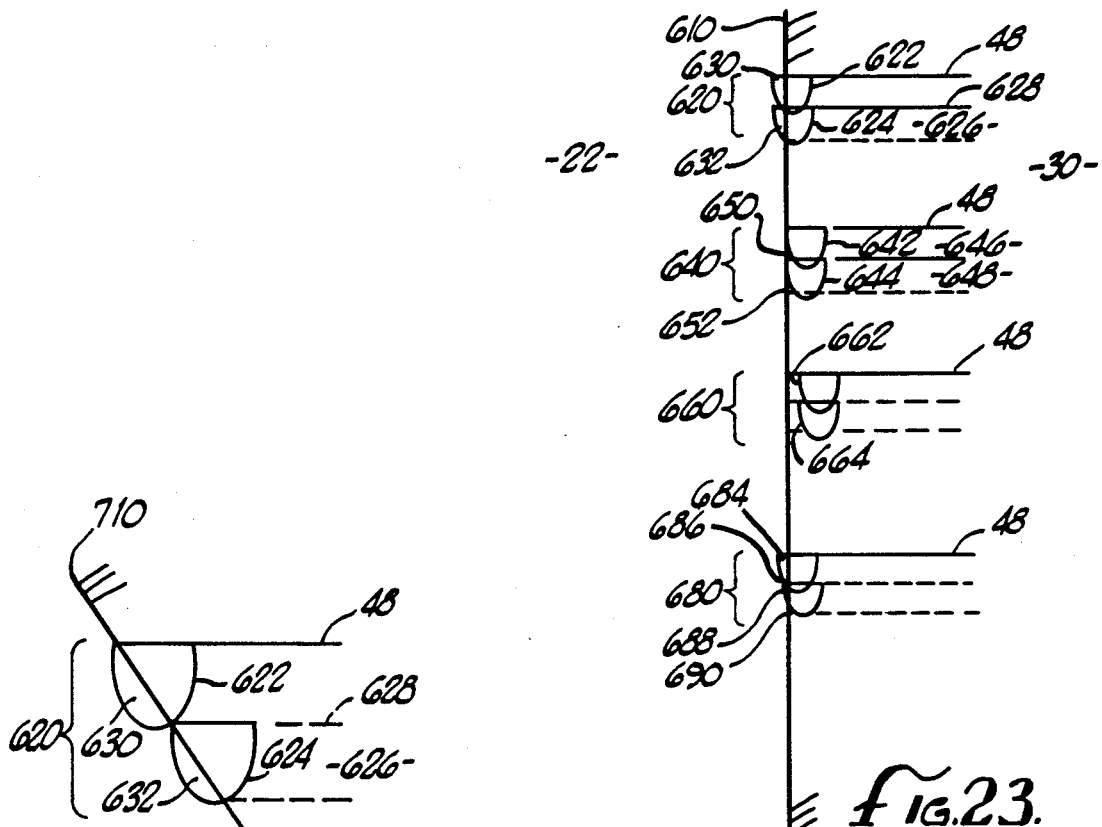
fig.23.
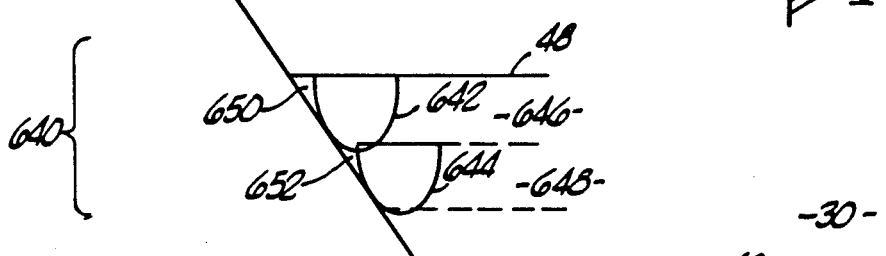
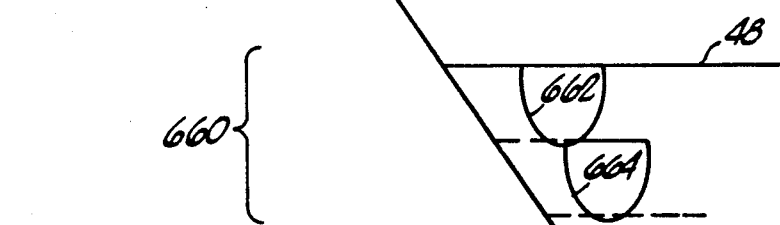
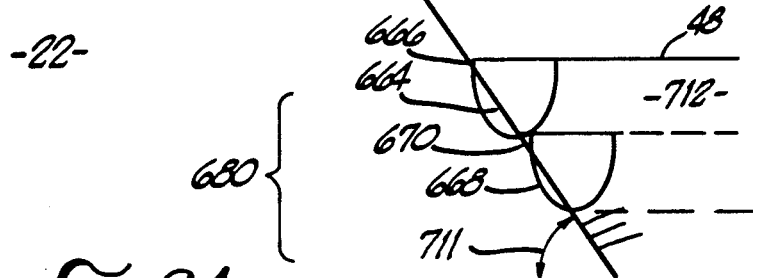
fig.24.

STEREOLITHOGRAPHY METHOD AND APPARATUS EMPLOYING VARIOUS PENETRATION DEPTHS

RELATED APPLICATIONS

This application is a continuation-in-part of U.S. patent application Nos. 07/268,816 (now U.S. Pat. No. 5,058,988), 07/268,837, and 07/268,907 (now U.S. Pat. No. 5,059,021) all of which were filed Nov. 8, 1988, which are continuations-in-part of U.S. patent application No. 07/182,830, filed Apr. 18, 1988, now U.S. Pat. No. 5,059,359; the instant application is also a continuation-in-part of U.S. patent application No. 07/331,644 filed Mar. 31, 1989, which is a continuation-in-part of U.S. patent application No. 07/269,801 filed Nov. 8, 1988, abandoned, which is a continuation-in-part of U.S. patent application No. 07/182,830 filed Apr. 18, 1988, now U.S. Pat. No. 5,059,359. As such, this application is in effect a continuation-in-part of all of the above referenced applications.

BACKGROUND OF THE INVENTION

This invention relates generally to an improved stereolithography method and system for the production of three-dimensional objects.

In recent years, "stereolithography" systems, such as those described in U.S. Pat. No. 4,575,330 entitled "Apparatus For Production of Three-Dimensional Objects By Stereolithography" have come into use. Basically, stereolithography is a method for automatically building complex three-dimensional objects by successively solidifying a plurality of thin layers of a solidifiable fluid-like medium by exposure to appropriate stimulation. Successive layers are solidified on top of each other until all of the thin layers are created to form a whole object (objects made in this way are sometimes called "parts"). In a preferred embodiment the fluid medium is a liquid photopolymer that can be polymerized and solidified by exposure to UV radiation. Each polymerized layer is in essence a thin cross section of the desired three-dimensional part. This method of fabrication is extremely powerful for quickly reducing design ideas to physical form for making prototypes. Moreover, complex parts can be made quickly without tooling. Because the system uses a computer to generate the cross-sectional patterns, the system can be readily linked to a CAD system.

Presently preferred polymers are cured by ultraviolet (UV) light and their curing rates are fast enough using reasonably available UV light to make them practical building materials. The liquid that is not polymerized when a part is formed is still usable and remains in the vat for the creation of successive parts. An ultraviolet laser generates a small intense spot of UV which is moved across the liquid surface with galvanometer or servo mirror X-Y scanners in a predetermined pattern. The scanners are driven by computer generated vectors or the like. Precise complex patterns can be rapidly produced with this technique.

A preferred stereolithography system includes a laser scanner, a vat for containing the polymerizable liquid, and an object support platform, which is capable of being raised and lowered in the vat, and a controlling computer. The system is programmed and automatically makes a plastic part by forming one thin cross section at a time and building the desired three-dimensional object up layer by layer.

In original stereolithographic apparatuses actinic radiation was used to solidify the fluid medium. Teachings in this regard come from the previously mentioned U.S. Pat. No. 4,575,330. In this referenced patent, there are teachings regarding the fluid medium's ability to absorb actinic radiation as being an important factor in determining the ability of the fluid medium to be solidifiable to form thin layers of cohesive material. However, this referenced patent does not disclose methods, techniques, and apparatus necessary to predict desired properties of the solidified material and does not present methods and techniques for controlling such properties. Additional art which doesn't develop the aspects concerning this invention any further, is disclosed by E. V. Fudim. This art includes U.S. Pat. Nos. 4,752,498 and 4,801,477, along with an article in the Sep. 1985 edition of Mechanical Engineering, entitled "A New Method of Three-Dimensional Micromachining" and an article in the Mar. 6, 1986 edition of Machine Design, entitled "Sculpting Parts with Light". Of these references, the one of primary interest is the article entitled "Sculpting Parts with Light". In this article Fudim discusses the use of Beer's law and a coefficient of transmission. He also utilizes a few equations derived from Beer's law in his discussion. Fudim's teachings, however, suffer from the same failing as did the art before him. Fudim failed to teach the significance of considering a separate penetration depth for each wavelength or the contribution of beam profile information in making accurate predictions of cure depth and predictions of other related cure parameters. This failing may be linked to Fudim's emphasis on use of flood exposure in combination with masks. An earlier approach than either of the previous two was disclosed by A. J. Herbert in an article in the Journal of Applied Photographic Engineering, entitled "Solid Object Generation," dated August 1982. In this article Herbert describes the use of, presumably, a single wavelength laser to expose and solidify his material. Herbert doesn't teach the connection between absorption and ability to form thin layers. In this regard Herbert actually preferred the use of a liquid photopolymer that photobleached which makes it more difficult to get predictable and controllable results. Photobleaching refers to the resin's, and the partially solidified material's, inability to absorb actinic radiation as strongly when successive quantities of radiation are absorbed. For example, the byproducts of photoinitiator do not absorb as strongly as the photoinitiator itself. A described by Herbert his polymerized material completely stopped absorbing thereby exposing lower regions to the full beam intensity. Herbert describes the building of test objects in order to determine cure parameters such as cure depth and overcure necessary to adhere layers together.

Another earlier approach was disclosed by H. Kodama in an article in the Review of Scientific Instruments, entitled "Automatic Method for Fabricating a Three-Dimensional Plastic Model with Photo-Hardening Polymer", dated Nov. 1981. In this article, Kodama describes the use of actinic sources and also shows plots of cure depth versus exposure. Like Herbert, Kodama doesn't teach the connection between absorption, cohesiveness, and the ability to make thin layers.

All of these approaches suffer from the need to make test parts to determine cure depth versus exposure and other necessary characteristics each time a desired part is to be created. This is especially true when multiple wavelength sources are used. Since the first commercialization of this technology, by 3D Systems, Inc. of Valencia, Calif., there has been an increasing need in the art to develop techniques that lead to the rapid production of more accurate parts and stronger parts in a more timely manner. The lack of techniques to do these things have inhibited the further development of the technology. The techniques of the present invention address these issues, leading to parts being built with higher resolution, higher accuracy, shorter build times, greater efficiency, enhanced physical properties, and resulting in less operator intervention in the part building process.

Associated with the absorption of actinic radiation many curable materials closely follow Beer's law. This law states that the intensity (I) of radiation at some depth (d) into the material is related to the intensity at the surface of the material times the base of the natural logarithm system (e) to the negative power of the depth (d) divided by the depth of penetration of the material (Dp). In equation form this is $$I(d) = I_o/e^{d/Dp}$$

The depth of penetration is inversely related to the material's ability to absorb radiation. For the photopolymers used in the art of reference, as well as for most other photopolymers, the depth of penetration depends on wavelength. The art of reference used resin and wavelength combinations that resulted in various net penetration depths. All the part building considerations of these references were based on the concept of a net depth of penetration, as opposed to a superposition of the various depths of penetration present. Additionally, however, they did not teach that the depth of penetration for various wavelengths could be utilized to obtain different properties from partially solidified polymer. Also, they did not teach that while using a particular wavelength(s) of actinic radiation that the penetration depth for a given resin could be optimized for part building using a particular layer thickness. Furthermore, it was not taught that to use multiple wavelengths effectively, that the depth of penetration for each wavelength must be considered. No prior art suggested allowing for a plurality of depths of penetraton in building layered parts by stereolithography. In this context there was a single mindedness associated with the use of depths of penetration and a material's ability to solidify, as opposed to the multifaceted view of the present invention.

The first commercial stereolithographic apparatuses employed the use of a single wavelength of actinic radiation and associated resins, with the combination of wavelength and curable resin having properties suited for use at a particular layer thickness. This approach was still, therefore, utilizing a single minded association between depth of penetration, cohesive properties and cure depth.

In summary, in the past, in a stereolithographic apparatus (SLA), the stimulating radiation and photopolymer resin combination have had a single-minded interpretation and utilization of the depth of penetration of the radiation into the curable resin. The ideal depth or depths of penetration, however, actually varies from situation to situation as disclosed in the detailed description below. Thus, it would be beneficial to be able to employ a plurality of depths of penetration in operation of an SLA, either singly or in simultaneous combination depending on the building circumstances and desired results, which is a primary objective and accomplishment of the present invention.

If all other things were equal, a large depth of penetration would always be preferred so that each layer of the part could be formed as quickly as possible for a given layer thickness. However, all other things are not equal. The above statement makes the assumption that the deeper the light penetrates the faster the required amount of stimulating radiation will reach a given point in order to solidify it and thereby produce the deepest thickness of cured material in the shortest time possible. Part of this assumption is correct, that more radiation will reach a particular point in the resin the longer the depth of penetration. However, the assumption is inaccurate beyond that point since the solidification (gel) point of a material is not based on the amount of light that reaches a unit volume but instead is based on the amount of light that is capable of producing the desired solidification reaction, therefore the amount that is absorbed in that unit volume. For a liquid photopolymer this corresponds to the absorption per unit volume of stimulating radiation by the photoreactive element in the resin (generally the photoinitiator) and the radiation/initiator's efficiency in forming polymer. For a reaction based on the melting of powder followed by the resolidification of the liquid formed thereby producing a truly solidified portion of the object, this corresponds to the net energy in a given volume at a particular time (energy input in a unit volume less energy leaving the unit volume), which is absorption and therefore is wavelength dependent. Therefore, there will exist a particular depth of penetration that will yield the minimum time to gel material to a particular depth. Any other depth of penetration (based on wavelengths, resin and other parameters used) will produce a longer time to gel. However, drawing speed is not the only criteria involved in the production of objects by these techniques. For the photopolymer case, one must also consider, for example, the strength of the gelled material formed, the amount of distortion produced, and the effects of excess exposure in a given region. Therefore, the depth of penetration would preferably be optimized by the present invention to yield the most desired net result based on a variety of conflicting factors. The dominance of these factors may vary from situation to situation. There are several such factors.

There are other problems that have arisen due to the fact that SLA have utilized depths of penetration in the previously described single-minded manner. For example, some lasers have multiple wavelengths or "lines" which require special consideration if they are to be used with maximum effectiveness in practicing high resolution stereolithography. Without this special consideration there are only limited methods of utilizing such a laser: 1) use of filters to screen out light of all wavelengths of a beam except one for use in an SLA since different lines generally have different penetration depths, 2) build special parts each time the system is to be used to determine build characteristics of the photopolymer beam combination. However, this first approach wastes laser power since some of the light is not used. Thus, it would be desirable to avoid this power waste without sacrificing SLA performance. In present SLA use, power waste is quite expensive. The second approach is necessary for determining build characteristics since a multiline laser may loose power differentially for each line, making curing with multiple lines unpredictable when considering only the overall intensity. The second approach, however is labor-and time-intensive. Newer, more powerful Argon ion lasers can be used while lasing at multiple lines and it is desirable to effectively employ such a laser in an SLA.

Curling is another problem that has developed in SLA use. This occurs because the photopolymer shrinks upon hardening. As the top layer hardens and shrinks, it tends to pull up on the previous layer causing a distortion known as curl. This is undesirable because it distorts the shape of the actual object made such that it does not match the object as designed. An SLA which minimizes this distortion is very desirable. This type of distortion is described in detail in U.S. patent application Ser. No. 339,246 filed Apr. 17, 1989.

For further details of stereolithography, reference is made to U.S. Pat. No. 4,575,330 and the following pending U.S. patent applications which are incorporated herein by this reference in their entirety, including appendices attached thereto or material incorporated therein by reference, as if fully set forth herein:

U.S. patent application Ser. No. 07/339,246.
U.S. patent application Ser. No. 07/331,644.
U.S. Pat. No. 5,015,424.
U.S. patent application Ser. No. 07/268,429.
U.S. patent application Ser. No. 07/268,428, now abandoned.
U.S. patent application Ser. No. 07/268,408, now abandoned.
U.S. patent application Ser. No. 07/268,816.
U.S. patent application Ser. No. 07/268,907.
U.S. patent application Ser. No. 07/268,837.
U.S. patent application Ser. No. 07/249,399.
U.S. patent application Ser. No. 07/365,444.
U.S. patent application Ser. No. 07/265,039, now abandoned.
U.S. patent application Ser. No. 07/269,801.

SUMMARY OF THE INVENTION

Briefly, and in general terms, the present invention provides an improved stereolithographic apparatus (SLA) and an improved method for generating a part from curable material. In particular, the invention allows (predicts, determines, produces, or controls) multiple depths of penetration of stimulating (actinic or melting, e.g.) radiation (ultraviolet light, visible infrared, electron beam, or chemical spray, e.g.) into a vat of photopolymer to determine and/or control and/or produce desirable characteristics associated with the creation of parts. From a determinative and/or predictive point of view, these desirable characteristics include but are not limited to determination of cure depth from a given exposure, determination of cure width, determination of required minimum surface angle (MSA), determination of optimum skin fill spacing, determination of the strength of cross sections of partially polymerized material, determination of amount of curl type distortion, and determination of necessary overcure to attain adhesion between layers, etc. These determinations can lead to the use of particular building techniques to insure adequate part formation. From the controlling and producing point of view, the depths of penetration can be controlled to obtain optimized characteristics for layer thickness, maximized speed of drawing, minimized print through, maximum strength, minimum curl, and maximum resolution, for example. An important aspect of the present invention is the integration of resin characteristics, penetration depths associate with the particular resin being used and the wavelength(s) of stimulating radiation being used to solidify it, and with the intensity profile of the beam of stimulating radiation as it appears when acting upon the resin surface. Allowance for (prediction, determination, production, or control of) a plurality of depths of penetration may be accomplished in an automated fashion.

Various factors are optimized by allowing for a plurality of depths of penetration. Speed of part production is optimized to the extent permitted by other factors. Some of these factors are:

First, one such factor, for example, is the vertical resolution used to form the part. In other words, this factor is the layer thickness chosen. The larger the layer thickness (and cure depth), the less accurately the shape of the part being made is resolved. The resolution demanded by the user varies from situation to situation.

A second factor is the additional exposure inadvertently given at certain places. This is called "print-through". For example, when an SLA uses cross hatching vectors (traces of UV light to cure resin at the surface of a vat) to form the part, the intersections of the traces are subject to double the exposure of the other portions of the traces. This method of building is described in detail in U.S. patent application No. 331,644 filed Mar. 31, 1989. If the depth of penetration is deeper, so is the depth of overcuring at the intersections. The user's tolerance for this overcuring varies from situation to situation.

A third factor is the strength of layers and the differential in strength between the upper portion of a layer and the lower portion of the layer. When the depth of penetration is much shorter than a layer thickness, the upper portion is much stronger than the lower portion. This is because the upper portion is polymerized and cured far beyond the point of gelling because of the additional exposure that it has received by the time the lower portion has received enough exposure to gel. This affects the attachment to the next higher layer, cantilever strength, and "green" strength before the object is fully cured and solidified. The desired strength of the layer and difference between upper portions of a layer and lower portions of a layer varies from situation to situation.

A fourth factor is the radiation beam profile (e.g. laser beam profile), which is discussed in co-pending U.S. patent application Ser. No. 268,816 filed Nov. 8, 1988. Commercial laser beams may not have a uniform intensity cross-section, or "profile". Various portions of a beam may have greater intensity, and thus provide greater exposure, than other portions of the beam. For example, the center of the beam may have higher intensity than the periphery. This greater intensity and therefore greater exposure causes the depth of cure to be greater at the center. A difference in cure depth is caused by a difference in exposure. The magnitude of this difference in cure depth is also based on the depth of penetration of the material and the material's polymerization and gel characteristics. It is this combination that affects the solidification properties of the material and therefore controls the type of processing techniques possible in order to yield a desired net result. For example, a non-uniform profile of a beam scanning in a line causes a non-uniform cure depth (non-uniform shape of the bottom of solidified material formed). The cure depth of solidified (at least gelled) material can no longer be determined based on the average intensity of the beam and the scanning speed. Instead, it must be based on the profile of the beam. The width of the line formed is no longer a function of the beam diameter but instead is a function of the exact profile and scanning speed of the beam. As the penetration depth changes so will the relationship between cure width and cure depth.

The necessary balancing to obtain desired part properties varies. The factors vary from application to application, SLA to SLA, part to part, and from portion to portion of each layer of a part. The approach of this invention employs a plurality of depths of penetration during and between SLA operations as well as the use of a beam profiling system to aid in the determination, production, and/or control of appropriate variables.

In a first preferred embodiment, a plurality of depths of penetration is provided by various wavelengths of actinic radiation, with each wavelength having a different depth of penetration into the resin, and therefore each wavelength resulting in the creation of different characteristics of the partially solidified mass that is being created from the liquid photopolymer. These different characteristics that are produced imply the possibility of using different wavelengths to achieve various desired characteristics depending on the requirements of various building circumstances. Examples include the use of different wavelengths for optimizing build properties for different layer thicknesses, use of different wavelengths to control print through, use of different wavelengths to optimize part building time. The different wavelengths may be employed singly (one at a time) or simultaneously.

By the apparatus and methods of this invention the controlled and/or automated use of simultaneous multiple wavelengths of stimulating radiation can be used in the stereolithography building process. This represents a significant improvement over prior approaches which utilized one of the following approaches: 1) a single wavelength of actinic radiation, or 2) use of multiple wavelengths in an inconsistent, accidental, unappreciated, uncontrolled, and unautomated manner which lead to cumbersome set up procedures for building parts and/or low quality, low resolution part production. This first prior approach results in low efficiency in the use of the actinic radiation that is produced which is capable of solidifying the liquid photopolymer. The second prior approach results in higher efficiency in use of produced radiation, but much lower control over the properties of the partially solidified material being formed from the liquid photopolymer. The novel features of this invention overcome these difficulties associated with the prior approaches. This automated and/or controlled use of multiple wavelengths leads to several useful approaches: 1) Minimum control over the stimulating radiation source, but highly desirable ability to predict build characteristics and therefore ability to know, before building, what the probability of producing an acceptable part is, and therefore whether alternate building techniques must be employed, 2) Controlling of the multiple wavelength actinic radiation source (this refers to controlling the presence of various wavelengths (and thus depths of penetration), the power associated with each wavelength, and the power distribution associated with each wavelength to produce specific desired properties of the partially solidified mass that is being created which allows considerably more control over properties than the use of a single wavelength, 3) The balancing of the resin to yield the same depths of penetration (and critical exposures, and possibly efficiencies) for each of the wavelengths involved so that the higher efficiency production with multiple wavelengths of stimulating radiation can be used in combination with the simpler techniques associated with building parts using a single wavelength (a single depth of penetration).

In a second preferred embodiment a plurality of depths of penetration is provided by changing the liquid photopolymer. This again results in the ability to obtain optimum properties from different building circumstances. The curable material is changed by replacement or alteration.

These embodiments may be combined with each other and other embodiments are possible without departing from the novel concepts of the present invention. The above advantages of the present invention as well as other advantages and embodiments will become clear from the following description and exemplary drawings.

BRIEF DESCRIPTION OF THE DRAWINGS

FIG. 4 is the cross-section of FIG. 3 after more exposure.

FIG. 5 is the cross-section of FIG. 4 after still more exposure.

FIG. 8 is a bar graph showing intensity at line 8—8 in FIG. 7, while

FIGS. 12a, 12b, and 12c diagram the exposure patterns of moving a particular laser beam across the surface of a vat of photopolymer. FIG. 12a shows a horizontal trace, FIG. 12b a vertical trace, and FIG. 12c a diagonal trace.

FIG. 13 is a graph plotting absorption against wavelength for a given photopolymer.

FIG. 23 shows four arrangements for an edge of a part made in an SLA.

FIG. 24 shows four arrangements for a slanting edge of a part.

DETAILED DESCRIPTION

I. The Stereolithographic Apparatus

The stereolithographic system with which the present invention is used generates three-dimensional objects by creating cross-sectional pattern of the object to be formed at a selected surface of a fluid medium, e.g., a UV curable liquid or the like, capable of altering its physical state in response to appropriate synergistic stimulation such as impinging electromagnetic radiation, electron, or other particle beam bombardment. For example, radiation solidifiable powders could be used such as plastic powders and sinterable metal powders. Successive adjacent laminae, representing corresponding successive adjacent cross-sections of the object, are automatically formed and integrated together to provide a step-wise laminar or thin layer buildup of the object, whereby a three-dimensional object is formed from a substantially planar or sheet-like surface of the fluid medium during the forming process.

Figure 1:
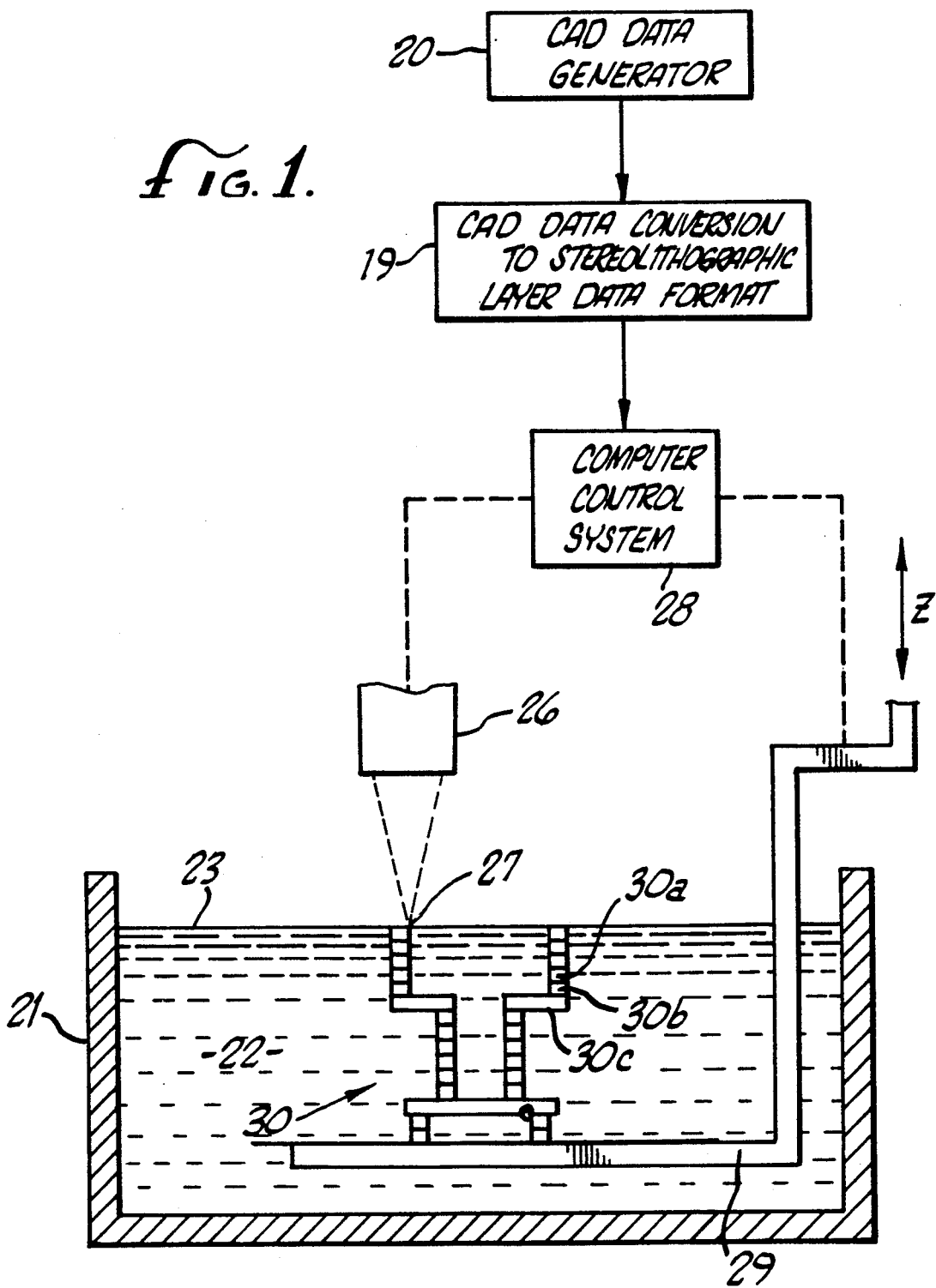
FIG. 1 is a combined block diagram, schematic, and elevational sectional view of a stereolithography system.

FIG. 1 shows a preferred stereolithographic system in elevational cross-section. A container 21 is filled with a UV curable photopolymer 22 or the like, to provide a designated working surface 23. A programmable source of ultraviolet light 26 or the like produces a spot 27 of ultraviolet light on the plane of surface 23. The spot 27 is movable across the surface 23 by the motion of mirrors or other optical or mechanical elements (not shown in FIG. 1) used with the light source 26. The position of the spot 27 on surface 23 is controlled by a computer control system 28. The system 28 may be controlling the formation of cross-sections based on CAD data produced by a generator 20 in a CAD design system or the like and directed in PHIGS format or its equivalent to a computerized conversion system 19 where information defining the object is specially sliced and processed to reduce stress, curl and distortion, and increase resolution, strength and accuracy of reproduction, before being sent to system 28.

A movable elevator platform 29 inside container 21 can be moved up and down selectively, the position of the platform being controlled by the system 28. As the device operates, it produces a three-dimensional part 30 by step-wise buildup of integrated laminae, or layers, such as 30c, 30b, and 30a.

The surface of the UV curable liquid 22 is maintained at a constant level in the container 21, and the spot 27 of UV light, or other suitable form of reactive stimulation, of sufficient intensity to provide the exposure to cure the liquid and convert it to a solid material, is moved across the working surface 23 in a programmed manner. As the liquid 22 cures and solid material forms, the elevator platform 29 that was initially just below surface 23 is moved down from the surface in a programmed manner by any suitable actuator. In this way, the solid material that was initially formed is taken below surface 23 in preparation for new liquid 22 to recoat over the previously cured layers to form a new surface 23. The distance between the new surface 23 and the upper surface of the previously cured layer is equal to the layer thickness of the next layer to be formed. A portion of this new liquid is, in turn, converted to solid material by the programmed UV light spot 27, and the newly solidified material adhesively connects to the material below it. This process is continued until the entire three-dimensional part 30 is formed. The part 30 is then removed from the container 21, and the apparatus is ready to produce another part. Another part can then be produced, or some new part can be made by changing the design, data, or program in the computer 28, or CAD generator 20.

The light source 26 of a stereolithography system according to a preferred embodiment of the invention is typically an Argon ion ultraviolet laser. Other embodiments employ a helium-cadmium ultraviolet laser such as the Model 4240-N HeCd Multimode Laser, made by Liconix of Sunnyvale, Calif.

A commercial stereolithography system will have additional components and subsystems besides those shown in connection with the schematically depicted systems of FIG. 1. For example, the commercial system would also have a frame and housing, and a control panel. It should have means to shield the operator from excess UV light, and it may also have means to allow viewing of the part 30 while it is being formed. Commercial units will provide safety means for controlling ozone and noxious fumes, as well as conventional high voltage safety protection and interlocks. Some commercial units may also have means to effectively shield the sensitive electronics from electronic noise sources. The commercialized SLA is a self-contained system that includes a CAD system or interfaces directly with the user's CAD system. Such commercial SLA systems are available from 3D Systems, Inc. of Valencia, Calif.

II. Depth of Penetration

In many radiation-absorbing materials the amount of radiation absorbed is proportional to the amount of radiation present. This translates to the transmitted intensity following Beer's law. Beer's law is often a good first approximation to absorption behavior, attenuation, etc. even when other mechanisms such as photobleaching are present, and therefore is a useful description of the process. The techniques of this invention are still applicable to absorbing materials even if they do not follow Beer's Law. Our preferred embodiments utilize resin/wavelength combinations that closely follow Beer's law; therefore, most of the approaches described herein will be based on utilization of this law. However, it will be apparent to those skilled in the art how to utilize the methods of the present invention in combination with materials whose absorptive properties follow other laws.

Figure 2:
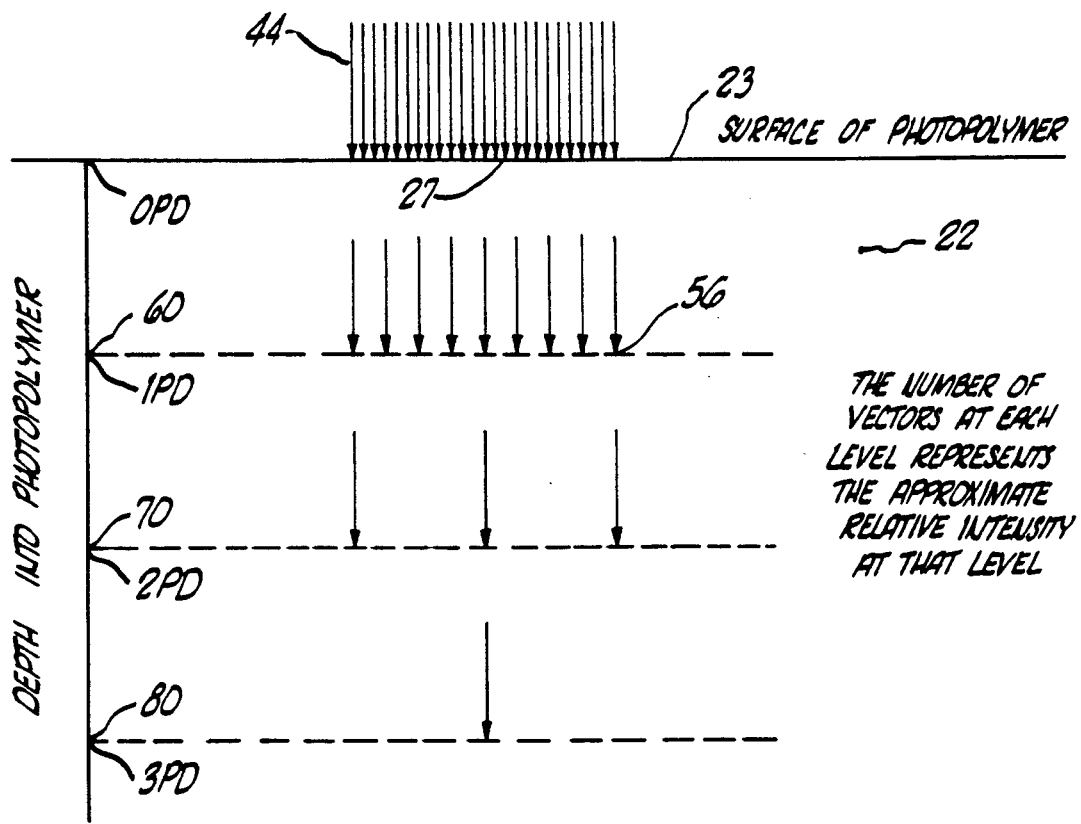
FIG. 2 shows a vertical cross-section of a vat of photopolymer of a stereolithographic apparatus (SLA).

FIG. 2 is a representation of a vertical cross section of a vat of photopolymer 22 which obeys Beer's Law. Monochromatic light 44 in the form of a beam of uniform intensity strikes the top surface 23 of photopolymer 22 at a given spot 27. Intensity of light 44 is measured in Watts/cm$^2$ or similar units. At the surface of photopolymer 22 the intensity has a value $I_o$. Each element of the photopolymer 22 absorbs some percentage of the light incident upon it and transmits the rest except for a negligible amount which is scattered.

By the time light 44 has been partially transmitted to level 60, the intensity of light 44 has been reduced by a factor of 1/e where e is the base of the natural logarithm system which is equal to approximately 2.718. If the intensity of light 44 at level 48 is designated as $I_o$, the intensity of transmitted light 56 at level 60 is $I_o/e$. The distance in which light 44 is attenuated by a factor of 1/e (e.g. from surface 48 to level 60) is defined as the depth of penetration Dp or one penetration depth (PD).

From level 60, some of light 56 is transmitted (and some is absorbed (for illustration scattered light is ignored)) down to level 70. The distance from level 60 to level 70 is another PD. Therefore, the intensity of light 56 which reaches level 70 is less than the intensity of light 56 which reaches level 60, by a factor 1/e. Thus, level 70 is two PD below surface 23 and has light 56 of intensity $I_o/e^2$. Similarly, level 80 is 3 PD below surface 23 and light 56 at level 80 has intensity $I_o/e^3$. In general, the intensity I at a given depth d below surface 23 which receives surface intensity $I_o$ is given by: $I(d) = I_o \cdot e^{d/Dp}$, where Dp is the depth of penetration and d/Dp is thus represented by a particular number of PD. Thus, for example, at a level that is 2.3 PD below surface 23, the intensity is $I_o/e^{2.3} \approx I_o/10$.

The present invention allows for various penetration depths Dp to address the problems discussed above in the Background of the Invention section and to achieve other advantages.

Figure 3:
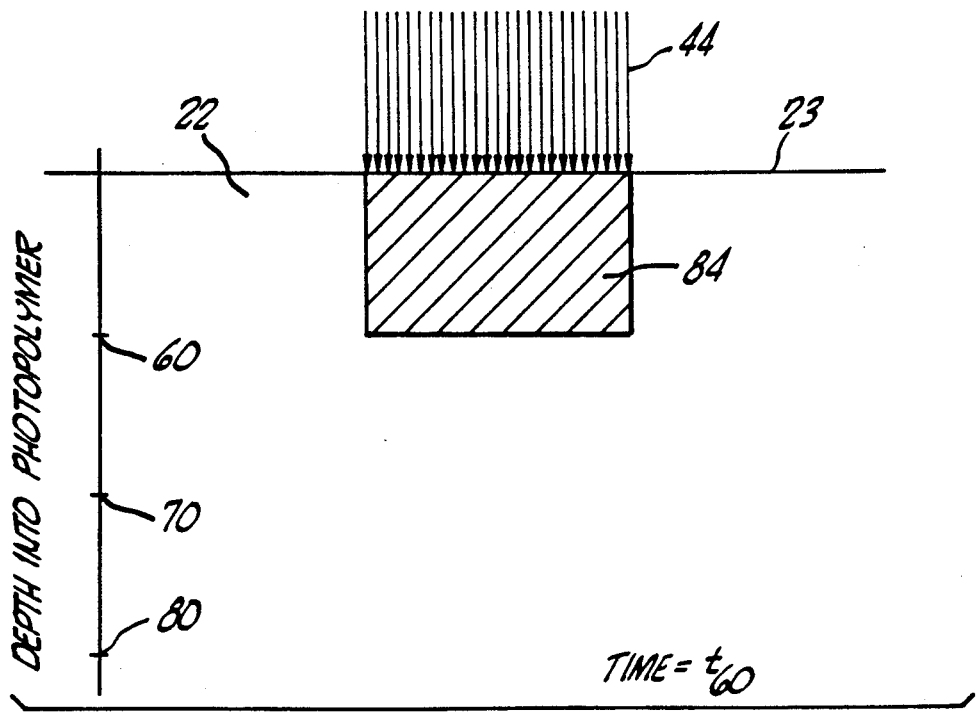
FIG. 3 shows the cross-section of FIG. 2 after a small amount of exposure.

Exposure (E) is defined as the amount of energy striking a surface. Therefore, exposure is measured in terms of energy/area. Typical units are joules/cm$^2$. Upon sufficient exposure to UV light, photopolymer 22 turns from a liquid to gel. The minimum amount of exposure to cause a sufficient number of reactions to form gel is called the critical exposure $E_c$. This critical exposure is material, wavelength, etc. dependent. If photopolymer 22 receives more exposure than $E_c$, the gelled mass polymerizes more and the mass becomes stronger until the point is reached that sufficient exposure has been given to complete the polymerization process. Exposure doesn't cause polymerization but absorption of appropriate radiation from the exposing radiation causes polymerization in a volume of photopolymer. Since light 44 becomes more and more attenuated as it goes deeper and deeper into the photopolymer 22, the upper levels receive greater intensity, and thus greater exposure, than the lower levels. Thus, the upper levels will gel first. For example, level 60 will receive $E_c$ at a time when level 70 has received less than $E_c$ by about a factor of 3. FIG. 3 captures a moment in time when only the material above level 60 has received at least $E_c$, so photopolymer 22 above level 60 exposed to light 44 has turned into a gel in region 84, whereas photopolymer 22 below level 60 exposed to some of light 44 has not yet gelled.

Some time later, after longer exposure (approximately 2.7 times longer), level 70 will reach $E_c$. This time is depicted in FIG. 4. All the material above level 70 exposed to light beam 44 has now hardened from liquid to non-liquid. For example, region 86 is now gelled. By this time, region 84 has received much more exposure than $E_c$ and so the photopolymer 22 in region 84 is even stronger and more cohesive.

At an even later time, after even longer exposure (approximately 2.7 times longer), level 80 will reach $E_c$. This time is depicted in FIG. 5. All the material above level 80 exposed to light 44 has, by the time depicted in FIG. 5, hardened from liquid to non-liquid. For example, region 88 has become gelled. By this time, region 86 has received much more exposure than $E_c$ (about 2.7 times) and so the photopolymer 22 in region 86 is further polymerized, thereby being formed into a stronger, more cohesive mass. Also, by the time depicted in FIG. 5, region 84 has received very much more exposure than $E_c$ and so the photopolymer 22 in region 84 is further polymerized, thereby forming an even stronger, more cohesive mass. The process of increasing exposure to increase strength and cure depth can be continued. In the above descriptions of FIGS. 3, 4, and 5 there is actually a continuous gradient in extent of polymerization as one progresses vertically through the gelled material. Various exposures between level 60 and level 80 yield various cure depths. There is actually a minimum exposure that produces the thinnest possible cohesive line for a given material/wavelength combination. For this example, we have assumed the minimum to be between level 23 and level 60.

As discussed previously, the intensity I as a function of depth (d) in mils below surface 23 is $I(d) = I_o/e^{d/Dp}$ where $I_o$ is the intensity of light 44 incident at spot 27 on surface 23 shown in FIG. 2, and Dp is one penetration depth PD measured in mils. Since exposure E is proportional to intensity (I) we can write $E(d) = E_o/e^{d/Dp}$.

Figure 6:
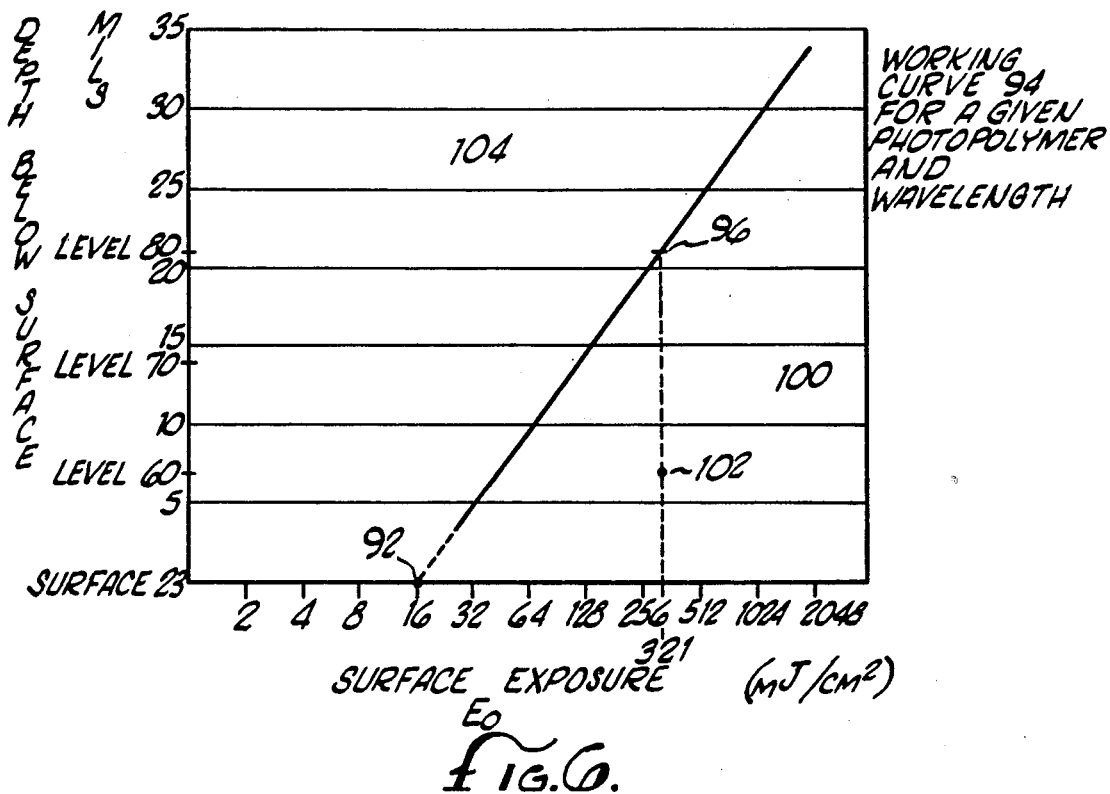
FIG. 6 is a working curve graph plotting depth of cure against surface exposure for a given SLA application.

FIG. 6 is a "working curve" plotting critical exposure $E_c$ as a function of depth below surface 23 and surface exposure $E_o$. In other words, FIG. 6 is a plot of cure depth versus exposure. As discussed above with respect to FIGS. 3, 4, and 5, the critical exposure $E_c$, which is just enough to gel photopolymer 22, is reached at greater depths below surface 23 only after greater surface exposure $E_o$ is given. This is because not all of light 44, which provides surface exposure $E_o$, is transmitted to the greater depths. In FIG. 6, surface 23 is depicted on the depth axis at 0 mils below working surface 23. In this example, $E_c$ is equal to 0.016 J/cm$^2$. Thus, working curve 90 intersects the $E_o$ axis, where depth (d) equals zero, at 0.016 J/cm$^2$ at point 92. Point 92 represents spot 27 from FIG. 2 after spot 27 has received critical exposure $E_c = 16$ mJ/cm$^2$. At this point, spot 27 has just begun to gel.

As discussed above, Intensity I at lower levels varies from application to application, depending on such things as the absorption characteristics of the material chosen for photopolymer 22 and for the wavelength of incident light 44. Critical exposure $E_c$ varies from application to application. The value of $E_c$ depends on the resin used, the wavelength used, the atmosphere above the resin (in equilibrium), temperature, etc. Thus, working curve 94 is only valid for a certain application. In working curve 94, point 96 represents the depth (here, 21 mils) at which exposure is equal to critical exposure $E_c$ when the surface exposure $E_o$ has accumulated to something over 256 mJ/cm$^2$. In this example, the depth for point 96 is 21 mils and this depth could be, for example, at level 80 in FIG. 5.

In FIG. 6, area 100 to the right of working curve 94 represents combinations of depth and surface exposure $E_o$, for a given application, for which the actual exposure E is greater than $E_c$. At these combinations, photopolymer 22 is no longer liquid.

In general, the further from working curve 94 that such combinations in area 100 are, the more polymerized and cohesive the photopolymer 22 will be. For example, point 102 in FIG. 6 can correspond to region 84 near level 60 in FIG. 5. Level 60 is closer to surface 23 than is level 70. Therefore, after a surface exposure $E_o$ at surface 23, level 60 has received much greater exposure E than has level 70. While point 96 is on the working curve 94 (level 80 has just gelled), point 102 is far away from the working curve 94 (level 60 has become more fully polymerized).

Area 104 to the left of working curve 94, by contrast to area 100, represents combinations of depth and surface exposure $E_o$, for the given application of FIG. 6, for which the actual exposure E is less than $E_c$. At these combinations, photopolymer 22 is still liquid.

Working curve 94 is valid for a given application, a given photopolymer exposed by a given wavelength, or wavelength combination, the amount of and type of gases absorbed in the resin, etc. It assumes that the history (amount of light already absorbed) and intensity do not affect the absorption percentage of the photopolymer. In practice, many materials obey this simple rule over quite a wide range of exposures and intensities (rates of accumulation of exposure). In many other cases where the rule is not obeyed exactly this analysis still gives good approximation to the behavior, so that only small adjustments need to be made.

If working curve 94 were shifted to the right in FIG. 6, that would mean an application for which critical exposure $E_c$ were larger. If the slope of working curve 94 were steeper (larger Pd), that would mean an application for which photopolymer 22 transmitted a greater portion of incident light 44. A flatter working curve, on the other hand, would represent an application for which photopolymer 22 transmitted a smaller portion of incident light 44 (smaller Pd) than the application represented in FIG. 6.

Allowing for various values of the depth of penetration Dp, using the system described herein, provides many advantages. It permits maximum speed of SLA operation, saves power, prevents distortion, helps obtain desired resolution, limits cross-hatching overcure, optimizes strength, and increases uniformity of cure depth. In a first preferred embodiment, various depths of penetration are provided by one or more radiation sources of various wavelengths simultaneously or singly in an SLA. In a second preferred embodiment, various depths of penetration are provided by photopolymers of various transmittance/absorption in an SLA.

Since an SLA is used for quickly reducing a computer-aided design to a three-dimensional prototype, speed of operation is an important goal. A deeper depth of penetration enhances speed for a given critical exposure. With a larger depth of penetration, a larger portion of each layer can be solidified with each pass of a laser beam. Put another way, a larger depth of penetration with the same critical exposure permits a quicker laser beam pass to cure a given point to a desired depth.

Use of a large depth of penetration is important in obtaining speed partly due to the fact that an increase in beam intensity/exposure begets a proportionally smaller increase in depth of cure. That is to say, a doubling of exposure provides a change in cure depth equal to (ln 2) (Dp). Thus, so long as the initial cure depth $d_1$ is greater than (ln 2). Dp a subsequent doubling of surface exposure $E_o$ will less than double initial cure depth $d_1$.

Use of a large depth of penetration is thus important to quickly increase the depth of cure. For a given critical exposure, a particular cure depth will be reached faster for a material with twice the depth of penetration by a factor of $e^{(d/2Pd)}$. A depth of penetration (Dp) of about 30–40% of the desired layer thickness has been found to work well in terms of speed and cohesiveness of the layers formed. For example, for a 20 mil layer thickness this corresponds to a Pd of 5 to 7 mils. Table 2 below depicts an example of how layer thickness may affect speed of part formation. Table 2 takes into account the polymerization time, reflecting the amount of surface exposure $E_o$ needed to cure down to a given layer thickness. The table also takes into account the recoating time, the amount of time to prepare for polymerization of each layer. Recoating is described in the '330 patent to Hull and in co-pending applications, U.S. patent application No. 07/249,399 and PCT patent application No. PCT/US89/04096, incorporated herein by this reference. Basically, after each layer is complete, a new layer of liquid photopolymer 22 must be recoated on surface 23 so that the next higher layer of part 30 can be selectively cured. For example, referring to FIG. 1, after layer 30c is formed, a new layer of photopolymer 22 must be applied on top of layer 30c, then this new layer is selectively solidified to become layer 30b. A thin recoat may take much longer than a thick recoat because the photopolymer is viscous and takes a long time to spread itself out uniformly when elevator 29 is lowered by one thin layer thickness even when assisted by mechanical aids.

TABLE 2

| Completed Thickness | Layer Thickness | Polymerization time per layer | # of Layers | Total Polymerization Time | Recoat Time Per Layer | Total Recoat Time | Total Time |
|---|---|---|---|---|---|---|---|
| 20 mils | 20 mils | 10 seconds | 1 | 10 seconds | 1 second | 1 second | 11 seconds |
| 20 mils | 10 mils | 2 seconds | 2 | 4 seconds | 2 seconds | 4 seconds | 8 seconds |
| 20 mils | 5 mils | 1 second | 4 | 4 seconds | 10 seconds | 40 seconds | 44 seconds |

Table 2 shows that four 5 mil-thick layers takes five and one-half times as long as two 10 mil-thick layers, largely due to recoating time. Even though greater polymerization time is needed to provide a cure depth (here, layer thickness) of 10 mils, much greater recoating time is needed to provide for two layers of 5 mil thickness. In the example of Table 2, one 5 mil layer takes the same amount of time as one 20 mil layer which is four times thicker. If more material was to be polymerized on each layer the minimum time to build a given thickness might favor thinner layers.

A greater depth of penetration facilitates thicker layers and thus faster part formation; however, thicker layers mean less resolution. The resolution of part 30 is inversely proportional to layer thickness because thicker layers can less accurately approximate non-vertical design surfaces. For example, a wheelchair ramp is designed to slope smoothly. If successive lamina are used to approximate the design, and the lamina thickness is eight inches, the object produced is a stairway due to poor resolution. A layer thickness of 5 mils, however, would produce a very smooth ramp. Some portions of a part may demand greater resolution for many reasons (for example, due to planned mechanical interaction with other objects). Vertical surfaces of a part do not necessarily require thin layers since the shape will be approximately the same (vertical) with any reasonable layer thickness. As an analogy, a desired stairway designed to have ten-inch tall steps can be made as accurately with ten-inch layers as with 5 mil layers. Some parts which are only rough designs may require less resolution. Thus, if speed is considered an important parameter, the amount of resolution can be traded against increased depth of penetration.

Increasing the depth of penetration Dp is also limited by print-through. A scanning pattern that results in some regions of a layer being scanned in excess results in an error in exposure in those regions. This error in exposure can result in an error in cure depth. This may occur when an SLA uses cross-hatching traces of UV light to cure a layer of object 30. Fine detail requires short depth of penetration so that errors in exposure will cause only a small variation in depth of cure. Exposure is determined by controlling laser power (actually by controlling intensity (I) per area) and drawing speed (time t per area). Present commercial SLAs control exposure to within about 10% or better. Trace intersections are subject to double the exposure of other portions of the traces. As discussed above, a doubling of exposure results in depth of cure being increased by (ln 2)·Dp. Thus, if the depth of penetration is greater, so is the depth of print-through in a proportionate amount. The user's tolerance for print-through varies depending on the part being made.

The user's tolerance for this overcuring also varies from layer to layer and from portion to portion of a layer. If an intersection is above a point intended to be cured, then some overcuring can be good, to help attach the present layer to the layer below. If, on the other hand, an intersection is above a downward facing surface, overcuring may stick out beyond the desired downfacing feature.

Increased depth of penetration increases the error in curing depth from a given error in exposure (power or scanning speed). In other words, to keep print-through error within desired limits, a smaller depth of penetration must be used. For example, to build primarily with 10 mil (0.010") layers, then a practical depth of cure may be 14 mils ±1.5 mils. If depth of penetration is 3 mils (30% of layer depth), then an increase in exposure of $e^{\frac{1}{2}}=1.65$ times the intended exposure will increase the depth of cure by 1.5 mils. It is reasonably easy to control exposure to within a change of 65% and thus control cure depth within these limits. If instead a depth of penetration of 6 mils is used, then to cause the same 1.5 mil extra depth requires merely $e^{\frac{1}{4}}=1.28$ times increase in exposure, giving a proportionately harder control task. A depth of penetration of 6 mils here requires exposure to be controlled within 28% error instead of 65% to keep depth of cure error down to 1.5 mils.

Overcure is mainly a problem on a surface which faces downward relative to the orientation of the part as it is being built. Control system 28 may determine which portions of which layers are subject to problem overcuring and thereby implement a smaller depth of penetration. Alternatively, the user can manually select a proper depth of penetration.

Strength is another factor which limits depth of penetration. In FIG. 5, region 84 has received and absorbed several times the radiation as region 88 and it is therefore much more cohesive (strong) by the time region 88 has gelled because region 84 is several DP higher than region 88. If the depth of penetration Dp were much larger and surface 23 was less than one DP above level 80, then region 84 wouldn't be much more cohesive than region 88. However, the "green" strength of a partially cured part is related to the extent of polymerization of each volume element. The green strength can be viewed as the sum of strength from each volume element. Therefore, the more polymerization the higher the green strength. Greater green strength is especially important for portions of a part which are not fully supported by other portions from below. When the top of a layer of a cantilever portion is stronger (more cohesive) it can provide greater ability to resist distortion. In a preferred embodiment, control system 28 determines how strong the top of each layer in an unsupported region must be in order to resist distortion due to gravity sagging or curl, and adjusts the depth of penetration accordingly. When it comes to resisting distortion related to curl, gravity sagging, dragging through the resin, it is probably better to weight the green strength by the distance between the point of bending (bottom or top surface) in combination with a strength factor associated with each volume element located at the separation distance, as the resistance to a bending moment.

Cantilevered portions of part 30 are additionally supported, if necessary, by supports or by an inert substance. The user or control system 28 determines the necessity of this by taking into account the resistance to bending (cantilever strength), the expected bending moments, and expected curl. Cantilever strength varies with the cube of the layer thickness. As discussed above, the layer thickness and the expected curl vary with the depth of penetration Dp. Supports can be a waffle-grid of material which is cured but which must be removed later from the part since they aren't actually part of the part 30. Such supports are removed by cutting or sanding. Supports are discussed in co-pending application Nos. 331,644 and 182,801. An inert material made to flow around part 30 supports otherwise unsupported portions of part 30. A preferred such material is hot melt glue or possibly wax. The chosen inert material, which is melted and then solidified appropriately to support the necessary regions is generally not curable by UV light. A dispensing apparatus can be supplied to appropriately (quantity and location) place the inert material.

Different wavelengths of light generally have different values for Dp due to having different absorption characteristics in a given photopolymer. Generally different materials used as photopolymer 22 have different values for depth of penetration Dp.

IV. A First Preferred Embodiment

The first preferred embodiment of the present invention is an SLA with a light source capable of producing light of different wavelengths. This light source may actually consist of several different sources each producing one or more wavelengths of stimulating radiation. The key to this embodiment is that different wavelengths of stimulating radiation generally produce different values of depth of penetration Dp in a given photopolymer 22. This embodiment can be conceptually divided into two primary approaches. The first approach uses two or more wavelengths simultaneously to solidify the resin. The second approach uses two or more wavelengths of stimulating radiation where only one wavelength is used at any one time in the solidification process, and with each wavelength having a different penetration depth into the particular resin being used. FIG. 13 is a graph plotting the percentage of incident light absorbed in a given depth of an imaginary photoinitiator against wavelength in nanometers (nm). A photopolymer generally consists of primarily various monomers, along with photoinitiator, and maybe other various components. These other various components include photoabsorbers, inhibitors, fillers, etc. In many photopolymers the primary absorbing element is the photoinitiator. For illustrative purposes this Specification is based on the consideration that the photoinitiator is the primary absorbing element in the resin (the analysis is similar if other elements contribute to the absorption). The photoinitiator is a reactive element that can initiate a polymerization reaction upon absorption of stimulating radiation. Many monomers begin absorbing radiation quite strongly below about 300 nm. For our imaginary photoinitiator of FIG. 13, only a small percentage of light is absorbed by at 290 nm. Where only a small percentage is absorbed, most of the incident light 44 is transmitted deeper into vat 21. However, many monomers will absorb strongly at this wavelength and it is absorption that produces a particular depth of penetration. Thus, radiation at a 290 nm wavelength is likely to have a small depth of penetration for photopolymer 22. FIG. 13 reveals a similar absorption characteristic for, the photoinitiator alone, at a wavelength of 360 nm, as it did at 290 nm. However, since the monomers will likely not absorb strongly, and we are ignoring the presence of additional components, the photopolymer, as a whole, will likely have a large depth of penetration. At 325 nm, however, a large percentage of incident light 44 is absorbed by the photoinitiator. This indicates a short depth of penetration. Depth of penetration varies continuously and dramatically between the 290 nm and 360 nm wavelength in this example.

The lasers that have generally been commercially used in stereolithography are Helium-Cadmium lasers which produce a single wavelength or "line" at 325 nm. However, the present embodiment preferably employs an Argon ion laser which can lase at one wavelength or at several wavelengths simultaneously. The Argon ion laser can produce more power (greater intensity) than the previously used lasers. If operating in the multiple wavelength mode the power is distributed among the several lines. While operating in this mode the laser has greater total output than when it operates in any of its single wavelength modes; therefore, it conserves power to use all lines for polymerization.

Figure 14:
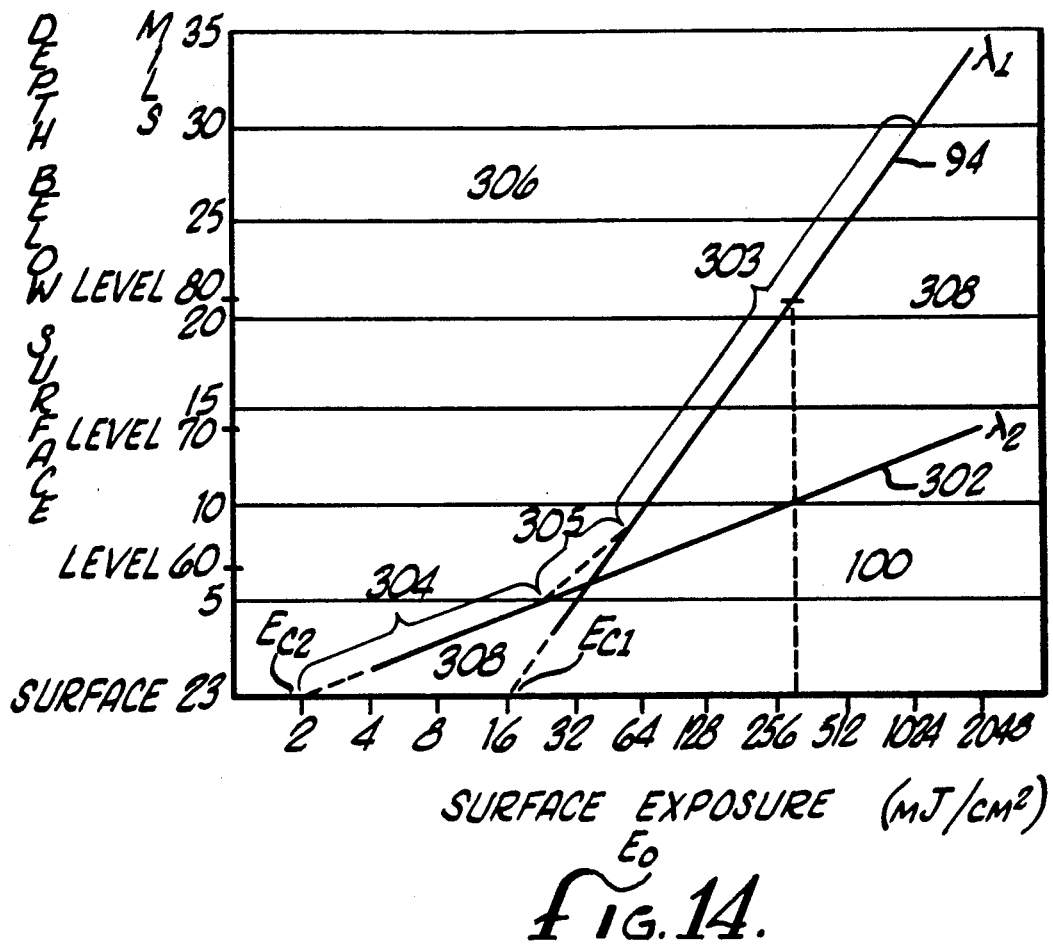
FIG. 14 is a working curve for each of two wavelengths in a given photopolymer.

FIG. 14 shows a working curve for each of two wavelengths which have different absorptions/penetration depths and different critical exposures. The working curve 94 for $\lambda_1$ (which may be 360 nm, for example) is steeper than working curve 302 for $\lambda_2$ (which is 325 nm, for example). This indicates that a smaller percentage of $\lambda_1$ is absorbed at each level of photopolymer 22 than at $\lambda_2$. In other words, $\lambda_1$ has a larger depth of penetration since more is transmitted, than for $\lambda_2$.

When both wavelengths are present simultaneously, generally the effective working curve is the deepest part of either working curve 94 or working curve 302 for each level of surface exposure $E_o$: that is, part 303 of working curve 94 and part 304 of working curve 302. However, when the cure depths, or other cure related parameters, from each wavelength are nearly equal, the resulting cure depth will be based on a superposition of the two exposures and therefore will be somewhat larger. This can be understood by considering that the difference between gel and liquid is based on different extents of polymerization. The portion of the plot above either of the working curves doesn't indicate that no polymerization has occurred, it only indicates that insufficient polymerization has occurred to form a gel. Therefore when two or more wavelengths are being used and the cure depth from each is nearly the same, there is likely to be sufficient polymerization induced to cause gelling beyond the depth produced by the wavelengths individually. This is especially true if the cure depth from the higher penetration depth wavelength is the shallower of the two. This is represented by the dashed line in region 305. As this graph indicates, $\lambda_1$ (with less absorption and greater depth of penetration) dominates over $\lambda_2$ in determining the depth of cure after region 305. All points to the left of both working curves, in region 306, represent uncured liquid. All points to the right of either curve, in region 308 or region 100, represent solidified material. The levels along the depth axis in FIG. 14 refer to the levels shown in FIG. 5. The above description is based on equal intensities and therefore equal exposures in a given time period. If the intensities of the two beams are different the cure depth induced by each wavelength cannot be read off the same vertical line of the curve. Since the two wavelengths are considered to be operating simultaneously the time of exposure is the same but if the intensities are different the exposures will also be different. The cure depth for each line must be read from the curve at the effective exposure given by that line. As an example demonstrating these points we refer to the table below. This table shows how various relative intensities can effect cure depth with regard to the working curves of FIG. 14:

| Wavelength | Relative Intensity | Cure Depth 2 | Wavelength | Relative Intensity | Cure Depth 1 |
|---|---|---|---|---|---|
| $\lambda_2$ | 100% | any | $\lambda_1$ | 0% | 0 |
| $\lambda_2$ | 80% | 5 | $\lambda_1$ | 20% | 0 |
| $\lambda_2$ | 80% | 10 | $\lambda_1$ | 20% | 7 |
| $\lambda_2$ | 80% | 15 | $\lambda_1$ | 20% | 25 |
| $\lambda_2$ | 50% | 5 | $\lambda_1$ | 50% | 2.5? |
| $\lambda_2$ | 50% | 10 | $\lambda_1$ | 50% | 21 |
| $\lambda_2$ | 50% | 15 | $\lambda_1$ | 50% | >>35 |
| $\lambda_2$ | 20% | 5 | $\lambda_1$ | 80% | 11 |
| $\lambda_2$ | 20% | 10 | $\lambda_1$ | 80% | 30 |
| $\lambda_2$ | 20% | 15 | $\lambda_1$ | 80% | >>>35 |
| $\lambda_2$ | 0% | 0 | $\lambda_1$ | 100% | any |

This table brings out four important points regarding cure depth: 1) it depends on wavelength(s) used; 2) if multiple wavelengths are used, it depends on ratios in intensity; 3) it depends on the critical energy for each wavelength; and 4) it depends on the desired cure depth. This table doesn't show the net cure depth obtained from the combined exposure. As described earlier where the cure depths become close it is the combination that yields the net cure depth.

Figure 15:
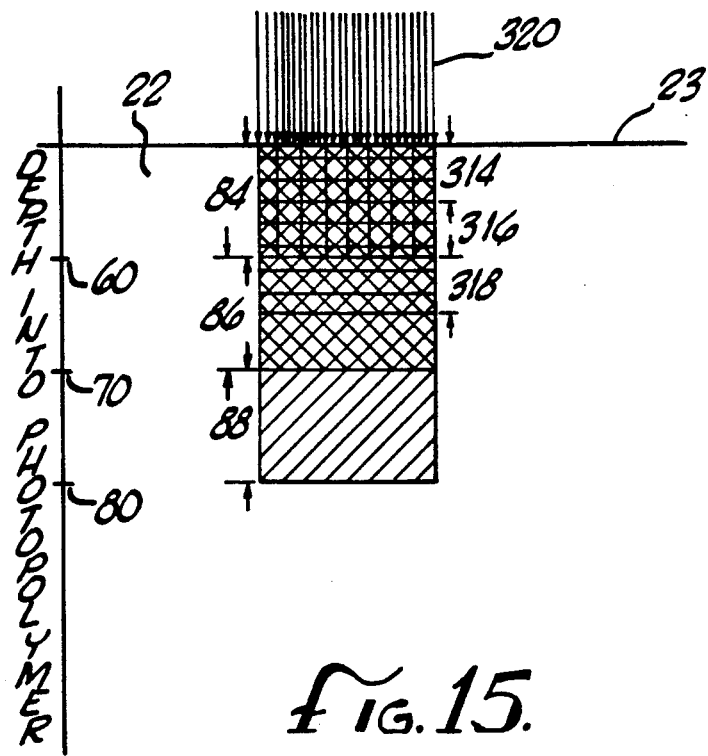
FIG. 15 is a cross section of photopolymers cured at two different penetration depths.

FIG. 15 shows a cross-section of photopolymer 22 at the same time as FIG. 5, but in an application having two wavelengths, $\lambda_1$ and $\lambda_2$, each with different penetration depths and each with the same power/intensity and therefore each yielding the same exposure in a given time period. Light 320, rather than light 44 of FIG. 5, is incident on surface 23. Light 320 is produced by a laser which provides both $\lambda_1$ and $\lambda_2$ of equal intensity. As discussed with regard to FIG. 14, $\lambda_1$ is expected to dominate the depth of cure, which is the envelope of points on the border between liquid and non-liquid. The strength of part 30 in region 84 and part of region 86 is greatly increased by polymerization due to $\lambda_2$, which cures down midway through region 86. This affected area can be viewed in three regions: region 314, region 316, and region 318. Region 318 is deepest and least cured of the three, but is still much more cohesive than the material solidified by $\lambda_1$ in this region. This is because region 318 has absorbed much more of light 320 per unit volume. Region 316 is the next closest to surface 23, and so is even stronger than region 316. Region 314 has absorbed more of light 320 per unit volume than any other region, and so is by far the strongest.

If FIG. 15 represents one layer of part 30, this layer is extremely strong near surface 23 (region 314, region 316, and region 318) due to combination of $\lambda_1$ and $\lambda_2$ (primarily due to $\lambda_2$), but relatively weak throughout most of the rest of the layer down to level 80. Without $\lambda_2$ and its associated short depth of penetration, there would be no extremely strong regions at this time. Without $\lambda_1$ and its associated long depth of penetration, the layer would only be cured very close to surface 48 at this time and would take an impractically long time to cure down to desired level 80. Therefore, one can see that each wavelength and associated penetration depth brings with it some useful properties.

This first preferred embodiment, as reflected in its two primary approaches takes advantage of this duality (multiplicity) of penetration depth by allowing for it and utilizing short penetration depths to form strong or extremely strong relatively shallow regions near the surface which provide extra green strength, while longer penetration depths are used to form relatively weak regions of greater depth in but formed in shorter time than it would take using the shorter penetration depth radiation (less polymerization, but still cohesive, so less time to form).

In the example of FIG. 14 and FIG. 15, $\lambda_1$ and $\lambda_2$ are treated separately to determine depth of cure. This was acceptable due to the combination of a couple of factors:
1) $\lambda_1$ has a much greater depth of penetration than $\lambda_2$,
2) the relative intensities are the same, and
3) the overall exposure given is much greater than the critical exposure for either.

However, this is not always feasible. A different photopolymer may have similar penetration depths for the two wavelengths used, the relative intensities may be mismatched, or the exposure necessary to obtain a desired cure depth might not be much greater than the critical exposure of both; therefore, one may not be able to determine net cure depth by considering the wavelengths separately. As discussed earlier, if a given photopolymer has similar penetration depths and intensities for two or more wavelengths, their cumulative effect will probably need to be considered to determine depth of cure. This can be allowed for as follows.

"Banjo-tops" can be used to empirically obtain the depth of cure for single wavelengths or cumulative depth of cure for multiple wavelengths lasing simultaneously. A banjo-top is a series of "strings" cured to different depths by different exposures. The control system 28 has a pre-programmed process for creating a banjo-top.

Figure 16A:
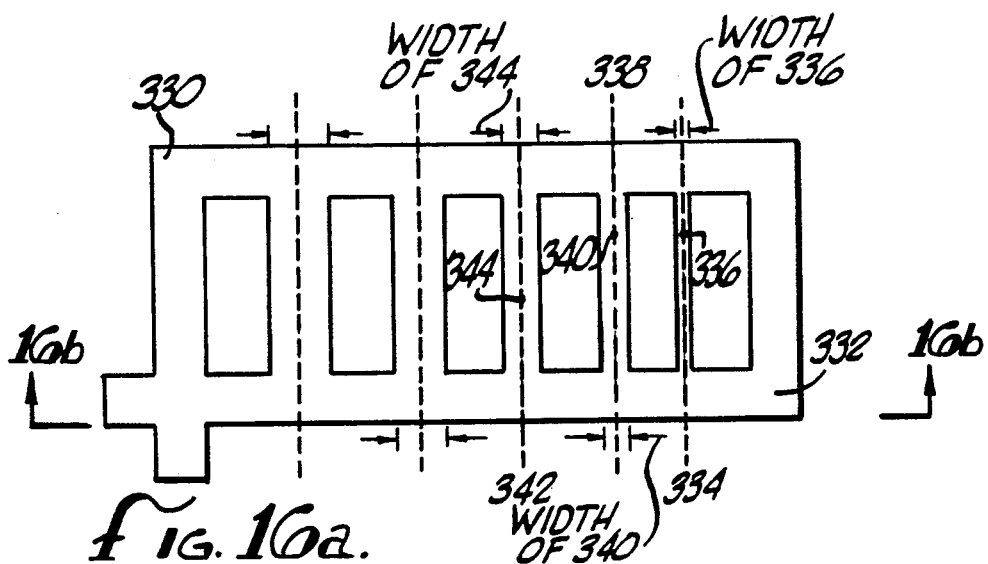
FIG. 16a shows a "banjo-top".

FIG. 16a shows banjo-top 330 from the top. First, a banjo frame 332 is created by deeply curing a rectangular outline on surface 23. FIG. 16a has a perspective of looking down in the direction of light 320 shown in FIG. 15.

Second, a path 334 is traversed with very low surface exposure $E_o$ with light 320 so that string 336 becomes cohesive across frame 332. Multiple strings are made in order to create a working curve as depicted in FIG. 6 or FIG. 14. Path 338 is traversed with slightly greater exposure, e.g., $2E_o$, which creates string 340 slightly wider and deeper than string 336. Path 342 is traversed with still greater exposure, e.g., $4E_o$, which creates string 344 slightly wider and deeper than string 340. Two additional paths and cured strips of plastic formed from higher exposures are shown but not numbered.

Figure 16B:
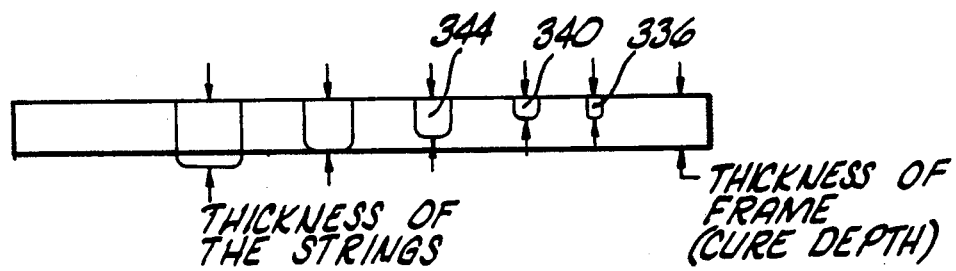
FIG. 16b shows a side view of a banjo-top.

Finally, FIG. 16b shows that banjo-top 330 as removed from photopolymer 22 and considered in silhouette in the direction indicated by lines 16b—16b in FIG. 16a. String 336, string 340, and string 344 and the two unnumbered strings are visible and accessible and thus measurable in silhouette through the end of frame 332 when transparent material is used to form frame 332. Alternatively, depth d can be measured with calipers, micrometers, measuring microscopes, etc., or alternatively banjo-top 330 can also be cut open to obtain easier access to the strings if necessary. From the depth, d, of the strings created from known surface exposures one can obtain the depth of penetration and the critical exposure Ec by solving the equation $E_c = E_o/e^{d/Dp}$, simultaneously for at least two strings. An implicit way of solving the equations for the strings is to form a working curve by plotting cure depth, d, against the logarithm of surface exposure $E_o$. We choose to plot depth against the logarithm of exposure since our theory (Beer's Law) predicts a linear increase in d with a logarithmic increase in E. This working curve takes the form: cure depth $= d = Pd \cdot Ln(E)_o -$ constant, where the slope is the depth of penetration and the constant is the depth of penetration times the natural logarithm of $E_c$.

The above description of a banjo-top has been given in such a way as to illustrate a couple of key features. Similarly, FIGS. 2, 3, 4, 5, and 15 have been created in such a way as to bring out certain features. Each of these items has assumed the use of a beam of light of uniform intensity. That is the power per unit area across the beam was considered to be constant. However, real beams used in the practice of stereolithography do not generally have such a uniform distribution of power. Within the radius of the beam there will be variations in intensity. These variations generally produce traces (strings) of polymerized material of nonuniform cure depth and width. Generally the center line of a string of solidified plastic is thicker than the edges and the width of the string of plastic decreases from the upper surface to the point of maximum cure depth. In other words, in order to predict the cure depth of a string of plastic one must base the prediction on the maximum exposure (maximum summed intensity multiplied by time if the beam is being scanned) not the average exposure.

After or during formation of a part 30, the light source 26 may change intensity. Thus, before forming each new part, or before each session of forming new parts, the intensity (power per unit area) is checked. Actually, since the beam will be used to expose photopolymer while it scans, one really wants to know the maximum intensity summed along the scanning axis. This checking is accomplished with a beam profiler in combination with a material data file that contains banjo-top information along with the beam power when it was made, as discussed in co-pending application Ser. No. 07/331,644, filed Mar. 31, 1989. A laser will generally lose power and intensity over its life. In single wavelength SLAs this can generally be accounted for by creating banjo-tops and by using a beam profiler whenever the power or intensity may have changed significantly. The same technique may be used in a multiline SLA if the power loss is proportionately the same for each line. If the power change is not proportionate then one may be forced to make banjo-top-type test parts more often.

Since power loss may not be the same for each wavelength, the wavelengths must be profiled individually, that is if one wants to be able to predict cure depth and other cure properties. The preferred system for measuring the intensity of each wavelength is to filter out all but one line at a time. This can be done by having movable filters in the beam path between the radiation source and the scanning mirrors, for example. Another way is to employ one or more beam profilers with multiple photosensors, which have different narrow-band pass filters on each photosensor corresponding to each individual wavelength. If the necessary resin parameters are known, then once the intensity profile for each wavelength is made, it is possible to determine a variety of cure parameters for each wavelength. Once these cure parameters are computed, it is further possible to decide what wavelengths and associated intensities should participate in the curing process. The control over which wavelengths will be used and their relative intensities can be accomplished in an automated manner by a variety of approaches. One possible approach is by using a variety of filters to intercept the beam and therefore attenuate the power associated with particular wavelengths. Furthermore, the attenuation achieved by these filters can be varied by designing them with different opacities, depending on how far they are inserted into the beam path. Or circular filters can be used that range from substantially zero attenuation to very high attenuation for the wavelength considered depending on the angular orientation of the filter. As an additional example, another approach would be to use separate controllable sources for each wavelength and merging the various beams together. These approaches can be directly controlled by control system 28 with or without operator assistance. On the other hand if the resin parameters are not known then it becomes necessary to make banjo-tops or other similar parts, as well as possibly performing other experiments to determine additional resin characteristics.

Banjo-top measuring can be automated. For example, a robot can pick up the banjo-top from where it was formed then spray on solvent or immerse it in solvent to rinse off residual resin, then possibly even post cure it, and then proceed to measure its various thicknesses by mechanical, electrical or optical means. This, however, is a complex process. A more preferable approach is to use the beam profile information in combination with predetermined resin characteristics in order to make all necessary predictions. This is an object of the present invention.

Within the first primary approach (simultaneous use of multiple wavelengths) of this first embodiment there are several preferred methods: 1) Balanced resin with-/and without balanced efficiencies, 2) No control of radiation but full use of predictive powers, and 3) Control of radiation source.

The first preferred method of the first primary embodiment allows the use of simultaneous multiple wavelengths with the simplicity of the single wavelength approach.

An alternative to separately measuring the power of each wavelength, in order to account for intensities of the various wavelengths, is to carefully choose a photopolymer. For example, if a photopolymer has the same depth of penetration (and critical exposure and efficiency of polymer formation) for each wavelength being used, then changes in relative power (summed intensity) of different wavelengths does not effect cure properties. This alternative embodiment does not provide an extra strong region near the surface and a weaker (fast) region regions below, but it does take advantage of the full power of a laser at more than one wavelength and it also obviates the need to measure differential power loss in a multiline radiation source.

One way to achieve the same depth of penetration for each wavelength is to choose a photopolymer that has substantially the same absorption for all wavelengths of interest. For example, in FIG. 13, if a laser lases at 290 nm and 360 nm, then the photoinitiator graphed has the same absorption for both wavelengths. Thus, both wavelengths are expected to have the same depth of penetration into the photoinitiator and into the photopolymer (if we disregard absorption by the monomer and other components). Similarly if the source ($2b$) produces radiation of wavelengths A and B as indicated we would expect both to have the same penetration depth.

Figure 17:
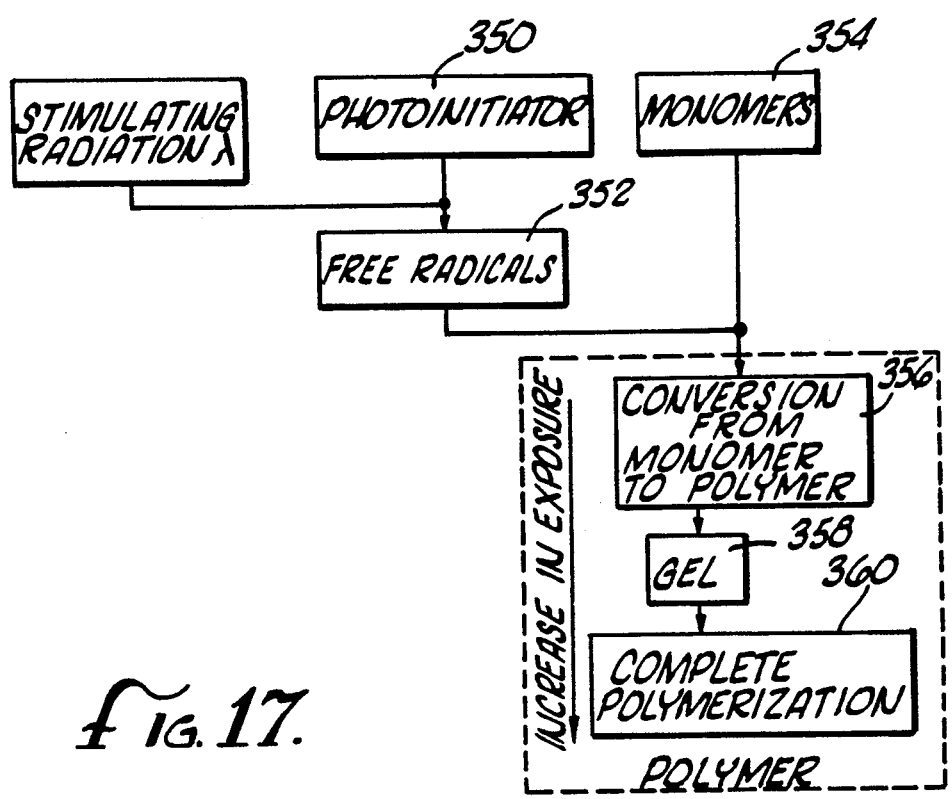
FIG. 17 is a block diagram of the chemical reaction in an SLA.

FIG. 17 is a block diagram of a typical chemical reaction in an SLA. The liquids used in commercial SLAs generally polymerize in response to UV light due to the presence of a UV responsive photoinitiator. Photoinitiator 350 breaks into free radicals 352 in response to UV light exposure. Free radicals 352 induce a chemical reaction between monomer molecules 354 beginning their conversion to polymer 356. After still more exposure and absorption, more monomer 354 is converted to polymer 356. When sufficient density of polymer 356 is produced then gel 358 is formed. Upon further polymerization, gel 358 completely polymerizes to form plastic 360.

Figure 18:
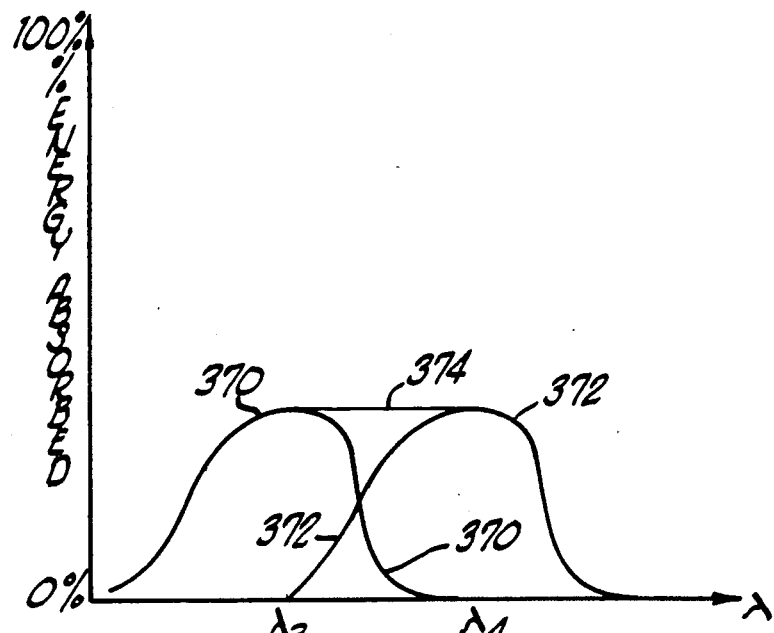
FIG. 18 is a graph of wavelengths against absorption for two photoinitiators.

FIG. 18 is a graph of absorption versus wavelength for a photopolymer having more than one type of photoinitiator, each absorbs differently and differentially according to wavelength. The amount of each type is adjusted until the depth of penetration is the same for each wavelength. The absorption characteristics of a particular photoinitiator determine the general shape of its curve in FIG. 18, but its concentration determines the amount of absorption at each wavelength and therefore the depth of penetration. More photoinitiator means greater absorption and thus a higher curve in FIG. 18. Curve 370 represents a first type of photoinitiator, which has its greatest absorption at $\lambda_3$. Curve 372 represents a second type, which has its greatest absorption at $\lambda_4$. When these two types are combined in a single resin, the cumulative effect is represented by curve 374. Curve 374 is rather flat between $\lambda_3$ and $\lambda_4$, indicating that interstitial wavelengths have similar absorption to $\lambda_3$ and $\lambda_4$. In this way a multiline laser with wavelengths between $\lambda_3$ and $\lambda_4$ can be employed in an efficient way while maintaining a single uniform depth of penetration.

A resin requires careful "tuning" to provide the same depth of penetration for each line. A commercial argon-ion laser can be set up to lase in the ultraviolet region at a variety of single wavelengths or at several wavelengths simultaneously. The primary UV lines for the argon-ion laser are at approximately 364 nm, 351 nm, and 334 nm, and others. The laser can be set to lase at all these wavelengths simultaneously with power outputs of about 40%, 40%, and 20% for the 364, the 351, and the 334/other lines respectively. The laser can also be optimally tuned to lase with other ratios of power for each wavelength. In our most preferred mode the laser is tuned to have powers of approximately 48%, 48%, and 4% of the total power of the beam for the 364, 351, and other wavelengths respectively. Because of the very low relative energy associated with the other wavelengths they do not substantially contribute to the cure parameters obtained by exposing the polymer to the radiation of this beam. In essence we have a beam that contains primarily two possible penetration depths. This beam is the preferred beam for all the multiple wavelength embodiments of this specification. Our preferred resin for the balanced resin approach to part building has a composition comprising 49 parts of an adduct of acrylic acid to a bisphenol A diglycidylether (NOVACURE® 3700), 5 parts of 2-phenoxyethylacrylate (SARTOMER® 339), 12 parts of trimethylolpropanetrimethacrylate (SARTOMER® 350), and 25 parts of a dimethyacrylate of an ethoxylated Bisphenol A (SARTOMER® 348) which is mixed with a photoinitiator combination comprising 1.50 parts of 2,4,6-trimethylbenzoyldiphenylphosphinoxide (LUCIRIN® TPO) and 2.68 parts of 1-hydroxycyclohexylphenylketone(IRGACURE 184). (Parts are parts by weight). This composition does possess the same absorption at the 351 nm wavelength and the 364 nm wavelength argon-ion laser emission [optical density $lg(I_o/I)$ of 2.6 for a layer thickness of 1 mm]. The resin composition does possess a good sensitivity for the generation of three dimensional objects by means of stereolithographic (polymerization depth of 0.3 mm generated by irradiation with an energy of 24 mJ/cm$^2$ at the two Ar-laser emissions of 351 nm and 364 nm).

As various types of photoinitiator absorb light energy, (e.g., one photon) they may cause various amounts of polymerization. The efficiency of a photoinitiator/monomer combination is related to its ability to form chemical bonds in response to absorbed photons. If two photoinitiator types have differing efficiencies, then the same amount (or percentage) of light absorbed (same depth of penetration) will result in differing cure depths. Thus, the photopolymer of this alternate embodiment must be balanced not just for depth of penetration (percentage absorption), but also for efficiency in conjunction with absorption.

Figure 19A:
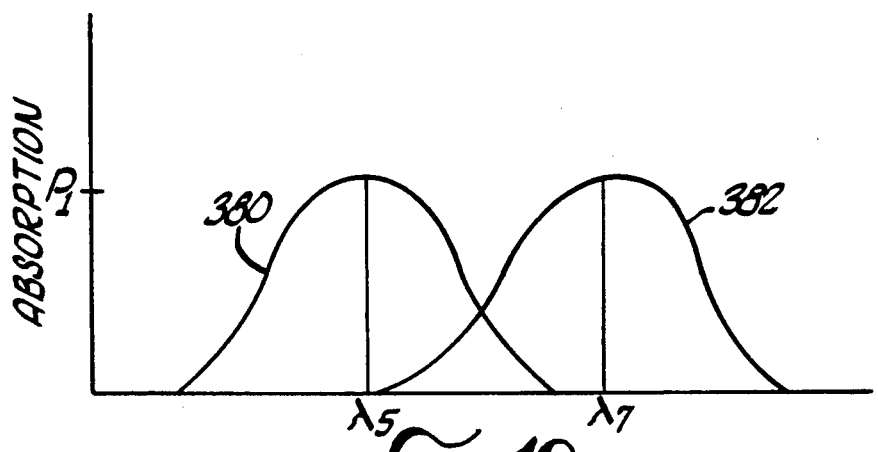
FIG. 19a through 19i depict graphs of absorption and/or efficiency versus wavelength for two different photoinitiators.

FIG. 19a is another graph of absorption versus wavelength for two more photoinitiators. FIG. 19a to 19g illustrate how efficiency is allowed for. Curve 380 represents a photoinitiator of appropriate concentration for absorbing a certain percentage of light at peak absorption wavelength $\lambda_5$. Curve 382 represents a fourth photoinitiator of appropriate concentration for absorbing that same percentage of light at peak absorption wavelength $\lambda_7$. That percentage is labelled $p_1$ in FIG. 19a. These two wavelengths ($\lambda_5$ and $\lambda_7$) have the same depth of penetration since they have the same absorption.

However, if the first photoinitiator has an efficiency greater than that of the second photoinitiator, then it will also have higher effectiveness at polymerization. In other words, $\lambda_5$ produces more polymerization than $\lambda_7$ for a given exposure and therefore a deeper cure depth. The first photoinitiator has an effectiveness shown by curve 386 of FIG. 19b, whereas the fourth photoinitiator has an effectiveness shown by curve 388 of FIG. 19b.

Figure 19B:
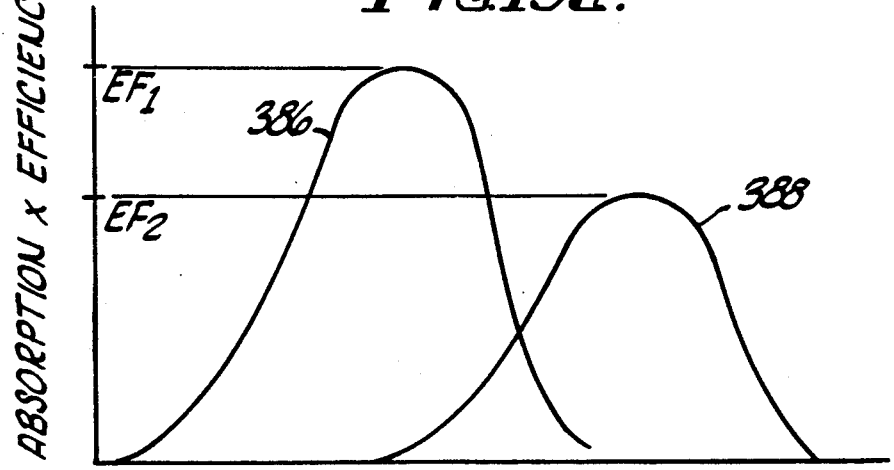
Figure 19C:
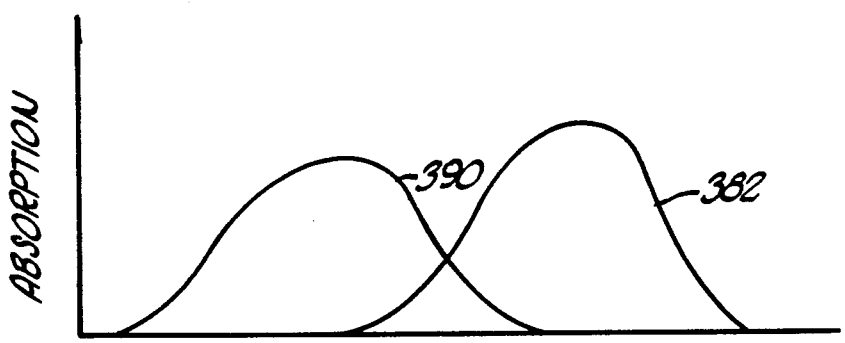
Figure 19D:
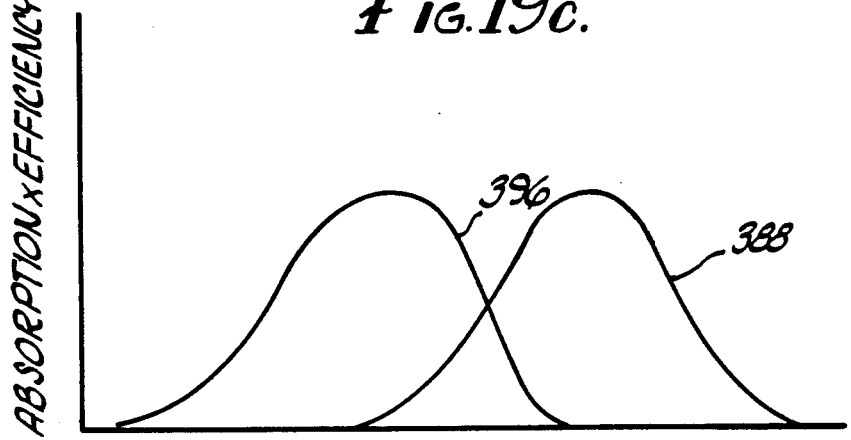
Figure 19E:
Figure 19F:
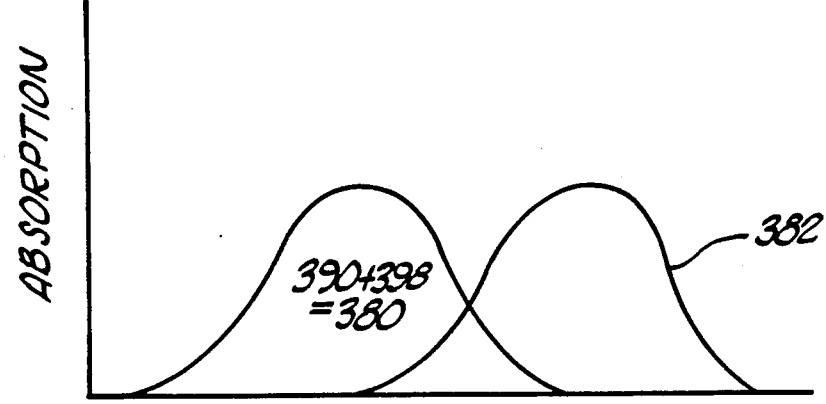
Figure 19G:
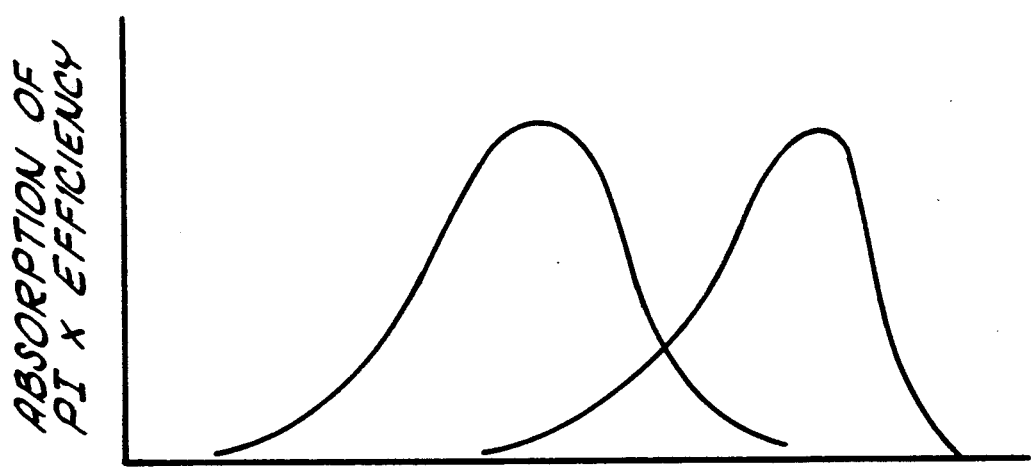
Figure 19H:
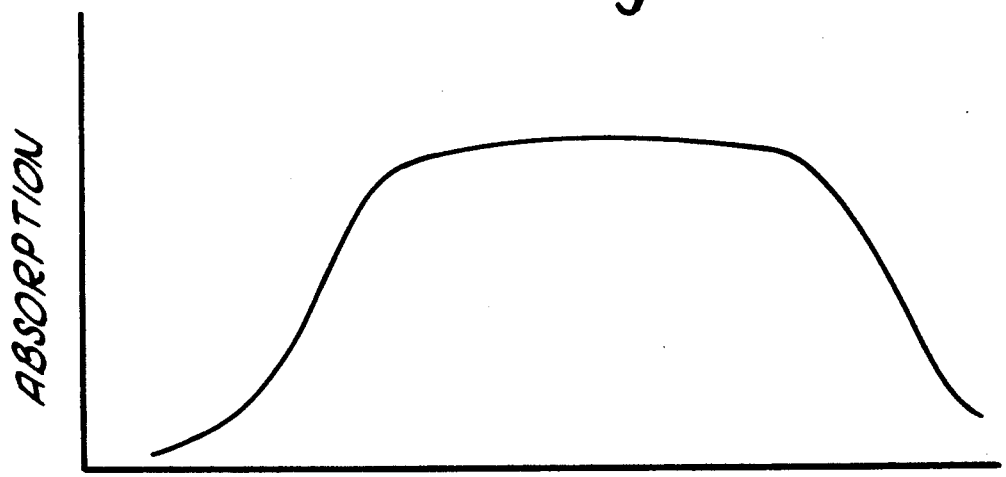
Figure 19I:
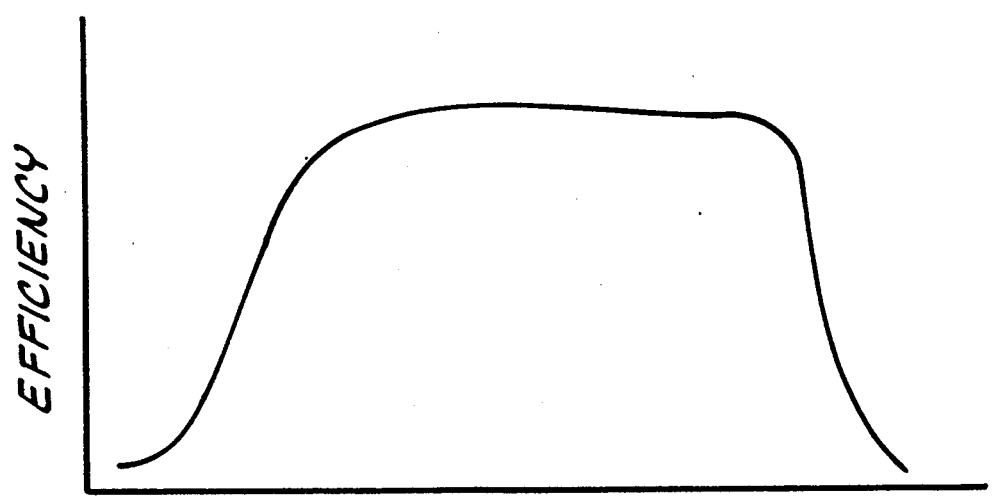

When the difference in effectiveness is considered, FIG. 19b shows that $\lambda_5$ effectively creates more polymer (shown with effectiveness EF$_2$ for a given exposure while $\lambda_7$ (shown with EF. To achieve the same depth of cure for these wavelengths, the effectiveness must be evened out as well as the absorption. This can be done by using a lower concentration of the first photoinitiator to reduce the size of curves 380 and 386 to curves 390 and 396 respectively of FIGS. 19c and 19d. But now the absorption (depth of penetration) between the two photoinitiators is unmatched. Therefore, to make these match, we must absorb some of the incident light in such a way that does not contribute to polymerization. For example, a photoabsorber may be added to the resin containing the first photoinitiator. The photoabsorber is chosen to absorb (or block) light around $\lambda_5$. Its absorbing properties are indicated by curve 398 of FIG. 19e. Curve 398 and curve 390 add up to curve 380 at least at $\lambda_5$ of FIG. 19f (same as curve 380 of FIG. 19a). The photoabsorber is added until the resin is able to absorb an equivalent percentage of incident light at $\lambda_5$ as indicated by curve 380 of FIG. 19f and 19g, now $\lambda_5$ has the same effectiveness EF$_1$, indicated on curve 396 of FIG. 19d, as does $\lambda_7$ on curve 388 of FIG. 19d, along with the same penetration depths as depicted in FIG. 19f. So now the Pd and efficiencies have been matched as indicated in FIG. 19g. The net result is a resin that can be used with any wavelengths as shown in FIG. 19h and 19i. In practice, more than two photoinitiators, photo absorbers, and other similar components may be required to achieve a desired balance but the approach to balancing would remain the same.

A similar material could be created for and used with a multiline visible laser, to produce the same efficiency and absorption for any wavelength of visible light. However, since this type of material cures in response to visible light appropriate precautions would need to be taken. Such precautions include shielding of the SLA and green parts from stimulating visible radiation or removing such radiation from viewing lights.

The second preferred method of the first primary approach is the use of predictive powers to assist part building while using simultaneous multiple wavelengths. This approach utilizes beam profile characteristics associated with each wavelength along with known resin parameters to predict various building and cure parameters. These predictions/determinations are used for primarily three purposes 1) determine if the desired object can be built using the multiple wavelength radiation source that is available, and 2) determine what building parameters should be initially used, and updated as necessary. The types of predictions possible include: cure depth, cure width, green strength, and many others. For this approach one of the most important predictive parameters is that of green strength. Since this approach uses multiple wavelengths and the intensities for these wavelengths are not controlled, it is possible to get a wide range of green strengths for a particular volume of plastic depending on the exact wavelengths and penetration depths involved; therefore, prediction of green strength is very important in determining which building parameters are best suited to insure successful building of a part. For example, it may be found that due to a certain energy/wavelength combination, that it is virtually impossible to build a part with 5 mil layers because of lack of green strength, but on the other hand for another energy/wavelength combination, green strength might be adequate for 5 mil layers and it is found that 20 mils layers would be difficult to create because of the small penetration depth of the dominating wavelength. The predictive methods of this approach followed by the determination of best building parameters can be carried over to the other embodiments as an enhancement; however, in this method we limit ourselves to the predictive and determinative abilities as a minimum approach to automated use of multiple wavelengths.

The third preferred method of the first primary approach may or may not include all aspects of the second method but it includes the ability to control the radiation source(s) to get specific wavelengths and intensities or least intensity ratios from each wavelength. Due to the power gained by the combination of controlled amounts of radiation for each wavelength, the various penetration depths available, and the predictive and determinative capabilities available in this method, this method is the preferred embodiment of the simultaneous use of multiple wavelengths.

The third method of the first primary approach takes advantage of the multiplicity of penetration depths by allowing for it and utilizing short penetration depth create strong or extremely strong regions of cure, generally kept near the surface, to provide extra green strength, while the longer penetration depths are used to form relatively weak regions of generally greater depth in the same period of time. The green part 30 is stronger than it would have been if it had been formed with only one wavelength and its associated depth of penetration in a given liquid. Using one wavelength for shallow hardening and another wavelength for deep gelling decreases the time required to form a part that is sturdy enough to withstand the completion of its formation and its post-curing. This is beneficial because polymerization is faster and cheaper in a post-curing apparatus than in an SLA. It is faster because the whole part is bathed in general UV-lighting instead of by polymerizing one cross-section at a time. It is cheaper because the preferred light source is a cheap fluorescent bulb instead of an expensive UV laser.

The third method also reduces curling as discussed in the Background of the Invention. There are at least two reasons for this. First, greater green strength permits stronger regions to resist the bending moments associated with curl. Second, the weaker regions take up the stress caused by shrinking during curing while the harder regions maintain shape. The weaker regions act as stress reliefs which are able to provide adequate adhesion while limiting transmission of internal stress. These internal stresses, if allowed to reach particular levels, could induce distortion.

Depending on the ratios of energies of the two or more wavelengths used, the part characteristics can be controlled ranging from producing very weak parts quickly to producing very strong parts very slowly. This range of produced characteristics, using variable intensity ratios, can be varied from one part of a layer to another part, it can be varied for different layer thicknesses, or it can be varied depending on whether strength or speed is of primary importance in the particular region being drawn, etc. This approach has many advantages which will be appreciated by those skilled in the art.

A particular implementation of this method can be understood by studying FIG. 14. If we use the two wavelengths of FIG. 14 and we have equal intensities and powers for both, we see that these wavelengths can be used to cure very thin layers with a combined effective small penetration depth of approximately 2 mils for layer thicknesses under approximately 4 or 5 mils. Below $E_{cl}$, $\lambda_1$ is not active in producing much polymerization. On the other hand when we want large cure depths (therefore thick layers), A–D its associated penetration depth dominate the cure depth thereby producing desired thicknesses in a more timely manner. We also notice in this situation $\lambda_2$ is still actively producing regions of much stronger solidified material, thereby increasing green strength. One recalls from prior disclosure in this application, that for thin layers we want small penetration depths, which yield good strength for thin layers and only small print through problems resulting from errors in exposure. Whereas, for large layer thicknesses we want a higher penetration depth in order to achieve a reasonable cure time. Our strength is still adequate even though we are using a higher Pds since there is a greater quantity of material solidified. We note, that since the critical exposure for the wavelength with the smaller penetration depth is smaller than the critical exposure for the wavelength with the higher penetration depth, that we have a situation (or at least the potential for one) where we automatically obtain the proper relationship between penetration depth and layer thickness. This leads automatically to errors in exposure causing changes in cure depth that are more proportional to the layer thickness. This same method of optimizing the proportionally of error in cure depth to layer thickness can be extended to 3 or more wavelengths as long as the critical exposure and penetration depth follow the same pattern.

The above described preferred approach employs multiple lines simultaneously. In a second primary approach multiple lines are employed singly.

This alternate embodiment operates on the same principles discussed above, that is different lines have different penetration depths. Light of different wavelengths may be selectively applied to photopolymer 22 in several ways: 1) wavelengths are selectively obtained by filtering or other methods from a multiline laser, 2) multiple laser beams, each with a different wavelength, are separately reflected onto surface 23 by a rotatable mirror, 3) a single line laser is used by switching wavelengths by changing the angle of a prism refractor within the lasing cavity of the laser or other such methods yield have selectable wavelengths, 4) other multiline radiation sources or combinations of single line sources are employed appropriately.

Firstly, a multiline laser is employed as in the preferred embodiment described above but with the addition of filters. These filters screen out predetermined lines leaving one or more selected lines. Preferably, there are multiple filters, each one screening a single line. The filters are mechanically moved in and out of the laser beam path by control system 28, in response to exposure commands. Alternatively, the filters are stationary and the multiline laser beam is selectively reflected through one or more filters using movable mirrors. Such a filter system is useful in conjunction with simultaneous multi-line curing as well for measuring differential power change. One line at a time is directed to a beam profiler to measure intensity at each wavelength.

Secondly, multiple lasers are used to provide multiple lines. To select a line, a mirror is moved from a position of reflecting light source 26 to a position of reflecting another nearby light source having a different wavelength. The mirror reflects the selected line to surface 23.

Thirdly, laser light 44 is selectively altered to have selected wavelengths.

The primary advantage of selecting lines is that depth of penetration may be selected. This provides many advantages as described in this section as well as in the previous earlier section entitled "Depth of Penetration."

Selecting lines is a very efficient way of selecting depth of penetration. It can easily be done manually or by control system 28. The above three exemplary ways to select wavelengths are each implemented very quickly and without much disruption. If the beam is shifted slightly by its need to pass through a filter, or by imperfect alignment as beams from different lasers or other sources are shifted into the path, any shifting or drift in the position of the spot at the liquid surface can be compensated for by the techniques of drift correction as described in U.S. patent application Ser. No. 268,907, filed Nov. 8, 1988, which is incorporated by an earlier reference into this application. This permits selecting depth of penetration from part to part, layer to layer, and portion to portion on a single layer as described in the earlier section regarding depth of penetration.

The above embodiments can be combined so that a user or control system 28 can select one or more lines. When a plurality of lines is selected to employ simultaneous multiple penetration depths the SLA can obtain advantages such as efficiency, greater green strength, and reduced curl. When a single line is selected to vary the depth of penetration, then the SLA obtains the advantages discussed above in the Depth of Penetration section, such as maximum speed and precision. When combined in a single part, all the advantages above are achieved.

Besides the various approaches described for obtaining different wavelengths singly and in addition to the methods and advantages for using multiple wavelengths singly as described in the section on penetration depth it is advantageous to note several primary uses of multiple wavelengths used singly at this time 1) different wavelengths for different layer thicknesses, 2) different wavelengths for maximized speed, 3) different wavelengths for maximized strength, 4) different wavelengths to minimize curl, and 5) different wavelength multipass. The first four of these approaches have been described earlier in this application and therefore do not require further comment here. The fifth approach however has not been disclosed as of yet so it warrants a description at this point, this fifth technique is similar to the multipass techniques described in U.S. patent application Ser. No. 339,246, filed Apr. 17, 1989. This application was incorporated by reference earlier in the instant application. This technique may actually be considered the ultimate multipass technique for curl reduction. The original multipass approach did multiple scans over each vector. But used the same wavelength for each pass. The first pass would be given an exposure that would solidify material almost to the layer thickness but would not quite reach it and therefore wouldn't cause adhesion to the layer below. The first pass was followed by one or more additional passes where at least the final pass would cause adhesion and therefore cause the cure depth to reach the final desired depth of overcure. The purpose of the first pass was two fold. First, the material was cured without it adhering to the previous layer so that it could shrink as it cured without inducing a bending moment on the previous layer. Second, the material that was cured on the first pass would act to resist the upward bending moment that the previous layer feels as the sandwiched material between is solidified. Multipass has been demonstrated to be moderately effective for minimizing curl. However the affect of multipass can be substantially increased if the strength of the material in the first pass can be greatly increased or/and if it can be brought to a higher degree of polymerization so that it will not tend to be additionally significantly cured and shrink along with the sandwiched material as further exposure is given for the purpose of causing adhesion. This greater degree of polymerization and strength can be obtained by using a low penetration depth wavelength on the first pass and by bringing the cure of the first pass (or higher pass as long as the short penetration depth radiation is being used and adhesion doesn't occur) as close to the layer thickness as possible without causing adhesion. Then on a subsequent pass or passes the wavelength is switched to that of a longer penetration depth to obtain adhesion. The speed of drawing associated with each pass can be varied, as well as the number of passes with the short Pd wavelength(s) before adhesion, and the number of passes with the longer Pd wavelength(s) that are used to cause adhesion. It is also possible that more than two wavelengths and associated penetration depth will be useful in this approach, in order to achieve a better balance of reduction in curl with required scanning time. Typically the penetration depth for forming a moderately strong layer is about 30 to 40% of the layer thickness. Probably, a penetration depth in the range approximately 15% to 25% of the layer thickness would be adequate for the short Pd exposure(s) whereas something in the range of 30% to 40% or higher would be adequate for the exposures that will cause adhesion. Because of the problem of birdnesting that can occur with the use of multipass we reference U.S. Pat. No. 5,015,424 which covers the use of smalleys to minimize birdnesting, this application was incorporated by reference earlier. We also referenced U.S. Pat. No. 4,999,143, which covers the use of webs and other supports for minimizing various distortions including birdnesting, we incorporate this patent by this reference as if fully set forth herein.

Most of the embodiments discussed in this secction have been drawn towards curing being done with a beam of radiation, and preferably with a beam of ultraviolet radiation. The beam of radiation can be that from various regions of the electromagnetic spectrum (e.g., infrared, visible, ultraviolet, and x-ray) or it can be a beam of various particles (e.g. electrons) as long as the material has a reactive element that can absorb the radiation and from that absorption induce a reaction that converts the material from its fluid or fluid-like state into a cohesive state. For many embodiments and approaches of this invention this absorption would need to be wavelength- or energy-dependent so that a multiplicity (or at least a duplicity) of penetration depths are allowed for. When a beam of radiation is used, the intensity profile of the beam is necessary for predicting various cure parameters. However, this profile dependence can be removed if a flood source of radiation of the desired cross-sectional pattern with uniform intensity is used to expose each cross section as opposed to the beam of light approach. This uniform flood of radiation can possess the same desired characteristics with respect to wavelengths, penetration depths, and relative powers as discussed previously for the beam approach. This uniform flood can come from a short arc-type mercury lamp as disclosed in the '575 patent or xenon type arc lamp or any of a variety of other sources or combination of sources. In combination with the radiation source there would be included a diffusing element to insure uniform exposure over the entire surface. Also included would be several intensity monitoring devices (one for each wavelength that will be used to cure the material) within the uniform exposure region to insure constant intensity over the entire exposure period by being part of a feedback loop that can control the energy output of the radiation source. Also included would be a variety of filters that can be inserted into the radiation path to remove various wavelengths from the beam and/or to attenuate to varying degrees the intensity associated with each wavelength. Other methods such as diffraction gratings or prisms may be used to separate desired wavelengths from undesired wavelengths. Additional elements would include one of a variety of elements to yield the desired cross-sectional pattern of irradiation.

For the sake of clarity, the following will summarize some of the particular embodiments included in this section. The preferred embodiments discussed up to this point can be divided into two categories: 1) embodiments utilizing simultaneous multiple wavelengths, and 2) embodiments utilizing non-simultaneous use of multiple wavelengths. This first category includes the following embodiments:

1) balanced resin—depth of penetration only;
2) balanced resin—penetration depths and efficiencies;
3) multiple wavelengths with no controls but with predicted characteristics (some will be discussed later);
4) multiple wavelengths with controlled characteristics;
   a) to obtain good speed and strength,
   b) to obtain minimum curl, All of these approaches utilize the beam profile predictions and controls to a greater or lesser extent. For full use of the beam profile capabilities predictions will be based on the superposition of exposures from each wavelength individually. For example, cure depth can be based on a weighted average of the depths of critical exposure but the total exposure will be derived from all wavelengths present. Alternately, cure depth can be defined in terms of percentage polymerization necessary to gel and the percentage polymerization determined from each wavelength individually. There are essentially three levels of making these predictions while using multiple wavelengths: 1) 0th order, where predictions are made for each wavelength individually then the net prediction is selected from the list (dominate prediction =net prediction), 2) 1st order, where simple assumptions are made about the extent of interactions between effects from individual wavelengths to make the net prediction, and 3) 2nd order, where detailed calculations are made regarding the extent of polymerization caused by individual wavelengths, account is made for the interactions between wavelengths, and then the results are combined to obtain the net predictions. For a given situation some predictions may be 0th order, some 1st order, and some 2nd order depending on circumstances.

The second category includes the following embodiments:

1) different wavelengths chosen for different layer thicknesses based on best overall properties;
2) different wavelengths chosen for maximized speed;
3) different wavelengths chosen for maximized strength;
4) different wavelengths chosen for minimum curl;
5) multipass techniques are used based on a first pass made by a wavelength with a small pd to get a high degree of polymerization without bonding to the previous layer followed by a second (or more) passes to cause adhesion.
6) different wavelengths chosen for dominance of any other properties.

Once chosen, individual wavelengths are attained by filters, switching the lasing wavelength of the laser, switching from one laser to another laser, and use of other types of radiation sources.

V. A Second Preferred Embodiment

A second preferred embodiment of employing Various penetration depths in an SLA involves changing photopolymer 22. Different photopolymers have different penetration depths for a given wavelength. Preferably, photopolymer 22 is replaced with a different photopolymer when a different depth of penetration is desired. Alternatively, photopolymer 22 remains in place but is treated when a different depth of penetration is desired.

Figure 20:
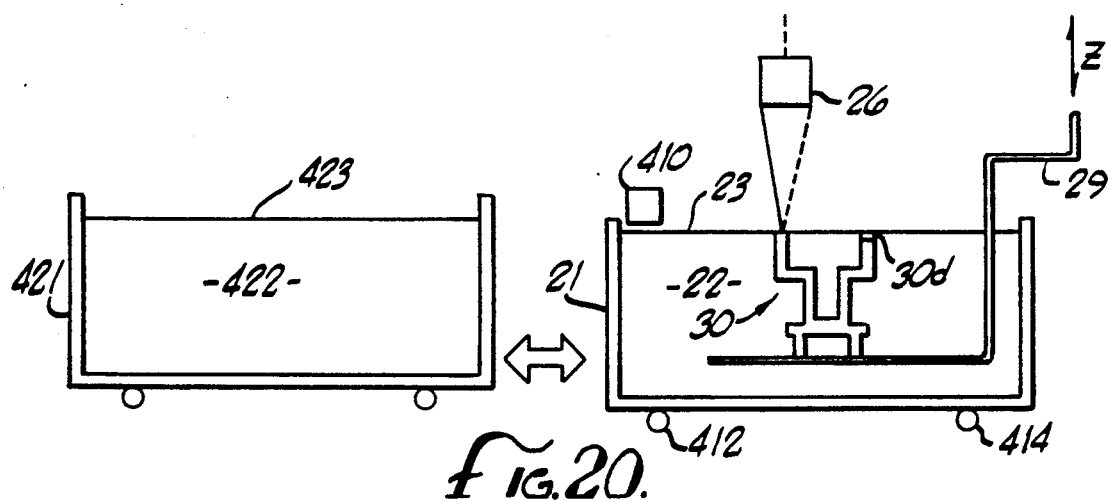
FIG. 20 is a drawing of a system for replacing photopolymer in an SLA.

FIG. 20 illustrates a second preferred embodiment wherein photopolymer 22 is replaced. As described earlier, container 21 holds photopolymer 22. Choice of depth of penetration is made by the user or by control system 28 in accordance with principles set forth in the earlier section entitled "Depth of Penetration". When a different depth of penetration is chosen, elevator 29 is lifted up in the Z direction until it is above the top of container 21.

Doctor blade 410 is used to skim photopolymer 22 down to surface 23 after overdipping part 30, as described in copending U.S. patent application Ser. No. 07/249,399 PCT patent application Ser. No. PCT/US89/04096. In prior SLAs, doctor blade 410 was attached to container 21. This hindered replacement of container 21. However, in the present invention doctor blade 410 is attached to the SLA frame to which elevator 29 is also attached. This facilitates replacement of container 21.

Container 21 remains under elevator 29 for a short period to catch drops of photopolymer 22 from elevator 29.

Optionally, part 30 can be immersed in a solvent bath to remove excess resin that clings to the part.

Container 21 has wheels 412 and 414. Container 21 is rolled away. Container 421, holding a different photopolymer 422, is rolled under elevator 29 to replace container 21. Photopolymer 422 has the chosen depth of penetration. Elevator 29 is lowered into container 421 so that the part 30 is overcoated with resin 422 and the part is located one layer thickness below level 423. Doctor blade 410 skims photopolymer 422 down to level 423.

Part 30 stays attached to elevator 29 throughout the replacement of container 21. Since layer 30d was last formed, at surface 23, a next higher layer of part 30 can be formed at surface 423 of photopolymer 422. Switching container 21 and container 421 is a quick and easy technique for replacing photopolymer 22 when a different depth of penetration is desired.

Figure 21:
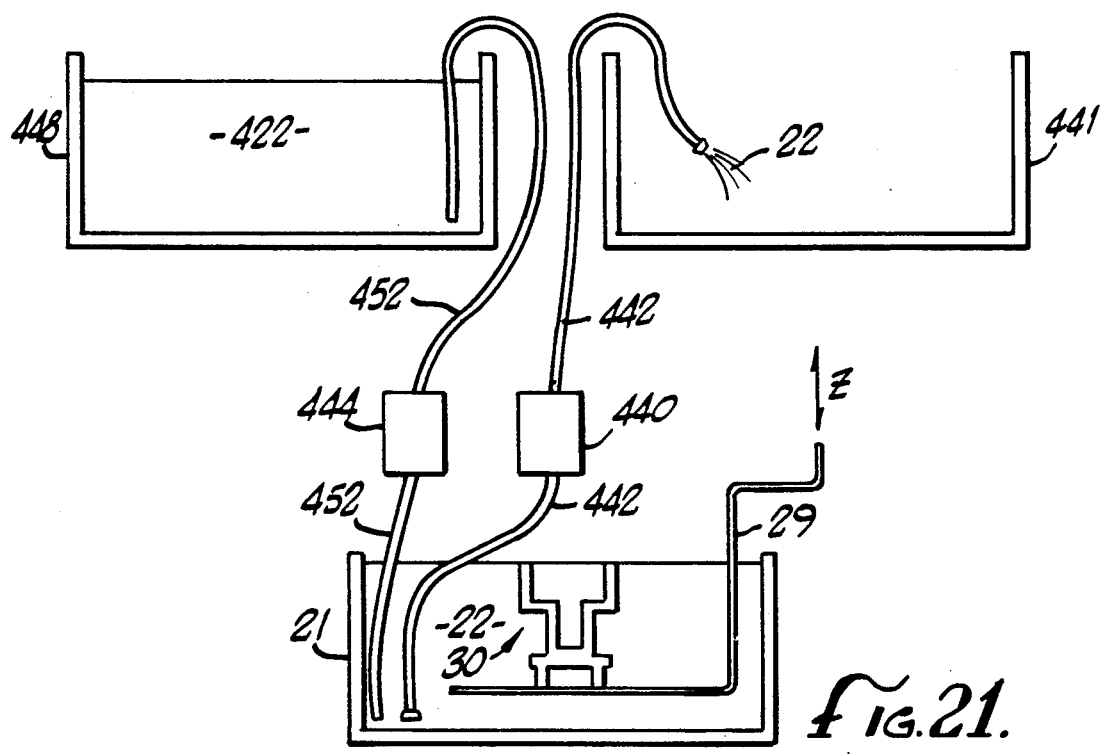
FIG. 21 is a drawing of another system for replacing photopolymer in an SLA.

FIG. 21 shows another system for replacing photopolymer 22 with different photopolymer 422. When a different depth of penetration is desired, pump 440 pumps photopolymer 22 out of container 21 and into holding tank 441 through hose 442. Then, pump 444 pumps different photopolymer 422 out of holding tank 448 and into container 21 through hose 452. This system of photopolymer replacement can easily be controlled by a computer when directed by control system 28 to achieve a different depth of penetration.

Figure 22:
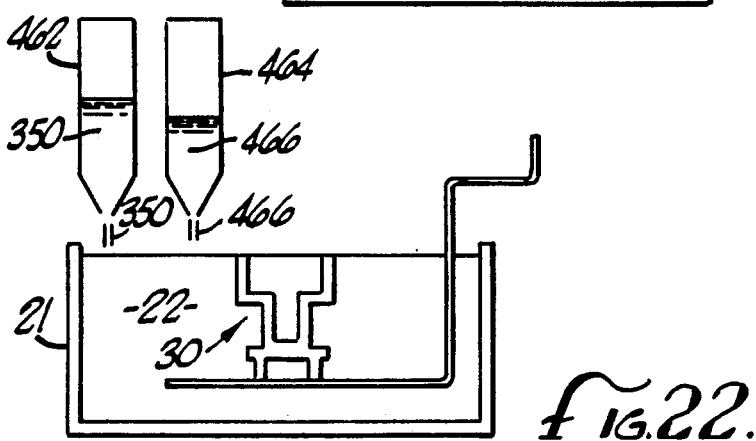
FIG. 22 is a drawing of a system for treating photopolymer in an SLA.

FIG. 22 illustrates an alternate system for changing photopolymer 22. This system treats, rather than replaces, photopolymer 22 to achieve a different depth of penetration. A given photopolymer 22 can be altered to have different values of Dp. For example, if photoinitiator is added to photopolymer 22, then more of light 44 is absorbed by each level of photopolymer 22, and the value of Dp is lessened. If a smaller depth of penetration is desired, photoinitiator supply 462 adds photoinitiator 350 to container 21. If greater depth of penetration is desired, resin supply 464 adds resin 466 to container 21 to reduce the concentration of photoinitiator 350.

The following is a summary of some of the embodiments for changing materials:
1) same as the embodiments for use of multiple wavelengths above,
2) switching resins between parts,
3) switching resins during part building,
   a) without stripping of part,
   b) with stripping of the part,
4) adding elements to the resin.
Beam profilers can be used in combination with different resin parameter files (one for each resin).

VI. Beam Profile

The primary embodiments described briefly above can be enhanced with another inventive feature of the present invention, that is by use of beam profile information in combination with resin parameters to predict cure parameters. The profile, or cross-sectional intensity, of a laser beam is not generally constant. This is still true when the beam is focused to a small spot as is done in the standard practice of stereolithography. For example, in a laser beam, the intensity may be highest in the center and become lower and lower further and further from the center. Consideration of a beam's profile enhances and/or is required for various embodiments, described previously, as well as yielding additional enhancements for these embodiments when considered in combination with various resin parameters. Additionally, the combination of beam profile information with various resin parameters is a powerful tool for automating the single wavelength approach, of previously described commercial SLAs, for building parts.

Beam profiling is disclosed in co-pending application Ser. No. 268,816 filed Nov. 8, 1988. The present application is a continuation-in-part of this referenced application. This parent application is incorporated by this reference as if fully set forth herein.

Figure 7:
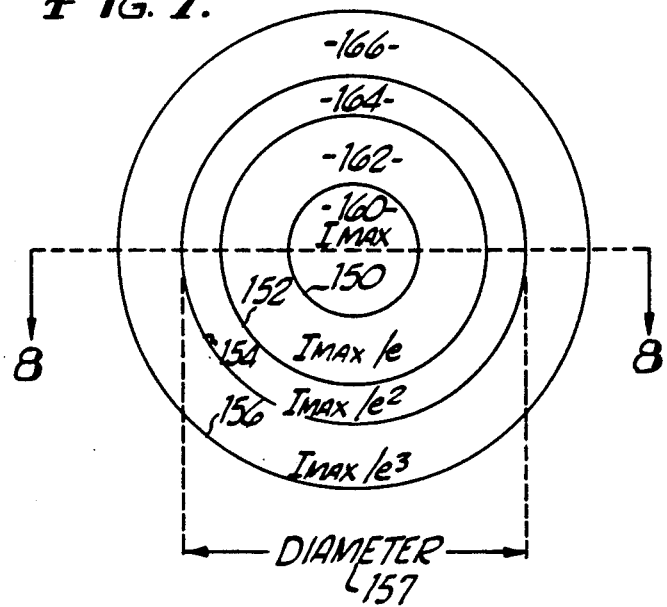
FIG. 7 is a simplified cross section, or "profile" of a commercial laser beam.

FIG. 7 represents a simple example of variations in beam intensity (beam profile) within spot 27 on surface 23 looking at a cross section of the beam of light 44. In the example, the beam power per unit area (intensity) is a function of radial distance from the beam center. Center 150 is where the intensity is the greatest. In this region, the intensity is assumed to be constant over the entire area with a value of $I_{max}$. The region between Ring 151 and 152 has somewhat less intensity than the center region 150. Again, the intensity in this region is assumed to be uniform with a value of $I_{max}/e$. The region between ring 152 and ring 154 is again assumed to have a constant but lower intensity than the previous region. This constant intensity is $I_{max}/e^2$. Generally, the width of a beam is considered to be the diameter of the beam when its intensity has dropped to below $I_{max}/e^2$. Therefore, for this example the beam diameter is considered to be the diameter of ring 154. The region between 154 and 156 is again considered to possess a uniform intensity of $I_{max}/e^3$.

Figure 8:
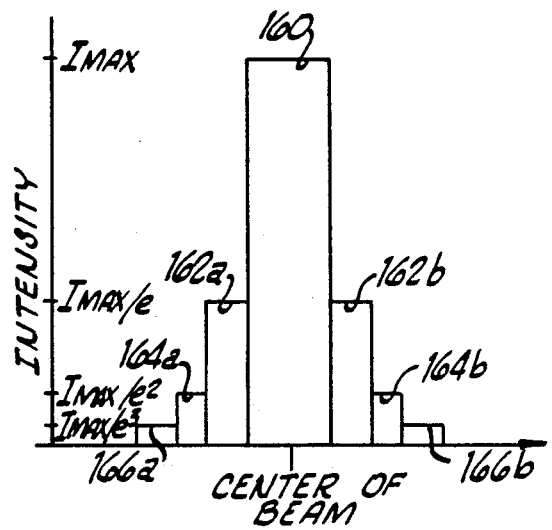

FIG. 8 is a bar graph of intensity I along line 8—8 of FIG. 7. Center 150 has the highest intensity $I_{max}$ represented by bar 160 and therefore is the point that results in the highest exposure (Intensity (I)×Time (T)) for a beam if it sits over a single point for a time period (T). The x axis is represented by the placement of line 8—8 in FIG. 7. Similarly, ring 152 encloses the next most intense region represented by bars 162a and 162b for the left and right portions of ring 152, and provides the next most exposure. Likewise, bars 164a and 164b represent the intensity along the left and right cuts through ring 154. Finally, bars 166a and 166b represent the intensity of ring 156 at its intersections with line 8—8.

Figure 8A:
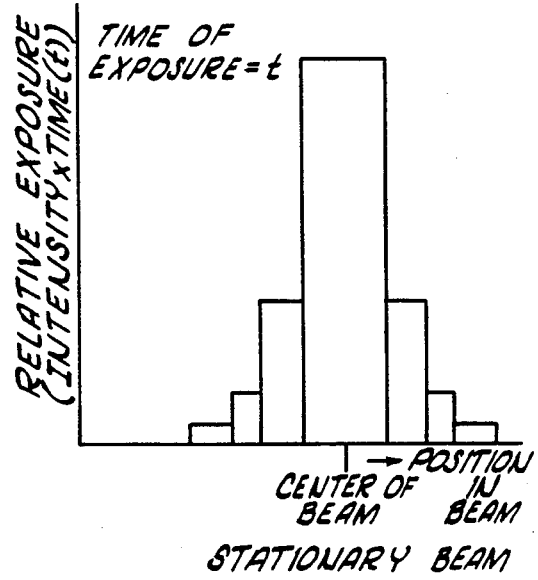
FIG. 8a depicts the exposure of an area due to the stationary beam of FIG. 8.
Figure 8B:
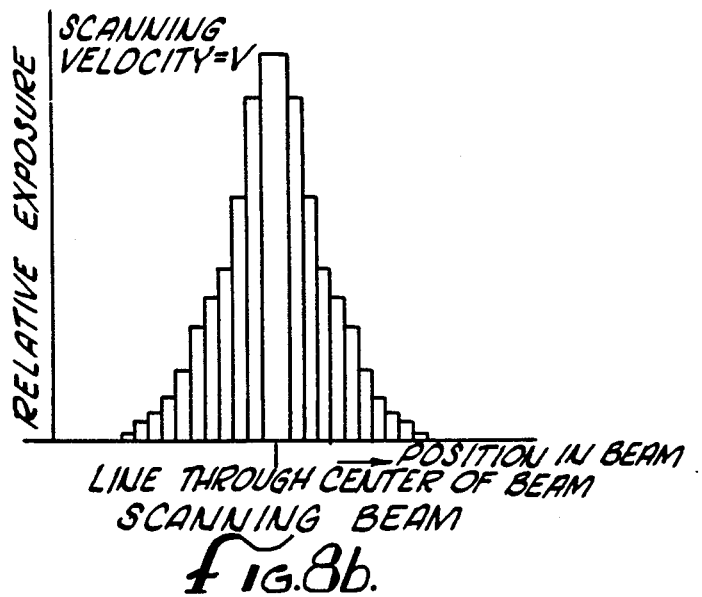
FIG. 8b depicts the exposure over an area due to the beam of FIG. 8 being scanned over the area at velocity v.

The bar graph of FIG. 8 represents the surface 23 intensity $I_o$ for various radial positions in the beam. The exposure produced by an intensity distribution depends on the exposure time and whether the beam is moving across the surface of the fluid medium. If the beam is stationary then the exposure at each position will simply be the intensity at that position multiplied by the time the beam is allowed to irradiate the material. In our example the intensity is a radial function and therefore the exposure will be the same radial function multiplied by a scaling factor. FIG. 8a depicts this exposure in relative units. In the case of a moving beam the exposure/intensity relationship is somewhat more complex. The exposure given to a point that is traversed at speed v by a beam with various intensity regions is the combined sum of the intensity of each of the various intensity regions that cross the point multiplied by time that each intensity region is exposing the point. For example, if the beam is traveling with its center moving along line 1, at speed v, and a portion of it crosses over a point (p), the exposure given to point p is:

$$\begin{aligned}\text{Exposure (at } p) &= \text{Sum}\{I(n)^*W(n)\}/v \\ &= \{I(166)^*W(166) + I(164)^*W(164) + \\ &\quad I(162)^*W(166) + I(160)^*W(160)\}/v\end{aligned}$$

where I(n) represents the intensity in region n, and W(n) represents the width of region n that crosses over point p as the beam scans along line 1, and v represents the velocity at which the beam scans. If point p is displaced at a distance from the boundary but within the radius of line 150 (region 160) of FIG. 7 then all of the various intensity regions will contribute to the exposure at this point. The W(n) values for each region are nonzero. If the point p is located between the boundary and the boundary 152 (region 162) then only the outer three intensity regions will contribute to the exposure. In this case, all the W(n) values are nonzero except for W(166). Similarly, if the point p is located between boundary 152 and boundary 154 (region 164) then only the outer two intensity regions will contribute to the exposure. In this third case only the W(164) and W(166) are nonzero. Finally, if the point p is located at a distance from the line between boundary 154 and boundary 156 (region 166) then only the outermost intensity region will contribute to the exposure. In this final case only the W(166) value is nonzero. FIG. 8b depicts the exposure in relative units along a series of points located at different radial distances from the beam center point on the scanning line. It can be seen the exposure from scanning (with this type of profile) tends to narrow the width for a given cure depth of relative exposure at different radial distances.

Figure 9:
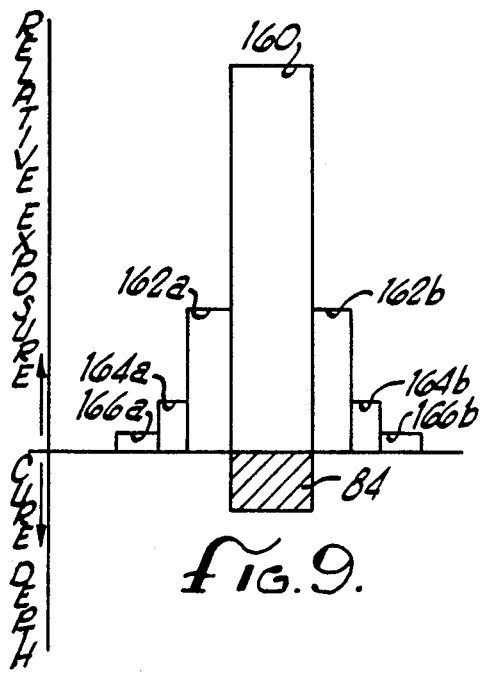
FIG. 9 shows the bar graph of FIG. 8 juxtaposed with an expanded cross-section of the cured photopolymer in FIG. 3.

FIG. 9 is a juxtaposition of FIG. 8a with a cross section of photopolymer 22 taken along lines 8—8 in FIG. 7. This cross-section is an expanded view of region 84 from the same time (stationary beam) and perspective as FIG. 3. As discussed with respect to FIG. 3, region 84 is shown in FIG. 9 at a time when Region 84 has just received critical exposure $E_c$ needed for gelling of photopolymer 22 down to a distance Pd below surface 23.

Figure 10:
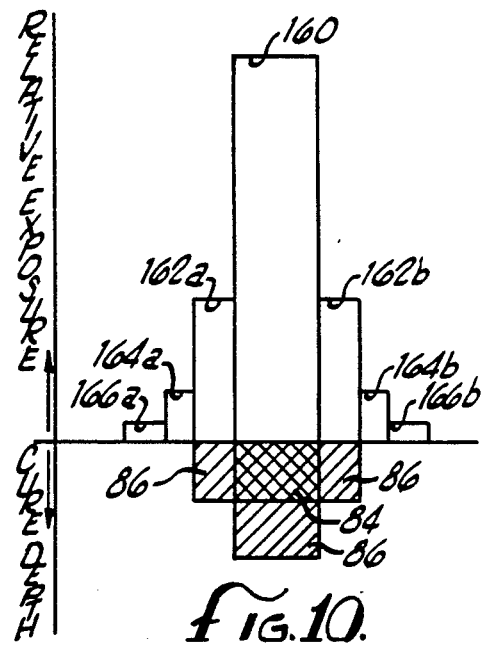
FIG. 10 shows the bar graph of FIG. 8 juxtaposed with an expanded cross-section of the cured photopolymer in FIG. 4.

FIG. 10 is taken at a later time, the same time and view as FIG. 4. FIG. 10 shows that at this later time, region 86 has received critical exposure $E_c$ and so has gelled. Region 84 has received much more exposure than $E_c$ and so has polymerized into more cohesive polymer.

Figure 11:
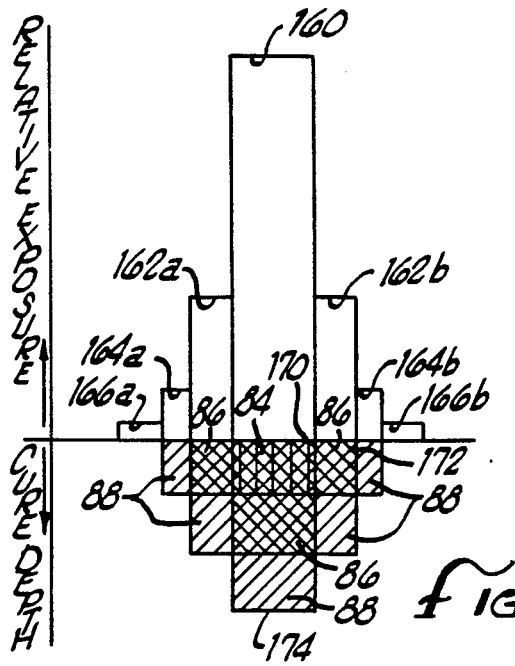
FIG. 11 shows the bar graph of FIG. 8 juxtaposed with an expanded cross-section of the cured photopolymer in FIG. 5.

FIG. 11 is taken at an even later time, the same time and view as FIG. 5. FIG. 11 shows that at this even later time, region 88 has now received critical exposure $E_c$ and has gelled. Region 86 has received much more exposure than $E_c$ and so has been transformed into more cohesive polymer. Region 84 has received very much more exposure than $E_c$ and so comprises very much stronger polymer.

By using the equation $E(d) = E_o/e^{e/Dp}$, one can calculate the depth where critical exposure has just been reached. This depth, for each position along the x-axis in FIGS. 9, 10, and 11, determines the shape of the photopolymer 22 that has solidified at least into a gel. This shape describes bottom 174. Bottom 174 is deepest (largest value of d) in the center where intensity multiplied by time (exposure) has been the greatest. In actuality, bottom 174 should be rounded because in actual profiles, intensity I varies continuously, typically from center 150 to outer ring 156, rather than discretely as assumed in the bar graph of FIGS. 8, 9, 10 and 11.

The following is an example calculation to establish the shape and size of bottom 174. To determine the depth of cure d produced by a surface exposure $E_o$ the depth d must be the depth at which the exposure has dropped to $E_c$. With this realization and a known critical exposure one can determine the cure depth:

Since $E(d) = E_o/e^{d/Dp}$, and $E(d) = Ec$ we get $d = Dp \cdot ln(E_o/E_c)$

For example, referring to the working curve in FIG. 6, we have $E_c = 16$ millijoules/cm$^2$, and the depth of penetration is 7.0 mils, and if $E_o = 256$ millijoules/cm$^2$ associated with the intensity within radius 150 of FIG. 7 (region 160 of FIG. 8a), then we get a cure depth d of:

$$d = 7.0 * Ln(256/16)$$
$$= 19.4 \text{ mils}.$$

Therefore, the bottom 174 is 19.4 mils below center 150 of spot 27 on surface 23. If we know $E_o$ as a function of X-Y position ($E_c$ remains constant) we can determine the cure depth as a function of the X-Y positions.

Note from FIG. 6 that the working curve has been plotted with an unbroken line down to a certain minimum cure depth, and for cure depths below that point the line is broken. Curves such as these are generally created by forming small objects such as the one depicted in FIGS. 16a and 16b. These objects have several (generally 5 to 9) strings where each string is created from a known but different exposure. These various exposures are usually specified to be factors of two different from each other. This allows a large range of cure depths and exposures to be covered with only a few strings being necessary. These strings are generally created in one of two ways. The first way is by drawing each string with a single scan from a beam that has a known profile, known total power, and known scanning speed. From these parameters, the line of maximum exposure can be determined along with the exposure in that line. The second way is by drawing each string using a number of slightly offset passes. The number of these passes is sufficient to produce a region of uniform exposure that is somewhat wider than the assumed width of the beam (for each string). The amount of exposure in each of these uniformly exposed regions can be determined based on the total power in the beam, the size of the area covered and the time that it took to scan the area. The region of uniform exposure produces a region of uniform cure depth. The existence of this region of uniform cure depth is sufficient to assure that the scanning parameters were reasonably selected. In either case, we have a region of known exposure for each string from which we will measure the depth of cure. These depths of cure are then plotted against the natural logarithm of their respective exposures. Since the preferred resins obey Beer's law (over a particular range of interest) these plots form straight lines from which a slope (the penetration depth) and an X-intercept can be determined (critical exposure). Since these strings are created in a viscous material, the strings must have a certain minimum cohesive strength to hold together sufficiently to be removed from the vat of photopolymer. Each resin demonstrates a different cohesive strength for a given cure depth (based on the specific wavelength used to exposure) and therefore each resin will demonstrate a different minimum thickness of a string that can be extracted from it (with the string remaining in reasonable condition). The definition of reasonable condition is related to tolerances set for maximum distortion under its own weight. This minimum thickness is related to factors associated with the resin several of which are its penetration depth for the wavelength used, its viscosity, the atmosphere surrounding the resin, and the like. This minimum thickness can be looked at as having been given the minimum useful net exposure. The broken portion of the working curve indicates the region in which the gelled material can't usefully be extracted from the resin. This portion of the curve has associated with it an exposure value between the critical exposure and some larger exposure we call the minimum exposure. The solid portion of the curve represents the region in which the strings can be created and extracted, therefore the solid portion represents the region where the exposure is above the minimum.

To make accurate cure depth predictions we require an accurate measure of the peak exposure. For a stationary beam this corresponds to an accurate measure of the peak intensity. For a scanning beam this corresponds to the sum of intensity elements, weighted by the element size, along lines parallel to the scanning direction. Generally, the line that contains the peak intensity is the one that will produce the maximum cure depth. The net exposure caused by a scanning beam is much less susceptible to fluctuations or errors in peak intensity, than that for a stationary beam. However, both of these approaches require a reasonably accurate knowledge of the intensity profile and the peak intensity value. In FIG. 7 we assumed that the intensity within ring 150 had a constant value equal to the peak value. This may or may not have been a reasonable assumption. There may have been samller regions within ring 150 that had intensity values greater than and less than the average value that we have claimed as the peak value. We recall that if we were wrong about this value being the peak, then we may be off by up to 70% of a depth of penetration for every factor of 2 that we underestimated. For example, in FIG. 7 the profile was divided into four regions with each region being different from the others by a factor of e or 1/e. According to the size of the beam as shown in FIG. 7 and the areas and energies of each separate region we get,

| Region | % of total area | Intensity | % total power |
|---|---|---|---|
| 160 | 7.4 | I(max) | 35.1 |
| 162 | 22.4 | I(max)/e | 39.1 |
| 164 | 22.9 | I(max)/$e^2$ | 14.6 |
| 166 | 47.3 | I(max)/$e^3$ | 11.2 |

From this we can find the estimated peak intensities if we ignored in succession the center rings. We can also predict a possible amount of error that can be introduced in the cure depth from this approach:

| Peak Region | % of total area | Intensity | Pos. Err in C.D. |
|---|---|---|---|
| 160 + 162 | 29.8 | 52.5% I(max) | 70% Dp |
| 160 + 162 + 164 | 52.7 | 35.4% I(max) | 103% Dp |
| 160 + 162 + 164 + 166 | 100 | 21.1% I(max) | 155% Dp |

This above example demonstrates the importance that proper determination of maximum intensity can have on cure depth. To insure proper cure depth, one must choose area elements that are small relative to the rate of change of intensity per unit length near the point of peak intensity. One method of insuring that the sample size is small enough is to make a profile measurement and verify that the peak intensity value is approximately the same in several regions (cells). If a grid of uniformly spaced cells is used, if four adjacent cells produce approximately the same maximum reading then one is reasonably safe in assuming the peak intensity has been appropriately found. If more margin of safety is desired one can look at nine or more adjacent cells (in the shape of a square—assuming the beam to be somewhat radially symmetric and single peaked) that surround what appears to be the peak to insure relatively uniform readings in all of these cells. Fortunately, exposure from a scanning beam is far less susceptible to deviations in peak intensity so it isn't generally critical if there is some error in the peak values.

Materials that are presently preferred for stereolithography generally obey Beer's law up to a certain cure depth/penetration depth combination. That is for penetration depths practical for curing to a particular cure depth, the resin will obey Beer's law reasonably well to beyond that cure depth. For example, SLR 800, manufactured by DeSoto, Inc. of Des Plaines, Ill., is used for layer thicknesses from about 5 or 10 mils up to about 30 mils, and it has a penetration depth of approximately 7 mils when cured with a wavelength of 325 nm. In this range the resin obeys Beer's law well, however at about a 40 mil cure depth the material begins to absorb more strongly than that predicted by the exponential law.

We can determine the width of cure by determining the X-Y positions where the cure depth goes to zero. The pattern formed by these transition points determines the width (X-Y dimensions) of the cured material. If in a given region, the exposure is less than the critical exposure, the use of the above equation produces a negative cure depth which is to be interpreted as zero cure depth. In determining cure width, depending on the beam profile and cure depth used, it may be more accurate to determine the cure width based on the minimum exposure $E_m$ as opposed to the critical exposure. When considering cure depth, an exposure slightly above the critical exposure may not produce any sueful solidified material. Similarly, when cosidering the cure width, when the exposure gets close to the critical exposure, useful solidified material may not be formed. If the beam and scanning technique used produces a rapid transition from high exposure to low exposure, near $E_c$ then the cure width as predicted by use of E(c) gives satisfactory results. However, if the beam and scanning technique used produces a slow spatial transition from high exposure to low exposure, near $E_c$, then the cure width as predicted by use of $E_m$ yields a better prediction.

We note that to make an accurate prediction of cure width, one must have intensity profile information that has measurements of intensity at spatial intervals at least approximately twice as close as the accuracy desired in specifying the expected cure width.

Many portions of the above examples were based on exposure from a stationary beam, but once a determination of surface exposure is made the remaining steps for determining cure depth and width are identical whether or not the beam is stationary or is scanning.

Decreasing critical exposure $E_c$ or increasing depth of penetration Dp while holding $E_c$ constant will increase the distance d below surface 23 at which bottom 174 will be at a particular time. The amount is predictable by the equation $E(d) = E_o/e^{d/Dp}$, where we set $E(d) = E_c$. Adjusting the depth of penetration, Dp while maintaining a particular surface exposure $E_o$ and a particular critical exposure will adjust the depth of bottom 174 in each region. It will also change the depth of transition 172 between the more cohesive plastic in region 86 and the gel in region 88. It will likewise adjust the depth of transition 170 between very strong plastic in region 84 and the more cohesive plastic in region 86. These transistion depths can also be easily determined by the above equation by replacing E(d) with $E_c \cdot e^1$ and $E_c \cdot e^2$ respectively. The curves 174, 172, and 170 would likely not actually meet in a real piece of solidified material since discontinuities in beam intensity would likely not exist.

By changing penetration depth, and therefore adjusting the positions of the various regions of partially solidified plastic, the overall percentage polymerization of the gelled material will change; therefore, the overall green strength of the gelled material will also change. Due to this change in overall green strength and also due to the change in the gradient of the extent of polymerization through the thickness of a layer of solidified material the ability of this thickness of material to resist a bending moment will change. For a given cure depth, an increase in penetration depth will tend to lower the percentage polymerization, the green strength, and the resistance to a bending moment. While for a similar cure depth, an increase in penetration depth will tend to increase the percentage polymerization, the green strength, and the resistance to a bending moment.

In summary, if a more detailed beam profile is used than that in FIG. 7, the shape of the bottom and the transitions can be more precisely predicted and controlled. To make precise predictions from a scanning beam the movement of the beam must be considered in order to determine net exposure at a given point. Net exposure at a point is the sum of the exposure from each element taken along a line that passes through P and is parallel to the scanning direction. Therefore, if the exposure is determined correctly, valid cure depth and width can be obtained.

As described in U.S. Pat. No. 4,575,330 to Hull, a beam of radiation in an SLA scans across the surface 23 of photopolymer 22 to cure a layer. The diagram of FIG. 7 shows the intensity profile of a beam of light 44; if the beam were stationary. As shown in FIG. 8a, FIG. 7 multiplied by exposure time can also represent the pattern of exposure for such a stationary beam. However, due to the motion of the beam of light in a typical SLA, the intensity pattern of FIG. 7 would result in an exposure pattern similar to FIG. 8b, which has a stripe of highest exposure in the center of the path of motion corresponding to the center of region 150. It also has a more rapid drop off in relative exposure with distance from the center than did the stationary beam exposure. In actual use, the intensity gradation of a laser beam cross-section is continuous rather than discrete. Thus, in the previous example, the actual pattern for the moving beam fades from highest exposure near the center of the path of movement to the lowest at the outer edges.

In a scanning laser beam, total exposure is controlled in part by controlling the speed of movement. The exposure at a given point is inversely related to the speed of scanning.

In present SLAs, the beam profile may not be concentric. For example, the highest intensity may be off center, or there may actually be more than one peak intensity region. The two dimensional intensity profile of a stationary beam may not be concentric in present SLAs, but it is highly desirable that the one dimensional summed intensity profiles from scanning the beam in various directions yield similar characteristics. Of course, the ultimate desire is that these one dimensional profiles be identical, regardless of direction of scan, and that they be symmetrical about these directions. A reduced requirement is that the scanning beam produce similar cure depths and widths within some tolerance such as 10% of thickness and 10% of nominal width, regardless of scanning direction. This allows the exposure parameters used in the system to be specified and controlled independent from the direction of scanning. If the beam does not satisfy these requirements the laser and/or optics are adjusted so that these specifications are met. If this requirement became too burdensome the beam profile characteristics could be mixed into the exposure control system to adjust for discrepancies between the various scanning directions. Table 1 may be used as an example of an actual beam profile, in which the numbers specify surface intensity $I_o$ in a grid of measurement points:

TABLE 1

| 0 | 0 | 1  | 0 | 0 |
|---|---|----|---|---|
| 0 | 1 | 2  | 0 | 0 |
| 1 | 2 | 8  | 3 | 1 |
| 0 | 3 | 11 | 2 | 0 |
| 0 | 0 | 2  | 1 | 1 |

The intensity at each point is the power at that point, which is the number specified (which may require normalization, so that the sum of values from each point can be correlated to the actual total power in the beam) divided by the area represented by each point. If the beam is moving at a constant speed from left to right across the page, then the exposure pattern for this profile would be determined by adding the rows of numbers from left to right to determine a net intensity value for the row. This net intensity value is then multiplied by the time that it takes to cross the length of one cell. By doing this, we have obtain the summed value for each row as the corresponding numbers in the far right column of Table 1a indicate:

TABLE 1a

| 0 | 0 | 1  | 0 | 0 | 1  |
|---|---|----|---|---|----|
| 0 | 1 | 2  | 0 | 0 | 3  |
| 1 | 2 | 8  | 3 | 1 | 15 |
| 0 | 3 | 11 | 2 | 0 | 16 |
| 0 | 0 | 2  | 1 | 1 | 4  |

For now, we assume the normalizing constant is 1 and the time to cross one cell is 1. These numbers in the right column therefore represent exposure from a beam traveling in the indicated direction (as well as the summed intensities). The horizontal swath traversed by this movement would give an exposure pattern as in FIG. 12a. Stripe 206 has the highest exposure, and stripe 204 slightly less. The exposure fades off sharply above and below stripes 206 and 204. The stripes' exposures are related in the proportions given by adding the beam profile exposures from left to right: $E_{200}$: $E_{202}$: $E_{204}$: $E_{206}$: $E_{208}$:: 1:3:15:16:4.

If the five horizontal sums in Table 1a stand for the exposure of the trace stripes in millijoules/cm$^2$, the depth of cure for the path of FIG. 12a can be determined using the equation $E(d)=E_o/e^{d/D_p}$. The depth of cure is the depth at which critical exposure $E_c$ has just been reached. If the depth of penetration is 7.0 mils, and the critical exposure is 2 mJ/cm$^2$, for example, then the depth of cure for stripe 204 where surface exposure $E_o$ is 15 mJ/cm$^2$ is given by:

$$d = D_p \cdot 1 \sim (E_o/E_c)$$
$$= 7.0 \times 1 \sim (15/2) = 7.0 \times 2.0 = 14.0 \text{ mils}$$

Thus, the bottom of the gelled region under the stripe 204 is 14.0 mils below surface 23.

Similarly, if the beam profiled in Table 1 moved at a constant speed down from the top of the page toward the bottom, then the exposure pattern would be given by summing the columns of values for surface exposure $E_0$ as in Table 1b:

TABLE 1b

| 0 | 0 | 1 | 0 | 0 |
|---|---|---|---|---|
| 0 | 1 | 2 | 0 | 0 |
| 1 | 2 | 8 | 3 | 1 |
| 0 | 3 | 11 | 2 | 0 |
| 0 | 0 | 2 | 1 | 1 |
| 1 | 6 | 24 | 6 | 2 |

The swath transversed by this movement would give an exposure pattern as in FIG. 12b. This pattern is nearly symmetrical, with the center of the swath, stripe 214, having the highest exposure. The exposure of the five stripes would have values depending on the speed of movement in the following ratio $E_{210}: E_{212}: E_{214}: E_{216}: E_{218} :: 1:6:24:6:2$.

Likewise, if the path of the profiled beam moved diagonally to the right and down the page, then the exposure pattern would be obtained by adding diagonally aligned values for surface exposure $E_0$ from the table:

TABLE 1c

| 0 | 0 | 1 | 0 | 0 | / |
|---|---|---|---|---|---|
| 0 | 1 | 2 | 0 | 0 | /0 |
| 1 | 2 | 8 | 3 | 1 | /0 |
| 0 | 3 | 11 | 2 | 0 | /2 |
| 0 | 0 | 2 | 1 | 1 | /5 |
|   |   |   |   |   | /12 |
|   |   |   |   |   | /14 |
|   |   |   |   |   | /6 |
|   |   |   |   |   | /0 |
|   |   |   |   |   | /0 |

The diagonal path described by the movement gives an exposure pattern as in FIG. 12c. We note that the cell width has now changed by a factor of $1/\sqrt{2}$ because of the smaller separation between measurements. This factor will have to be taken into consideration when determining the exposure. Stripe 226 has the highest exposure, and stripe 228 slightly less. The exposure fades off sharply on either side of stripes 226 and 228. The stripes' exposures are related in the proportions given by adding the beam profile exposures in the table from upper left to lower right:

$E_{220}:E_{222}:E_{224}:E_{226}:E_{228}:E_{230}:E_{232}:E_{234}:E_{236} :: 0:0:6:14:12:5:2:0:0.$

In this example, the outer stripes 220, 222, 234, and 236 each receive zero exposure and so FIG. 12c reduces to the remaining five stripes. As discussed previously, the stripes are merely discrete representations of a continuous gradation of exposures across the path of a laser beam.

The previous intensity profile and associated summed intensity profiles gave somewhat different results with regard to maximum summed intensity, symmetry of the profile on either side of the maximum, and overall beam width. Therefore, this particular distribution was good for illustrating a couple of points but it is unsatisfactory for use in an SLA unless the SLA has software or hardware capabilities to compensate for variations in exposure on the basis of scanning direction. Such capabilities are readily obtainable in present SLA software even though not presently implemented. The present SLAs control exposure by varying scanning speed. They also scan on a vector by vector basis; therefore it is a simple matter to match the scanning direction to a precompiled relative exposure list, based on the scanning direction, to look up the necessary parameter to adjust the exposure to compensate for lack of symmetry in the summed intensity distributions. This look up table probably need only have a small number of correction values with interpolation being done between the values present for scanning directions not actually in the table. In a preferred embodiment of utilizing beam profile characteristics the spatial distance between individual cells is 1 to 4 mils along the X and Y axes, and there are 10 to 20 cells along each axis; thereby forming a square of 100 to 400 cells that cover a range of between 10 mils by 10 mils up to 80 mils by 80 mils. In general the beam diameters used are on the order of 10 mils. Generally, each cell can record an intensity value of approximately four orders of magnitude.

Once the exposure patterns are known, these exposure and/or summed intensity profiles can be patterned to form regions of fill (regions where all areas are exposed) so as to optimize the SLA performance with regard to producing skin fill. This optimization process includes the balancing of several parameters: 1) the desire to produce a skin of uniform thickness, 2) the requirement to keep the number of skin fill vectors within a reasonable limit, and 3) the requirement not to exceed certain scanning speed upper limits. For example when the exposure pattern of FIG. 12b is obtained, four adjacent traces would give the same exposure pattern repeated four times:

1:6:24:6:2  1:6:24:6:2  1:6:24:6:2  1:6:24:6:2.

However, if the outer two stripes of each set of six parallel traces are made to overlap. This overlap corresponds to a certain offset between drawing parallel skin fill vectors. If each cell represents a 2 mil square then in the non-overlapping case above the offset between vectors is 10 mils and in the case where two strips overlap the offset is 6 mils. It can be seen that the cumulative exposure pattern for the same area is more uniform than before, but it still is not very uniform yet.

| 1 | 6 | 24 | 6 | 2 |   |    |   |   |   |    |   |   |   |    |   |   |   |    |   |   |
|---|---|----|---|---|---|----|---|---|---|----|---|---|---|----|---|---|---|----|---|---|
|   |   |    | 1 | 6 | 24 | 6 | 2 |   |    |   |   |   |    |   |   |   |    |   |   |   |
|   |   |    |   |   | 1  | 6 | 24| 6 | 2  |   |   |   |    |   |   |   |    |   |   |   |
|   |   |    |   |   |    |   | 1 | 6 | 24 | 6 | 2 |   |    |   |   |   |    |   |   |   |
|   |   |    |   |   |    |   |   |   | 1  | 6 | 24| 6 | 2  |   |   |   |    |   |   |   |
|   |   |    |   |   |    |   |   |   |    |   | 1 | 6 | 24 | 6 | 2 |   |    |   |   |   |
|   |   |    |   |   |    |   |   |   |    |   |   |   | 1  | 6 | 24| 6 | 2  |   |   |   |
| 1 | 6 | 24 | 7 | 8 | 24 | 7 | 8 | 24| 7  | 8 | 24| 7 | 8  | 24| 7 | 8 | 24 | 6 | 2 |

We can continue this overlapping process further until we obtain an accumulated exposure that gives us the uniformity that we are looking for. For example, three overlapping strips produces an accumulated exposure of 1 6 25 12 27 12 27 12 27 12 27 ... 12 26 6 2, while an overlap of 4 produces 1 7 31 37 39 39 39 39 ... 39 32 8 2.

In the above example an overlap of 4 produces the most uniform exposure and will therefore produce the most uniform cure depth. However, for an overlap of this extent the offset between separate fill vectors is one cell, which in this case corresponds to 2 mils. As the vectors get closer together it takes more of them to cover a given area; therefore, if the vectors have to be stored before drawing, the size of the vector storage file might become too excessive. This is a good reason to verify that a particular offset is required before producing the vectors, because if a larger offset can be used fewer vectors will need to be stored. In terms of this example, if in a particular situation an overlap of three strips (offset of two strips=4 mils) may produce adequate uniformity of cure therefore using this spacing will require ½ the storage. An additional consideration when determining the skin fill spacing is that there exists a limited scanning speed at which the beam can be controllably moved. Therefore, there is a certain minimum vector offset that can be used for creating skin fill. For the SLA 250 using General Scanning mirrors the fastest reasonable scanning speed is approximately 32 inches per second. For a larger stereolithographic apparatus, called the SLA 500 which uses Greyhawk scanning mirrors the maximum scanning speed is approximately 100 inches per second. These speeds may be adjusted up and down somewhat depending on the beam profile. Referring to FIG. 6, for example, one recalls that a certain exposure is required to get a particular cure depth. If one knows the exposure E required, the laser power L.P. available, and the maximum scanning speed then the following relationship can be used to determine the closest (or minimum) skin fill vector spacing (offset):

Min Spacing=L.P./ (E * max speed)

For example, if we have a layer thickness of 5 mils and want a corresponding depth of skin fill the required exposure is, as given by the working curve of FIG. 6, approximately 32 mJ/cm$^2$. If our laser power is a beam of total power 20 mW and our maximum scanning speed is 32 inches per second (81 cm/sec.), then our minimum fill vector spacing is 0.020/(0.032*81)−0.0077 cm=3 mils. Depending on the intensity profile of the beam, it may be possible to get a reasonably uniform cure depth while using this minimum vector spacing or maybe even a larger spacing. On the other hand, if the maximum drawing speed is 100 inches per second (254 cm/in) and the laser power is 400 mW, then the minimum vector spacing for the same cure depth is 0.100/(0.032*254)=0.0123 cm=4.8 mils. For a beam diameter of approximately 10 mils this minimum vector spacing may make it somewhat difficult to create a region of uniform cure depth. If this minimum vector spacing is too large to get the desired uniformity then one of the parameters in the above equation must be modified to allow a smaller minimum to be used. The laser power may be decreased, or the wavelength or material changed to require a larger exposure for a particular cure depth value, or the maximum scanning speed may be able to be increased somewhat (with a possible loss of accuracy). Additionally, these parameters may not only be recognized as requiring modification, but there can be configured into the system the ability to make these modifications. For example, laser power can be modified during the part building by insertion of an attenuator into the beam path as it travels from the laser to the scanning mirrors. This movement of an attenuator can be computer controlled to be inserted and extracted as need be. This attenuator may also have different opacities depending on how far it is inserted into the beam path. This would allow the vector spacing to be reduced sufficiently without producing an excessive loss of building speed, as might be the case if only one opacity were available. Another possibility is to use direct control over the laser discharge (and therefore output) as is possible with the Spectra-Physics or Coherent Argon Ion lasers used on the SLA 500. An additional possibility is to use filters to attenuate the energy output at certain wavelengths (if a multiple wavelength laser is being used) to obtain a different working curve and therefore a different required exposure. Additional possibilities include an automated method and apparatus for switching the lasing of the laser between its various wavelengths so that the optimum wavelength for a given situation can be used (the switching of the Argon Ion lasers above is possible by changing the angle of a prism within the lasing path). It can be seen from the above considerations that the spacing of skin fill vectors can be optimized by the use of beam profile characteristics, and that if necessary a modification to certain building parameters can be called for or even use of automatic control and variation of these parameters.

A particular exposure results in a particular cure depth. Because of this, if one increases the number of fill vectors covering a given width of an area to be cured, then one must also increase the scanning speed in order to maintain the same exposure. Therefore, for a given thickness to be cured, a given wavelength being used, and a given resin being used there is a required exposure necessary to cure the area to the desired depth. For a given laser power and number of vectors that cover this area there is a required scanning speed that will produce the desired exposure.

There are a number of additional improvements and refinements to the present invention that are obtained with a beam profiler.

First, a beam profiler in the present invention permits more accurate establishment of critical exposure Ec and depth of penetration than obtainable by use of banjotops. A beam profiler is used to more accurately know exposure amounts necessary to obtain depth of penetration and critical exposure $E_c$. Basically, a beam profiler provides a better measure of surface exposure $E_o$ at the portion of a string where depth d is to be measured. The example of FIG. 16b shows the bottom of each string to be of uniform depth. This is because we considered the intensity of the beam to be uniform. These strings generally have a curved bottom since exposure is generally not uniform. The region of maximum depth is compared to the region of maximum exposure. For example, a beam profiler finds that the beam used has the profile of Table 1a. If the beam scans down the page as depicted in FIG. 16a along path 334, the FIG. 16b cross-section (silhouette) of string 336 has varying depth d based on the sums in Table 1c. The center of the cross-section of string 336 is the deepest because it has received more exposure than the edges of string 336. The deepest part of string 336 is measured because it can be more easily located than any other part of the cross-section of string 336. The sum of 24 in Table 1b corresponds to the deepest portion, the center, of string 336. As indicated in Table 1c, the center fifth of the string receives 24/39 of the total exposure. If the surface exposure $E_o$ applied to string 336 is 10 mJ/cm$^2$, then the center one/fifth of string 336 receives (24/39)·10 mJ/cm$^2$, or 6.15 mJ/cm$^2$. This amount of exposure per area is then used as $E_o$ for plotting working curves or determining cure depths, etc.

Second, a beam profiler in the present invention reduces the frequency of needing banjo-tops. Once an initial banjo-top is made for a given polymer and laser (single wavelength), the beam profiler is used to compensate for variations in intensity. Without a beam profiler, this is done by making frequent banjo-tops. The beam profiler is used to measure intensity change in each wavelength and changing beam scanning speeds accordingly. The beam profiler provides the information necessary to predict cure depth and cure width. For a resin with known depth of penetration and critical exposure, no banjo-top is necessary because the beam profile permits control system 28 to determine depth and width of cure.

The beam profiler is also used in conjunction with multiple wavelength sources to reduce the need for making banjo-tops and therefore for predicting cure parameters based on resin characteristics alone. This is done by allowing the creation of separate beam profiles for each wavelength and utilizing this profile information for each wavelength in combination with resin characteristics for that wavelength. For example, each wavelength may have a different critical exposure and penetration depth that will need to be taken into account. A contribution of cure from each wavelength can be determined. Then the various contributions can be compared to see which contribution dominates the cure parameter being considered (e.g. cure depth). If one wavelength dominates the cure parameter then it may be considered to be the sole determinant of that parameter. However, if no wavelength dominates, then another approach to predicting cure parameters may be used. For example, a certain degree of polymerization is required to produce gelled material. Therefore, instead of using the amount of cure associated with each wavelength individually it is possible to associate each volume element with an extent of polymerization as induced by all wavelengths, and then from this extent of polymerization determine the cure properties of each unit volume.

Third, FIG. 23 illustrates how a beam profiler in the present invention permits accurate edge formation. A major feature of the present invention is determining depth of cure and width associated with a given depth. There are a number of guidelines discussed above for selecting or allowing for depth and width of cure based on beam profile considerations. Therefore, the beam profile can aid in the prediction of necessary beam width compensation factors associated with a particular cure depth.

FIG. 23 shows design edge 610 of part 30 being formed from photopolymer 22. To the right of design edge 610 is solid part 30, and to the left is uncured photopolymer 22 which will stay in container 21. Design edge 610 is where the computer aided design has a non-horizontal border between intended part 30 and uncured photopolymer 22. Because the beam profile of light 44 is not uniform, the depth and width of cure is not even at design edge 610. While overlapping beam traces can flatten out the depth of cure across a downward facing horizontal surface, it does not address the shape of the actual edge.

FIG. 23 shows several preferred arrangements for addressing this problem. These arrangements are chosen from by a user or by control system 28 according to desired finishing.

Oversize arrangement 620 may be chosen when the edge of part 30 will be finished with sanding or sand blasting to achieve design edge 610. Shape 622 shows the shape of photopolymer 22 cured in the very last pass of light 44 into or out of the page. Shape 624 shows the shape of photopolymer 22 cured in the last laser pass of previous layer 626. Previous surface 628 was coextensive with surface 48 when layer 626 was being formed. Region 630 and region 632 must be sanded away to leave part 30 with design edge 610. The bottom of curve 622 hangs below previous surface 628 for attachment to layer 626, as does the bottom of curve 624 for attachment to the previous layer. If there wasn't material on the previous layer to attach to, then the curve 624 would be cured to the one layer thickness. If 624 and 626 were cured to different depths then they would also have different widths and therefore require different amounts of offset so that the edge of each or the middle of each is located in the proper position. Since cure depth and cure width can be predicted by utilization of the beam profile information in combination with the resin characteristics, an appropriate compensation (for width of cure) can be determined.

Undersize arrangement 640 is chosen when the actual edge of part 30 will be finished with filling to achieve design edge 610. Curve 642 and curve 644 represent curing from the pass of light 44 over layers 646 and 648, respectively, of part 30. When part 30 is removed from container 21, region 650 and region 652 will not have any cured photopolymer. Thus, region 650 and region 652 must be filled in to make part 30 have design edge 610. One way to do this is to run photopolymer 22 over part 30 before it is placed in a post curing apparatus. Methods of doing this are discussed in U.S. patent application 268,428 filed Nov. 8, 1988.

Under-paint arrangement 660 is chosen when the actual edge of part 30 will be painted or coated. Curve 662 and curve 664 are intentionally cured some distance to the right of design edge 610. The distance chosen is the average thickness of paint to be applied. Methods of doing this are discussed in U.S. patent application Ser. No. 415,169, herein incorporated in full by this reference.

Average arrangement 680 is chosen for minimum part post-processing. For many uses of part 30, average arrangement 680 is a good compromise when design edge 610 cannot be obtained.

FIG. 24 illustrates the above arrangements when applied to a design slope 710. It can be seen that depending on the circumstances, there are a variety of possible displacements of boundary vectors (vectors that bound external and internal regions). These options depend on the slope of the surface being bounded, on the type of post processing that will be done and primarily on the cure width involved. Therefore, the determinative abilities of the beam profile are critical to determining the appropriate offsets, especially if the offsetting is to be done in an automated manner.

Fourth, a beam profiler's incorporation into the present invention facilitates computation of minimum surface angle (MSA) for a given depth of cure. MSA is the smallest angle from horizontal that a somewhat vertical surface of part 330 can have without leaking uncured photopolymer 22. Part 30 contains some uncured photopolymer 22 when removed from container 21 that could flow from part 30 before part 30 undergoes post-curing. This saves money and time because it is cheaper and quicker to cure photopolymer 21 in a post curing apparatus than in an SLA. It also may lead to better accuracy of reproduction because of some distortions being lessened if cure occurs during post cure as opposed to during the building phase (e.g., curl).

As seen in FIG. 24, a design slope 710 causes the border between photopolymer 22 and part 30 to be less reliable than in a design edge 610. That is, polymer can almost flow between each of the layer pairs shown. For example, in average approach 680, any liquid polymer remaining in layer 712 can almost leak out through void 670 when part 30 is removed from container 21. The surface angle 711 of design edge 710 to horizontal is thus the MSA because any further decrease in angle 711 would result in actual leakage.

Figure 25:
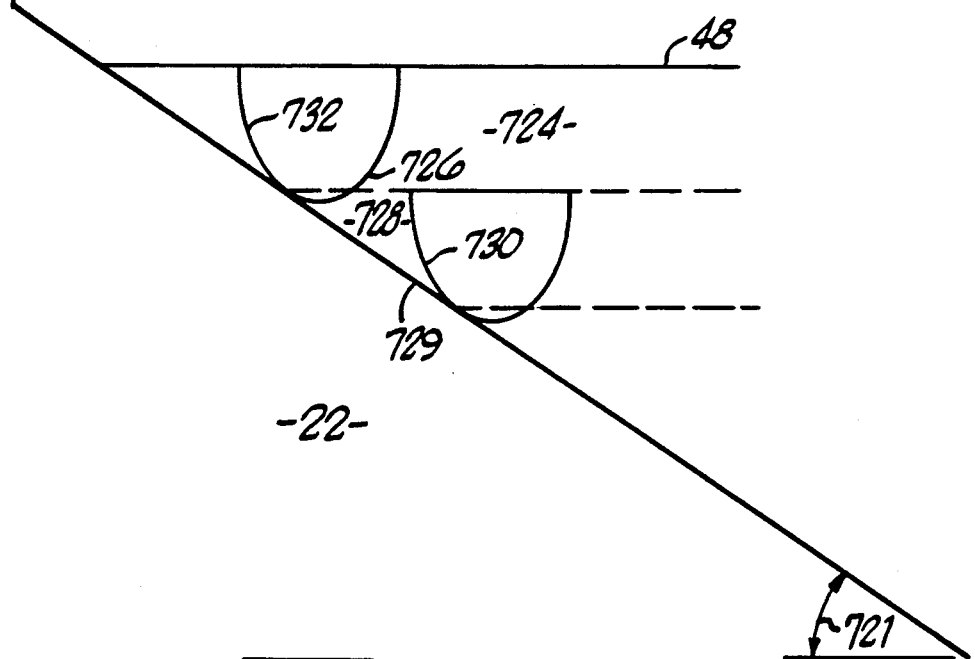
FIG. 25 shows a steeper slanting edge than that in FIG. 24.

FIG. 25 shows design slope 720 which has surface angle 721 smaller than MSA 711. Thus, leaks are expected. Indeed, liquid from layer 724 can leak out through gap 726 and void 728. A beam profiler predicts the leak by revealing the shapes of curves 730 and 732. When theses shapes are compared to surface angle 721, control system 28 can determine whether surface angle 721 is less than the MSA. If so, CAD data generator causes a skin 729 to be cured between curve 730 and curve 732 to prevent such leaking. This relationship between surface angle and cure parameters can be expressed as an equation:

MSA = ArcTan (2* layer thickness/(width max + width min)).

Where the width max is the maximum width of solidifiable material created by the boundary on the lower layer and width min is the width of solidified material from the upper layer at one layer thickness below its upper surface. These widths can be predicted by the beam profile information in combination with a known cure depth, therefore the required MSA can be predicted for each set of parameters. If the angle of the triangle to the horizontal is greater than the MSA some type of fill will be needed in association with the lower layer if the surface is either up- or down-facing (or correspondingly if the normal to the surface is closer to vertical than the MSA to vertical). Regions that require this type of fill are called near-flat regions or regions that require near-flat skin. Additional information regarding MSA and near-flat skin is in the previously referenced and incorporated U.S. patent application Ser. No. 331,664.

Depending on how the near-flat boundaries and fill are created, there may be another important characteristic that can be predicted by the methods described above. In the methods discussed in the '664 application down-facing near-flat regions are also used to construct portions of the part superstructure as well as filling in possible leaky regions. In this case, the formation of these near-flat boundaries must extend beyond the MSA value even though filling isn't necessary beyond this value. The beam profile parameters can again be utilized to predict to what angles nonvertical triangles must contribute to the creation of these structurally significant boundaries. At some point the angle of the surface (individual surface trianges as the presently preferred CAD interface utilizes) will become steep enough so that the creation of a near-flat down-facing boundary will become unnecessary.

Fifth, the beam profile information can be utilized in combination with resin parameters to determine the amount of polymerization associated with each volume element. To do this, one utilizes a table or an equation that relates exposure (or energy absorbed in a given volume) with the amount (e.g. percentage) of polymerization that is induced in that volume. Several such tables or equations can be utilized, one for each wavelength that is used in the solidification process. We know from our beam profile and surface exposure how much exposure each volume element receives therefore it is possible to determine such things as the average amount of polymerization in a volume as one moves through the particular volume. The determination of average polymerization is obtained by summing or integrating the extent of polymerization over all elements of interest. The gradient of polymerization is determined by comparing the extent of polymerization in adjacent cells. This determination of extent of polymerization can actually be considered as a foundation for determining other cure related parameters. Extent of polymerization can be related to the gel point of the material and therefore to the cure depth and cure width formed by a given exposure. By doing this, the polymerization induced by several different wavelengths can be superimposed and a net amount of polymerization determined, for each unit volume, from which it is possible to predict net cure depth and width. The extent of polymerization induced in a given resin by each wavelength by a given exposure can be determined by various chemical, extraction, or spectroscopic methods. Once these determinations are made, as with determination of critical exposure and depth of penetration, the beam profile information can be used to make the necessary determinations and predictions for the exact situation being dealt with. Various other parameters can affect these predictions and therefore they must be held reasonably constant or figured into the variable list. These parameters include the temperature at which exposure occurs, the amount of oxygen absorbed in the resin (therefore the atmosphere surrounding the resin), the presence of other inhibitors, and of course the particular resin being used.

Sixth, the addition of a beam profiler provides better information about attained green strength in the present invention. Without a beam profiler, FIG. 15 shows the level of information available on strength. Region 318, region 316 and region 314 are very hard plastic and stretch some unknown width across a portion of region 84. This green strength value can be used as strictly a relative measurement based on the various exposures received by each element of volume. In this case mean green strength over a particular volume would be considered as the exposure at each volume element summed over all the volume elements then divided by the total volume. This is very similar to a relative amount of polymerization that could also be based on the same calculation. However, it is much more effective to have an absolute or relative green strength associated with a particular extent of polymerization in a volume element since the change in green strength isn't necessarily linear from the gel point to the point of complete solidification. This association between green strength and extent of polymerization can again be included in the above-mentioned table or possibly be based on an appropriate equation. From this method the green strength can be determined for each unit volume, it can be summed to give an overall strength parameter for the partially solidified material, it can be averaged over the particular volume of interest, for example. Since green strength is a function of extent of polymerization this method (by comparing it to extent of polymerization) can be utilized to determine the net green strength from solidification which occurs by more than one wavelength. The steps involved here follow exactly those above for determining net polymerization per unit volume followed by the association with each unit volume a particular green strength (relative or absolute). It should be noted that the chemical composition of the atmosphere above the resin (assuming equilibrium between the gases absorbed in the resin and those in the atmosphere) can have a significant effect on cure parameters. For example, oxygen acts as an inhibitor of polymerization reactions. It destroys free radicals, before the free radical can induce polymerization. It can also act to prematurely end a polymerization reaction thereby causing a reduction in average molecular weight of the polymer chains being formed. This can have a significant effect on the properties of the polymer created, partially because of the effect on molecular weight. As another example, if two identical resins and wavelengths are used but one is in equilibrium with a nitrogen atmosphere and the other is in equilibrium with an atmosphere of air, the resin in equilibrium with the nitrogen atmosphere will have a lower critical energy. It will form gel at a much lower level of exposure than the other material; however, the gel will have much less green strength and therefore may be less useful. If these separate objects are brought to complete polymerization in equilibrium with their corresponding atmospheres, the final properties of the plastics may be different because of the different bond structure created. Therefore, it is important to consider the atmosphere in which the resin will be used to create parts when determining the resin parameters. Different atmospheres might be a useful way of changing resin parameters to obtain different cure parameters associated with both green and post cured parts.

Seventh, the edition of the beam profiler provides the ability to predict at least a relative value for the resistance to bending that a given volume of solidified material possesses. This given volume is generally a single line of cured material, but it can be a cantilever region of a particular layer or it can even be a combination of solidified material from several layers. This resistance to bending is related to the strength of each volume element but it must also be weighted by the distance an individual element is from the axes of bending.

Figure 26:
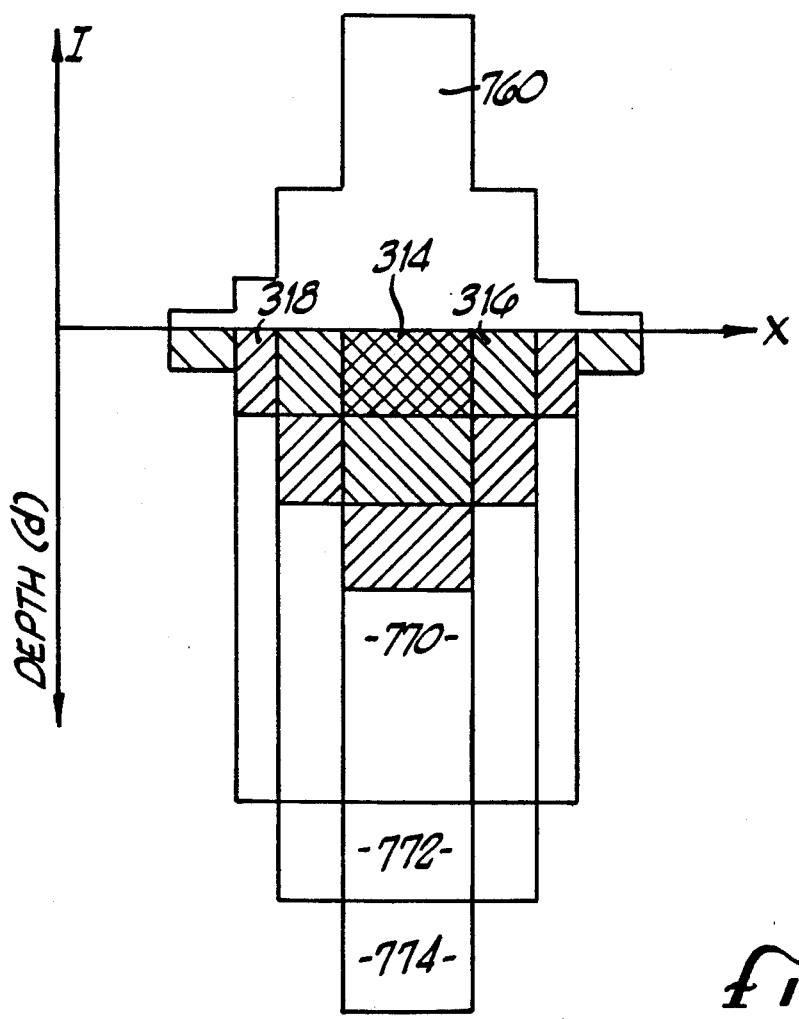
FIG. 26 shows depth of cure with a beam profile.

For example, FIG. 26 shows beam profile 760. Beam profile 760 contains equal power and intensity from two wavelengths $\lambda_1$ and $\lambda_2$. The working curves for these wavelengths are depicted in FIG. 14.

In the same time region 314 is created with $\lambda_2$, the longer depth of penetration for $\lambda_1$ causes region 770 to be formed. In a longer time period region 316 is created by the short depth of penetration of $\lambda_2$, the longer depth of penetration of $\lambda_1$ causes region 772 to be created with $\lambda_2$. In the same time region 318 is created, the longer depth of penetration of $\lambda_1$ causes region 774 to be created.

When using various aspects of the present invention without a beam profiler, a great deal of knowledge, predictive power, and control ability are lost. It becomes difficult or impossible to determine the width and depth of some cured features, such as of extra hard region 318, even harder region 316, and hardest region 314. Beam profile 760 reveals that extra hard region 318 is not as wide as region 772.

Eighth, the beam profiler can be used to predict the necessary overcure required to get adequate adhesion between layers. Adequate adhesion between layers requires a certain amount of cross polymerization between the material solidified in association with the bottom of one layer and that solidified with the top of the previous layer. The more fully the top of the previous layer is polymerized, the larger the overcure must be to insure adhesion between this previous layer and the present layer. For a given resin and building conditions (e.g. temperature and chemical composition of atmosphere) it is possible to construct a table that relates extent of polymerization of one volume (cured first) with the extent of polymerization necessary of another volume in order to achieve adhesion between the volumes. Alternatively, it is possible to create a table of the maximum exposure differential between two surfaces (where one is cured first) that still allows good ashesion between the volumes. Since the beam profiler can determine and predict extents of polymerization and extents of exposure of the top of the previous layer and bottom of the present layer the previously described tables can be used in combination with the beam profile information to determine and set necessary overcures. These tables need only be created once for a given resin and wavelength. Therefore, the need for an SLA user to worry about determining required overcure is obviated by including such a table when the resin is supplied to the user. This technique allows further automation of the building process by use of the beam profiler; therefore bringing stereolithography one step closer to becoming a pushbutton (turnkey) prototyping system or modeling system.

Ninth, the beam profiler can, as discussed earlier, be used with either single or multiple wavelengths for determining various cure parameters. When used with multiple wavelengths, it is preferable that the profile analyze the power/intensity associated with each wavelength singly. This singling out of wavelengths can be done by use of various filters that are made to intersect the beam either at the profiler itself or at any convenient location along the beam path. It is preferable to use filters such that only the wavelength that is desired to be scanned is present at the beam profile. However, this may not always be practical; therefore, another approach is to perform a variety of scans with and without various filters of known transmissions and from the data obtained and from the transmission properties of the filters to determine the powers and profiles associated with each wavelength. Once these intensity determinations are made, they can be related to a variety of resin characteristics. From this combination, many important cure parameters can be determined. Also as mentioned earlier, the beam profiler can also perform other important roles for the practice of stereolithography. These other roles include being used to automatically set and update desired building parameters without user intervention, the ability to automatically switch between various wavelengths when multiple wavelengths are to be used singly, the ability to control the ratios of energies associated with different wavelengths when wavelengths are used simultaneously or singly, and the ability to predict successful completion of part building, ability to warn an operator of potential problems, etc. The ability to switch between various wvelengths is done by the computer in response to build parameters which were specified by analysis of the beam profile information in combination with known information about the object being built. The wavelengths can be obtained singly by filtering a multiple wavelength beam, by switching various beams into the optical path where each beam originates from a single wavelength source, or by switching the radiation generator to produce the desired wavelength. The control of energy associated with each wavelength can be accomplished by filtering, or by combining two beams from individual sources and adjusting the output power of each source appropriately.

In summary, various approaches and advantages regarding the use of beam profile information (in combination with resin parameters) to predict and/or control cure parameters have been described, some of which are:

1) ability to determine beam profile for each wavelength;
2) ability to obviate need of banjo-top or similar parts (everything based on profile and known resin characteristics) except initial evaluation of resin parameters that will be based on a variety of physical, optical and chemical tests;
3) combination with appropriate control mechanisms to form a feedback loop to insure particular ratios of power associated with each wavelength;
4) ability to predict cure depth;
5) ability to predict cure width;
6) ability to predict average amount of polymerization;
7) ability to predict strength of solidified material;
8) ability to predict solidified material's ability to resist a bending momentum;
9) ability to predict required MSA;
10) ability to predict best skin fill vector spacing;
11) ability to predict the overcure necessary to achieve adhesion (of a specific amount) between two layers; and
12) ability to select beam width compensation parameters.

To make the above predictions, to the first order, two pieces of information are necessary: 1) a list of resin properties for each wavelength that is used to solidify it; and 2) beam profile information. Higher order predictions may also involve the use of additional resin properties along with more sophisticated theories of radiation/resin interaction. The needed resin properties for the above predictions are: 1) penetration depth for each wavelength; 2) minimum critical exposure for each wavelength; 3) efficiency for each wavelength; 4) percentage polymerization for various exposures for each wavelength; 5) percentage polymerization needed to gel; 6) allowable ranges of polymerization amounts necessary to insure adhesion (to a certain extent) with previously polymerized (to a certain extent) material; and 7) appropriate strength parameters for various degrees of polymerization. Temperature is generally a controlled parameter, but if it is to be varied, it must be taken into account. Various other parameters can be used in place of the ones above. These parameters can be determined for each lot of resin as it is produced or each lot of resin can be quality checked to insure that the values for each paramter are within a specified range. A parameter list can be supplied with the resin and then combined with the specific beam profile information on a given machine to make all the necessary predictions. These predictions can be used to further automate the building process. These predictions can also be used as indicated in 2 above to control various parameters necessary for building parts with specific properties. For example, several filter banks can be computer controlled to intersect the beam or not. Each filter is used to attenuate a specific wavelength(s) by an appropriate amount. These filters could then be used with the beam profiler to insure that the various wavelengths present have powers or peak powers in a desired ratio range (this is one of the multiple wavelength embodiments). These beam profile predictions can be used for both single and multiple wavelength applications. Several embodiments have been presented in this disclosure. Other embodiments will become apparent to those skilled in the art after reviewing this disclosure.

We claim:

1. An improved stereolithographic method for producing a three-dimensional object by forming layers of material curable in response to synergistic stimulation adjacent to previously formed layers of material and successively curing the layers of material by exposing the layers of material to a pattern of synergistic stimulation correspond to successive cross-section of the three-dimensional object, the improvement comprising the steps of:

curing at least a portion of a first layer of a three-dimensional object, said portion being cured using a first exposure of synergistic stimulation having a first penetration depth; and curing said portion of the first layer using at least a second exposure of synergistic stimulation having a second penetration depth wherein the first and second penetration depths are different.

2. The method of claim 1 wherein adhesion between the portion of the first layer and a previous layer occurs after the first exposure.

3. The method of claim 1 further comprising curing said portion of the first layer using a plurality of exposures of synergistic stimulation having a plurality of penetration depths.

4. The method of claim 1 wherein the first layer has a layer thickness and wherein said first exposure of synergistic stimulation causes a depth of cure less than the layer thickness.

5. The method of claim 1 wherein the first exposure of synergistic stimulation causes a depth of cure less than that necessary to cause adhesion between the first layer and a previously cured layer.

6. The method of claim 1 wherein the synergistic stimulation comprises electromagnetic radiation.

7. The method of claim 6 wherein the first exposure of synergistic stimulation comprises a first narrow band of wavelengths and the second exposure of synergistic stimulation comprises a second narrow band of wavelengths and wherein the first and second narrow bands of wavelengths are different.

8. The method of claim 7 wherein the first exposure of synergistic stimulation causes a depth of cure less than that necessary to cause adhesion between the first layer and a previously cured layer.

9. The method of claim 8 wherein the material is a photopolymer.

10. The method of claim 1 wherein the portion of the first layer comprises a line of material to be cured by exposing a vector.

11. An improved stereolithography method for producing a three-dimensional object by forming layers of material curable in response to synergistic stimulation adjacent to previously formed layers of material and successively curing the layers of material by exposing the layers of material to a pattern of synergistic stimulation corresponding to successive cross-section of the three-dimensional object, the improvement comprising the steps of:

curing at least a portion of a first layer of the three-dimensional object, said portion being cured using a first exposure of synergistic stimulation having a first penetration depth; and curing said portion of the first layer using a second exposure of synergistic stimulation having a second penetration depth wherein the second penetration depth is greater than the first penetration depth.

12. The method of claim 11 wherein the material is a photopolymer.

13. The method of claim 11 wherein the portion of the first layer comprises a line of material to be cured by exposing a vector.

14. An improved stereolithographic method for producing a three-dimensional object by forming layers of material curable in response to synergistic stimulation adjacent to previously formed layers of material and successively curing the layers of material by exposing the layers of material to a pattern of synergistic stimulation corresponding to successive cross-sections of the three-dimensional object, the improvement comprising the steps of:

curing at least a portion of a first layer of a three-dimensional object, said portion being cured using at least a first exposure of synergistic stimulation having a first penetration depth wherein said first exposure causes a depth of cure of the portion to be less than a cure depth required to cause sufficient adhesion to cause curl distortion; and curing said portion of the first layer using at least one additional exposure of synergistic stimulation having at least one additional penetration depth wherein an additional exposure insures adhesion of said portion of said first layer to a previously cured layer and wherein an additional penetration depth is greater than the first penetration depth.

15. The method of claim 14 wherein the building material is a photopolymer.

16. The method of claim 14 wherein the portion of the first layer comprises a line of material to be cured by exposing a vector.

17. An improved stereolithographic method for producing a three-dimensional object by forming layers of material curable in response to synergistic stimulation adjacent to previously formed layers of material and successively curing the layers of material by exposing the layers of material to a pattern of synergistic stimulation corresponding to successive cross-sections of the three-dimensional object, the improvement comprising the steps of:

curing at least a portion of a first layer of a three-dimensional object, having a layer thickness, said portion being cured using a first exposure of synergistic stimulation having a first penetration depth which causes a depth of cure of the portion to be less than the layer thickness; and curing said portion of the first layer using at least one additional exposure of synergistic stimulation having at least one additional penetration depth wherein the additional exposure results in a cure depth greater than the layer thickness and wherein an additional penetration depth is greater than the first penetration depth.

18. The method of claim 17 wherein the building material is a photopolymer.

19. The method of claim 17 wherein the portion of the first layer comprises a line of material to be cured by exposing a vector.

20. An improved stereolithographic method for producing a three-dimensional object by forming layers of material curable in response to synergistic stimulation adjacent to previously formed layers of material and successively curing the layers of material by exposing the layers of material to a pattern of synergistic stimulation corresponding to successive cross-sections of the three-dimensional object, the improvement comprising the steps of:

curing at least a portion of a first layer of a three-dimensional object, said portion being cured using a first exposure of synergistic stimulation having a first penetration depth wherein said exposure causes the depth of cure of the portion to be less than that required to cause adhesion between the portion of the first layer and a previously cured layer; and curing said portion of the first layer using an additional exposure of synergistic stimulation having a second penetration depth wherein the additional exposure insures adhesion of said portion of said first layer to the previously cured layer and wherein the second penetration depth is greater than the first penetration depth.

21. The method of claim 20 wherein the material is a photopolymer.

22. The method of claim 20 wherein the portion of the first layer comprises a line of material to be cured by exposing a vector.

23. An improved stereolithography apparatus for producing a three-dimensional object by forming layers of material curable in response to synergistic stimulation adjacent to previously formed layers of material and successively curing the layers of material by exposing the layers of material to a pattern of synergistic stimulation corresponding to successive cross-sections of the three-dimensional object, the improvement comprising:

means for curing at least a portion of a first layer of a three-dimensional object, said portion being cured using a first exposure of synergistic stimulation having a first penetration depth; and means for curing said portion of the first layer using at least a second exposure of synergistic stimulation having a second penetration depth wherein the first and second penetration depths are different.

24. The apparatus of claim 23 wherein said means for curing using the first exposure supplies insufficient synergistic stimulation to cause adhesion between the portion of the first layer and a previous layer.

25. The apparatus of claim 23 further comprising means for curing said portion of the first layer using a plurality of exposures of synergistic stimulation having a plurality of penetration depths.

26. The apparatus of claim 23 wherein said means for curing using the first exposure supplies insufficient synergistic stimulation to cause a depth of cure of a layer thickness.

27. The apparatus of claim 23 wherein the means for curing using the first exposure supplies an amount of synergistic stimulation less than that necessary to cause a depth of cure sufficient to cause adhesion between the first layer and a previously cured layer.

28. The apparatus of claim 23 wherein said mans for curing using a first exposure and means for curing using at least a second exposure produce synergistic stimulation which is electromagnetic radiation.

29. The apparatus of claim 28 wherein the means for curing using a first exposure of electromagnetic radiation comprises means for producing a first narrow band of wavelengths and wherein said means for curing using at least a second exposure of electromagnetic radiation comprises means for producing a second narrow band of wavelengths and wherein the first and second narrow bands of wavelengths are different.

30. The apparatus of claim 29 wherein the means for curing using the first exposure supplies an amount of electromagnetic radiation insufficient to cause adhesion between the first layer and a previously cured layer.

31. The apparatus of claim 30 additionally comprising a container for holding the material, which material is a photopolymer.

32. The apparatus of claim 23 wherein the means for curing using the first exposure utilizes a vector data pattern for directing the synergistic stimulation onto the material.

33. An improved stereolithographic apparatus for producing a three-dimensional object by forming layers of material curable in response to synergistic stimulation adjacent to previously formed layers of material and successively curing the layers of material by exposing the layers of material to a pattern of synergistic stimulation corresponding to successive cross-sections of the three-dimensional object, the improvement comprising:

means for curing at least a portion of a first layer of the three-dimensional object, said portion being cured using a first exposure of synergistic stimulation having a first penetration depth; and means for curing said portion of the first layer using a second exposure of synergistic stimulation having a second penetration depth wherein the second penetration depth is greater than the first penetration depth.

34. The apparatus of claim 33 additionally comprising a container for holding the material, which material is a photopolymer.

35. The apparatus of claim 33 wherein the means for curing using the first exposure utilizes a vector data pattern for directing the synergistic stimulation onto the material.

36. An improved stereolithographic apparatus for producing a three-dimensional object by forming layers of material curable in response to synergistic stimulation adjacent to previously formed layers of material and successively curing the layers of material by exposing the layers of material to a pattern of synergistic stimulation corresponding to successive cross-sections of the three-dimensional object, the improvement comprising:

means for curing at least a portion of a first layer of a three-dimensional object, said portion being cured using at least a first exposure of synergistic stimulation having a first penetration depth wherein said first exposure causes a depth of cure of the portion to be less than a cure depth required to cause sufficient adhesion to cause curl distortion; and means for curing said portion of the first layer using at least one additional exposure of synergistic stimulation having at least one additional penetration depth wherein an additional exposure insures adhesion of said portion of said first layer to a previously cured layer and wherein an additional penetration depth is greater than the first penetration depth.

37. The apparatus of claim 36 additionally comprising a container for holding the material, which building material is a photopolymer.

38. The apparatus of claim 36 wherein the means for curing using the first exposure utilizes a vector data pattern for directing the synergistic stimulation onto the material.

39. An improved stereolithographic apparatus for producing a three-dimensional object by forming layers of material curable in response to synergistic stimulation adjacent to previously formed layers of material and successively curing the layers of material by exposing the layers of material to a pattern of synergistic stimulation corresponding to successive cross-sections of the three-dimensional object, the improvement comprising:

means for curing at least a portion of a first layer of a three-dimensional object, having a layer thickness, said portion being cured using a first exposure of synergistic stimulation having a first penetration depth which causes a depth of cure of the portion to be less than the layer thickness; and means for curing said portion of the first layer using at least one additional exposure of synergistic stimulation having at least one additional penetration depth wherein an additional exposure results in a cure depth greater than the layer thickness and wherein an additional penetration depth is greater than the first penetration depth.

40. The apparatus of claim 39 additionally comprising a container for holding the material, which building material is a photopolymer.

41. The apparatus of claim 37 wherein the means for curing using the first exposure utilizes a vector data pattern for directing the synergistic stimulation onto the material.

42. An improved stereolithographic apparatus for producing a three-dimensional object by forming layers of material curable in response to synergistic stimulation adjacent to previously formed layers of material and successively curing the layers of material by exposing the layers of material to a pattern of synergistic stimulation corresponding to successive cross-sections of the three-dimensional object, the improvement comprising:

means for curing at least a portion of a first layer of a three-dimensional object, said portion being curing using a first exposure of synergistic stimulation having a first penetration depth wherein said exposure causes the depth of cure of the portion to be less than that required to cause adhesion between the portion of the first layer and a previously cured layer; and means for curing said portion of the first layer using an additional exposure of synergistic stimulation having a second penetration depth wherein the additional exposure insures adhesion of said portion of said first layer to the previously cured layer and wherein the second penetration depth is greater than the first penetration depth.

43. The apparatus of claim 42 additionally comprising a container for holding the material, which material is a photopolymer.

44. The apparatus of claim 42 wherein the means for curing using the first exposure utilizes a vector data pattern for directing the synergistic stimulation onto the material.

* * * * *

UNITED STATES PATENT AND TRADEMARK OFFICE
CERTIFICATE OF CORRECTION

PATENT NO. : 5,182,056

DATED : January 26, 1993

INVENTOR(S) : Stuart T. Spence et al.

It is certified that error appears in the above-identified patent and that said Letters Patent is hereby corrected as shown below:

Column 5, line 19, "U.S. patent" should read --U.S. patents and patent --.

Column 17, line 12, "wavelength in" should read --wavelength $\lambda$ in --.

Column 24, line 12, "EF " should read -- $EF_1$ --.

Column 38, line 47, "Stripe" should read -- Strip --.

Column 38, line 48, "stripe" should read -- strip --.

Column 38, line 49, "stripes 206 and 204. The stripes' " should read -- strips 206 and 204. The strips' --.

Column 38, line 55, "stripes" should read -- strips --.

Column 38, line 60, "stripe" should read -- strip --.

Column 38, line 67, "stripe" should read -- strip --.

Column 39, line 16, "stripe" should read -- strip --.

Column 39, line 18, "stripes" should read -- strips --.

Column 39, line 43, "Stripe" should read -- Strip --.

Column 39, line 44, "stripe" should read -- strip --.

UNITED STATES PATENT AND TRADEMARK OFFICE
CERTIFICATE OF CORRECTION

PATENT NO. : 5,182,056
DATED : January 26, 1993
INVENTOR(S) : Stuart T. Spence et al.

It is certified that error appears in the above-identified patent and that said Letters Patent is hereby corrected as shown below:

Column 39, line 45, "stripes" should read -- strips --.

Column 39, line 46, "stripes' " should read -- strips' --.

Column 39, line 53, "stripes" should read -- strips --.

Column 39, line 66, "stripes" should read -- strips --.

Column 39, line 67, "stripes" should read -- strips --.

Column 40, line 47, "stripes" should read -- strips --.

Column 45, line 59, "331,644." should read -- 07/331,644. --.

Column 45, line 63, " '664" should read -- '644 --.

Column 53, line 3, "to cause a depth of cure of a" should read --causes a depth of cure less than the--.

Signed and Sealed this

Fourth Day of January, 2000

Attest:

*Attesting Officer*     *Acting Commissioner of Patents and Trademarks*